US011791359B2

(12) United States Patent
Otake et al.

(10) Patent No.: US 11,791,359 B2
(45) Date of Patent: Oct. 17, 2023

(54) LIGHT DETECTING ELEMENT AND METHOD OF MANUFACTURING SAME

(71) Applicant: SONY SEMICONDUCTOR SOLUTIONS CORPORATION, Kanagawa (JP)

(72) Inventors: Yusuke Otake, Kanagawa (JP); Toshifumi Wakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/579,391

(22) Filed: Jan. 19, 2022

(65) Prior Publication Data

US 2022/0149090 A1 May 12, 2022

Related U.S. Application Data

(63) Continuation of application No. 16/463,760, filed as application No. PCT/JP2018/040660 on Nov. 1, 2018, now Pat. No. 11,264,420.

(30) Foreign Application Priority Data

Nov. 15, 2017 (JP) .................................. 2017-219685

(51) Int. Cl.
*H01L 27/146* (2006.01)
*H04N 25/75* (2023.01)
(Continued)

(52) U.S. Cl.
CPC .... *H01L 27/1463* (2013.01); *H01L 27/14623* (2013.01); *H01L 27/14627* (2013.01); (Continued)

(58) Field of Classification Search
CPC ........ G01J 2001/442; G01J 2001/4466; H01L 31/107
See application file for complete search history.

(56) References Cited

U.S. PATENT DOCUMENTS

| 11,264,420 B2 | 3/2022 | Otake et al. |
| 2001/0017786 A1 | 8/2001 | Woodward |

(Continued)

FOREIGN PATENT DOCUMENTS

| EP | 1840967 A1 | 10/2007 |
| EP | 3352219 A | 7/2018 |

(Continued)

OTHER PUBLICATIONS

International Search Report and Written Opinion for International (PCT) Patent Application No. PCT/JP2018/040660, dated Jan. 29, 2019, 7 pages.

(Continued)

*Primary Examiner* — Thanh Luu
(74) *Attorney, Agent, or Firm* — Sheridan Ross, PC

(57) ABSTRACT

The present technology relates to a light detecting element and a method of manufacturing the same that make it possible to reduce pixel size. The light detecting element includes a plurality of pixels arranged in the form of a matrix. Each of the pixels includes a first semiconductor layer of a first conductivity type formed in an outer peripheral portion in the vicinity of a pixel boundary, and a second semiconductor layer of a second conductivity type opposite from the first conductivity type formed on the inside of the first semiconductor layer as viewed in plan. A high field region formed by the first semiconductor layer and the second semiconductor layer when a reverse bias voltage is applied is configured to be formed in a depth direction of a substrate. The present technology is, for example, applicable to a photon counter or the like.

17 Claims, 48 Drawing Sheets

(51) Int. Cl.
*H04N 25/77* (2023.01)
*H04N 25/79* (2023.01)

(52) U.S. Cl.
CPC .. *H01L 27/14643* (2013.01); *H01L 27/14689* (2013.01); *H04N 25/75* (2023.01); *H04N 25/77* (2023.01); *H04N 25/79* (2023.01)

(56) References Cited

U.S. PATENT DOCUMENTS

| | | | |
|---|---|---|---|
| 2006/0065896 A1 | 3/2006 | Abe et al. | |
| 2009/0121306 A1 | 5/2009 | Ishikawa | |
| 2010/0148040 A1 | 6/2010 | Sanfilippo et al. | |
| 2010/0177223 A1 | 7/2010 | Rennie | |
| 2011/0241149 A1* | 10/2011 | Mazzillo | H01L 31/107 257/438 |
| 2011/0272561 A1 | 11/2011 | Sanfilippo et al. | |
| 2012/0242874 A1* | 9/2012 | Noudo | H01L 27/1464 348/294 |
| 2013/0193546 A1 | 8/2013 | Webster et al. | |
| 2015/0054111 A1 | 2/2015 | Niclass et al. | |
| 2015/0187826 A1* | 7/2015 | Suzuki | H01L 27/14627 438/70 |
| 2015/0325721 A1* | 11/2015 | Toda | H01L 27/14643 348/294 |
| 2018/0090536 A1 | 3/2018 | Mandai et al. | |
| 2018/0108800 A1* | 4/2018 | Morimoto | H01L 31/03529 |
| 2018/0182789 A1 | 6/2018 | Inoue et al. | |
| 2018/0308881 A1* | 10/2018 | Hynecek | H01L 31/02027 |

FOREIGN PATENT DOCUMENTS

| | | | | |
|---|---|---|---|---|
| JP | 2006179828 A | 7/2006 | | |
| JP | 2010157665 A | 7/2010 | | |
| JP | 2013-048278 | 3/2013 | | |
| JP | 2015041746 A | 3/2015 | | |
| WO | WO-2006068184 A1 | 6/2006 | | |
| WO | WO-2012032353 A2 | 3/2012 | | |
| WO | WO-2016002574 A1 * | 1/2016 | | G02B 19/0076 |
| WO | WO-2017047422 A1 | 3/2017 | | |

OTHER PUBLICATIONS

Extended European Search Report for European Patent Application No. 18878386.4, dated Mar. 10, 2020, 6 pages.

Official Action for U.S. Appl. No. 16/463,760, dated May 28, 2021, 7 pages.

Notice of Allowance for U.S. Appl. No. 16/463,760, dated Oct. 20, 2021, 5 pages.

* cited by examiner

LIGHT DETECTING ELEMENT AND METHOD OF MANUFACTURING SAME

CROSS REFERENCE TO RELATED APPLICATIONS

This application a continuation application of U.S. patent application Ser. No. 16/463,760 filed May 23, 2019, which is a national stage application under 35 U.S.C. 371 and claims the benefit of PCT Application No. PCT/JP2018/040660 having an international filing date of 1 Nov. 2018, which designated the United States, which PCT application claimed the benefit of Japanese Patent Application No. 2017-219685 filed 15 Nov. 2017, the entire disclosures of each of which are incorporated herein by reference.

TECHNICAL FIELD

The present technology relates to a light detecting element and a method of manufacturing the same, and particularly to a light detecting element and a method of manufacturing the same that make it possible to reduce pixel size.

BACKGROUND ART

An avalanche photodiode (hereinafter referred to as an APO), which is a high-speed and high-sensitivity photodiode utilizing an electron avalanche that occurs when a reverse bias voltage is applied to a PN junction, generally has a high field region formed in a planar direction, and has a guard ring provided in a horizontal direction of the high field region (see, for example, PTLs 1 and 2).

CITATION LIST

Patent Literatures

[PTL 1) Japanese Patent Laid-Open No. 2015-41746
[PTL 2) Japanese Patent Laid-Open No. 2013-48278

SUMMARY

Technical Problem

However, there is a limit to reduction in pixel size in the structure in which the high field region is formed in the planar direction.

The present technology has been made in view of such circumstances, and makes it possible to reduce pixel size.

Solution to Problem

A light detecting element according to a first aspect of the present technology includes a plurality of pixels arranged in a form of a matrix. The pixels each include a first semiconductor layer of a first conductivity type, the first semiconductor layer being formed in an outer peripheral portion in a vicinity of a pixel boundary, and a second semiconductor layer of a second conductivity type opposite from the first conductivity type, the second semiconductor layer being formed on an inside of the first semiconductor layer as viewed in plan. A high field region formed by the first semiconductor layer and the second semiconductor layer when a reverse bias voltage is applied is configured to be formed in a depth direction of a substrate.

In the first aspect of the present technology, a plurality of pixels arranged in the form of a matrix are provided. The pixels are each provided with a first semiconductor layer of a first conductivity type, the first semiconductor layer being formed in an outer peripheral portion in the vicinity of a pixel boundary, and a second semiconductor layer of a second conductivity type opposite from the first conductivity type, the second semiconductor layer being formed on the inside of the first semiconductor layer as viewed in plan. A high field region formed by the first semiconductor layer and the second semiconductor layer when a reverse bias voltage is applied is configured to be formed in a depth direction of a substrate.

A method of manufacturing a light detecting element according to a second aspect of the present technology includes forming a first semiconductor layer of a first conductivity type in an outer peripheral portion in a vicinity of a boundary of pixels arranged in a form of a matrix, and forming a second semiconductor layer of a second conductivity type opposite from the first conductivity type on an inside of the first semiconductor layer as viewed in plan. A high field region formed by the first semiconductor layer and the second semiconductor layer when a reverse bias voltage is applied is configured to be formed in a depth direction of a substrate.

In the second aspect of the present technology, a first semiconductor layer of a first conductivity type is formed in an outer peripheral portion in the vicinity of a boundary of pixels arranged in the form of a matrix, a second semiconductor layer of a second conductivity type opposite from the first conductivity type is formed on the inside of the first semiconductor layer as viewed in plan. A high field region formed by the first semiconductor layer and the second semiconductor layer when a reverse bias voltage is applied is configured to be formed in a depth direction of a substrate.

The light detecting element may be an independent device, or may be a module incorporated in another device.

Advantageous Effect of Invention

According to the first and second aspects of the present technology, pixel size can be reduced.

It is to be noted that the effects described here are not necessarily limited, but may be any of effects described in the present disclosure.

DESCRIPTION OF EMBODIMENTS

Description will hereinafter be made of modes for carrying out the present technology (which modes will hereinafter be referred to as embodiments). Incidentally, the description will be made in the following order.
1. First Embodiment (basic configuration example of alight detecting element)
2. Second Embodiment (configuration example having separating portions)
3. Third Embodiment (configuration example of a back surface irradiation type having separating portions)
4. Fourth Embodiment (configuration example internally having a low-concentration N type semiconductor layer)
5. Fifth Embodiment (configuration example having ST is in substrate surface)
6. Sixth Embodiment (configuration example having an anode and a cathode diagonally separated from each other)
7. Seventh Embodiment (configuration example having an STI and an anode and a cathode diagonally arranged)
8. Eighth Embodiment (configuration example having a low-concentration N type semiconductor layer adjacent in a vertical direction)
9. Ninth Embodiment (configuration example having a low-concentration P type semiconductor layer adjacent in a vertical direction)
10. Tenth Embodiment (configuration example in which an N type semiconductor layer has a potential gradient)
11. Eleventh Embodiment (configuration example having a high field region in a part in a depth direction)
12. Twelfth Embodiment (configuration example having an OCL for each pixel)
13. Thirteenth Embodiment (configuration example having a plurality of OCLs for one pixel)
14. Fourteenth Embodiment (configuration example having one OCL for a plurality of pixels)
15. Fifteenth Embodiment (configuration example in which signals of adjacent pixels are shared)
16. Sixteenth Embodiment (configuration example in which a signal is controlled by a gate)
17. First Manufacturing Method (manufacturing method for formation by ion implantation)
18. Second Manufacturing Method (manufacturing method for formation by ion implantation and solid phase diffusion)
19. Third Manufacturing Method (manufacturing method for formation by a high-concentration substrate and solid phase diffusion)
20. Fourth Manufacturing Method (manufacturing method for formation by two times of solid phase diffusion)
21. Fifth Manufacturing Method (manufacturing method for formation by one time of solid phase diffusion)
22. Sixth Manufacturing Method (manufacturing method of forming trenches from front surface and performing ion implantation)
23. Seventh Manufacturing Method (manufacturing method of forming trenches from back surface and performing ion implantation)
24. Summary 1. First Embodiment FIG. 1 depicts an example of configuration of a first embodiment of a photodiode array as a light detecting element to which the present technology is applied.

Figure 1:
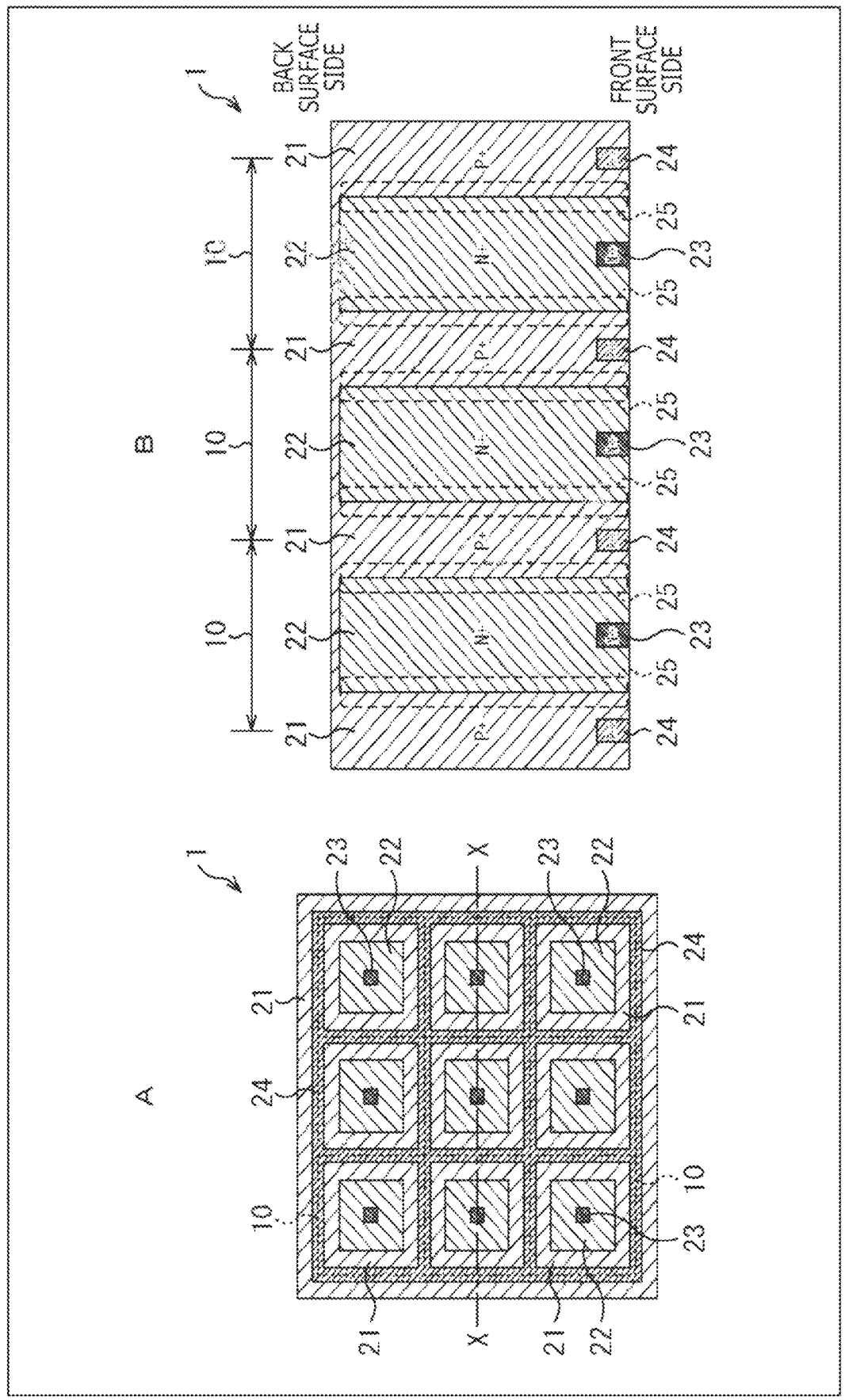
FIG. 1 is a diagram depicting an example of configuration of a first embodiment of a photodiode array as a light detecting element to which the present technology is applied.

A of FIG. 1 is a plan view of a semiconductor substrate (semiconductor layer) of a photodiode array 1. B of FIG. 1 is a sectional view of the semiconductor substrate of the photodiode array 1. A of FIG. 1 is a plan view of the lower surface of the semiconductor substrate in the sectional view of B of FIG. 1, the lower surface corresponding to the front surface side of the semiconductor substrate. B of FIG. 1 is a sectional view taken along a line X-X of A of FIG. 1.

The photodiode array 1 of FIG. 1 is formed by arranging pixels 10 in the form of a 3×3 matrix. An avalanche photodiode (hereinafter referred to as an APO) is formed in each of the pixels 10. Broken lines in A of FIG. 1 represent boundaries between the pixels 10.

Incidentally, while the photodiode array 1 of FIG. 1 is formed by nine 3×3 pixels, the numbers of pixels arranged in a row direction and a column direction and a total number of pixels are not limited to this, but are arbitrary.

Each of the pixels 10 of the photodiode array 1 has a first semiconductor layer 21 of a first conductivity type and a second semiconductor layer 22 of a second conductivity type.

More specifically, as depicted in B of FIG. 1, in each pixel 10, the first semiconductor layer 21 of the first conductivity type is formed in an outer peripheral portion that includes a pixel boundary and is in the vicinity of the boundary, and the second semiconductor layer 22 of the second conductivity type as a conductivity type opposite from the first conductivity type is formed on the inside of the first semiconductor layer 21 of the first conductivity type.

Both of a P type and an N type can be taken as the first conductivity type. For example, supposing that the first conductivity type is the P type, the second conductivity type is the N type. Supposing that the first conductivity type is the N type, the second conductivity type is the P type.

In the following, description will be made of a case where the first conductivity type is the P type, and the second conductivity type is the N type. In order to facilitate understanding, the description will be made with the conductivity types and impurity concentrations added as in a P+ type first semiconductor layer 21 as the first semiconductor layer 21 and an N+ type second semiconductor layer 22 as the second semiconductor layer 22. The same is true for other semiconductor layers to be described later.

Incidentally, in the case of the P type, impurity concentrations will be described as "P++," "P+," "P," and "P−," which indicate that the impurity concentration of "P++" is highest, and that the impurity concentrations of "P++," "P+," "P," and "P−" are decreased in this order.

Similarly, in the case of the N type, impurity concentrations will be described as "N++," "N+," "N," and "N−," which indicate that the impurity concentration of "N++" is highest, and that the impurity concentrations of "N++," "N+," "N," and "N−" are decreased in this order.

In a central portion of a pixel 10, the central portion being in the front surface of the semiconductor substrate which front surface corresponds to the lower surface in the sectional view of B of FIG. 1, a contact 23 serving as a cathode when a reverse bias voltage is applied (which contact will hereinafter be referred to as a cathode contact 23) is formed by a high-concentration N type diffusion layer (N++). Also, in a boundary portion of the pixel 10, the boundary portion being in the front surface of the substrate, a contact 24 serving as an anode when the reverse bias voltage is applied (which contact will hereinafter be referred to as an anode contact 24) is formed by a high-concentration P type diffusion layer (P++).

As depicted in A of FIG. 1, the anode contact 24 is formed in a lattice manner along the boundary portion of the pixel 10, and is not separated in pixel units, whereas the cathode contact 23 is formed in a pixel unit in the central portion of the pixel 10. An optical signal resulting from photoelectric conversion is output from the cathode contact 23.

As depicted in B of FIG. 1, high field regions 25 are formed in a depth direction of the semiconductor substrate, the high field regions 25 being regions in which avalanche multiplication occurs when a reverse bias voltage higher than a breakdown voltage is applied to the anode and cathode of each pixel 10 constituting the photodiode array 1. Because the N+ type second semiconductor layer 22 is formed so as to be vertically long within the P+ type first semiconductor layer 21 as viewed in section, the high field regions 25 are formed on long sides of a rectangle. Photons incident within the pixel are subjected to photoelectric conversion by the N+ type second semiconductor layer 22 and become positive holes (carriers). The positive holes move in a horizontal direction and are multiplied by the high field regions 25.

The high field regions 25 are formed so as to be vertically long in the depth direction of the semiconductor substrate. Therefore, even when the planar size of the pixel is reduced, sufficient high field regions can be secured in the depth direction of the substrate. Also, because the high field regions 25 are formed in the vertical direction, edge breakdown can be avoided even when no guard ring is formed in the horizontal direction. Consequently, according to the structure of the photodiode array 1 of FIG. 1, no guard ring is necessary, and the pixel size can be reduced while sufficient high field regions are secured.

Also, because the N+ type second semiconductor layer 22 is formed so as to be vertically long, a distance from the arrival of photons to multiplication thereof is that of movement in a direction parallel with the short sides of the rectangular N+ type second semiconductor layer 22, and thus becomes short. A jitter characteristic can therefore be improved.

Figure 2:
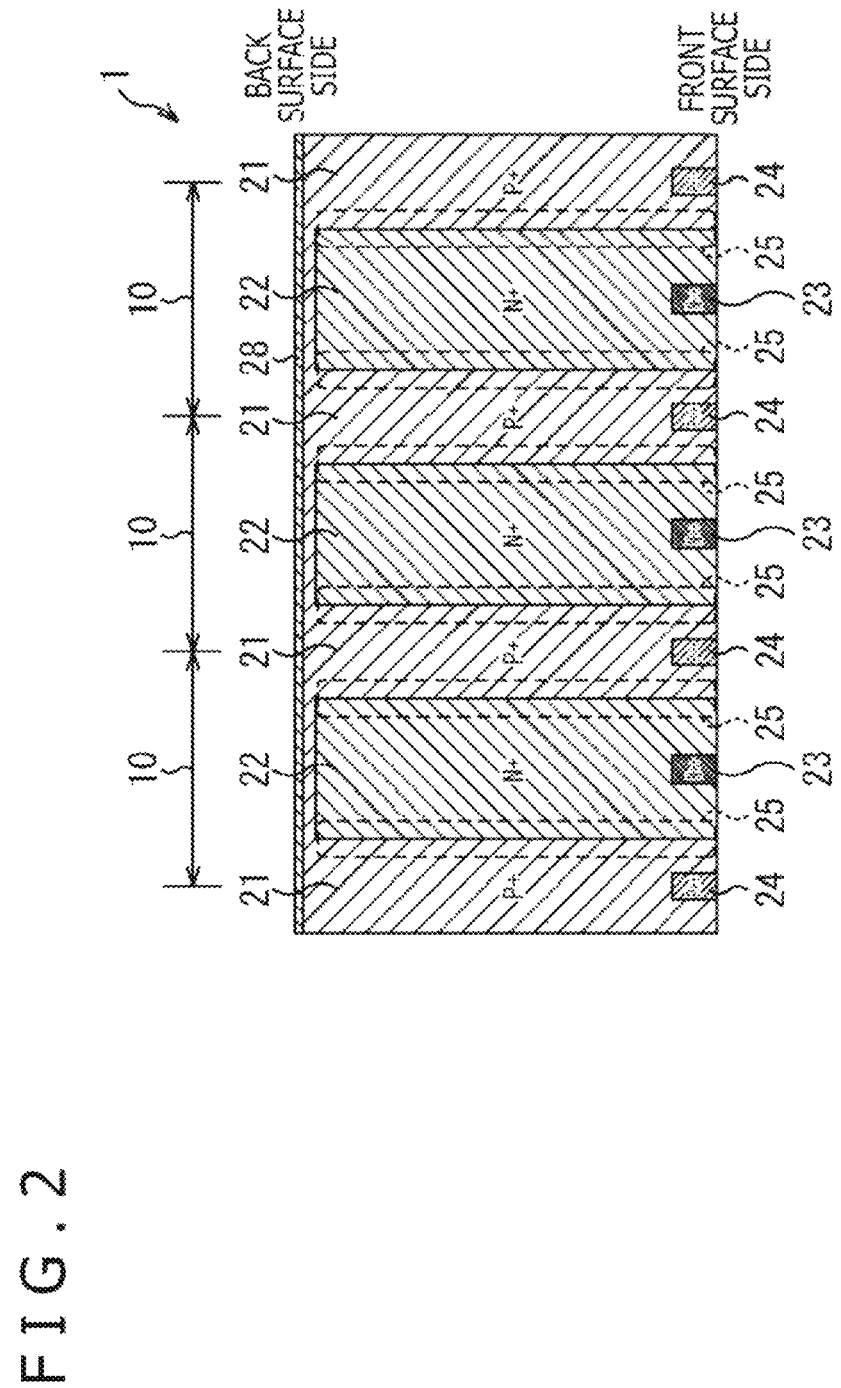
FIG. 2 is a sectional view in a case of a back surface irradiation type in the first embodiment.

Incidentally, a surface on which light is made incident in the photodiode array 1 of FIG. 1 can be either the front surface or the back surface of the semiconductor substrate. However, in the case of a back surface irradiation type in which the light incidence surface is on the back surface side of the semiconductor substrate, a fixed charge film 28 for suppressing the occurrence of dark current at a back surface interface is preferably formed at the back surface side interface, as depicted in FIG. 2. The fixed charge film 28 can be formed by, for example, a film of HfO2, Al2O3, or the like.

2. Second Embodiment

Figure 3:
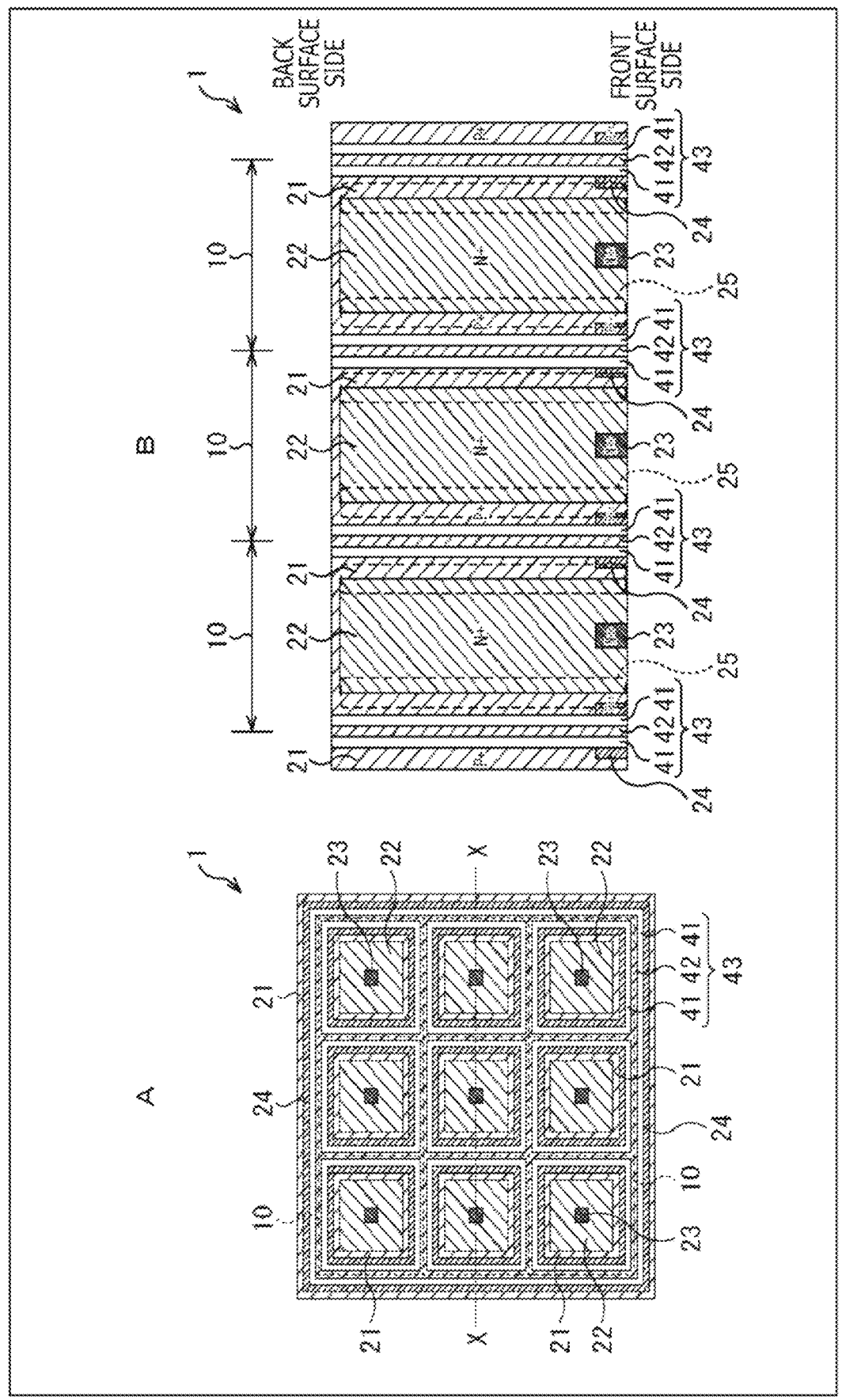
FIG. 3 is a diagram depicting an example of configuration of a second embodiment of the photodiode array as a light detecting element to which the present technology is applied.

FIG. 3 depicts an example of configuration of a second embodiment of the photodiode array as a light detecting element to which the present technology is applied.

A of FIG. 3 is a plan view of a semiconductor substrate of a photodiode array 1. B of FIG. 3 is a sectional view of the semiconductor substrate of the photodiode array 1. The front-back relation of the semiconductor substrate in the plan view and sectional view of FIG. 3 is assumed to be similar to that of the first embodiment.

In FIG. 3, parts corresponding to those of the first embodiment depicted in FIG. 1 are identified by the same reference numerals. Description of the parts will be omitted as appropriate. Parts where the second embodiment is different from the first embodiment will be described.

In the second embodiment, as compared with the first embodiment depicted in FIG. 1, as depicted in A and B of FIG. 3, a separating portion 43 constituted of an insulating film 41 such as a silicon oxide film (SiO2) or the like and a metallic film 42 such as tungsten (W), aluminum (Al), copper (Cu), or the like is newly formed at a boundary between pixels 10. The separating portion 43 insulates and isolates the adjacent pixels from each other. High field regions 25 are formed so as to be adjacent to the separating portion 43.

When the separating portion 43 is formed in the semiconductor substrate, there is a fear of dark current occurring at an interface between the insulating film 41 and the semiconductor substrate. However, the dark current caused by the interface can be suppressed by forming the separating portion 43 within the P+ type first semiconductor layer 21. Also, the occurrence of crosstalk can be suppressed by providing the separating portion 43 at the pixel boundary.

Consequently, by providing the separating portion 43 at the pixel boundary, it is possible to reduce crosstalk that becomes a problem in minute pixels and a dark count rate (hereinafter referred to as a OCR) caused by the dark current at the interface.

The separating portion 43 may be formed by only the insulating film 41 with the metallic film 42 omitted. However, a light shielding property can be improved by providing the metallic film 42 within the insulating film 41. Also, when a voltage at the same potential as an anode is applied to the metallic film 42, the dark current occurring at the interface with the P+ type first semiconductor layer 21 can be further suppressed.

Incidentally, also in the photodiode array 1 of FIG. 3, a surface on which light is made incident may be either the front surface or the back surface of the semiconductor substrate. In the case of the back surface irradiation type, as in FIG. 2, a fixed charge film 28 is preferably formed at the back surface side interface of the semiconductor substrate.

Figure 4:
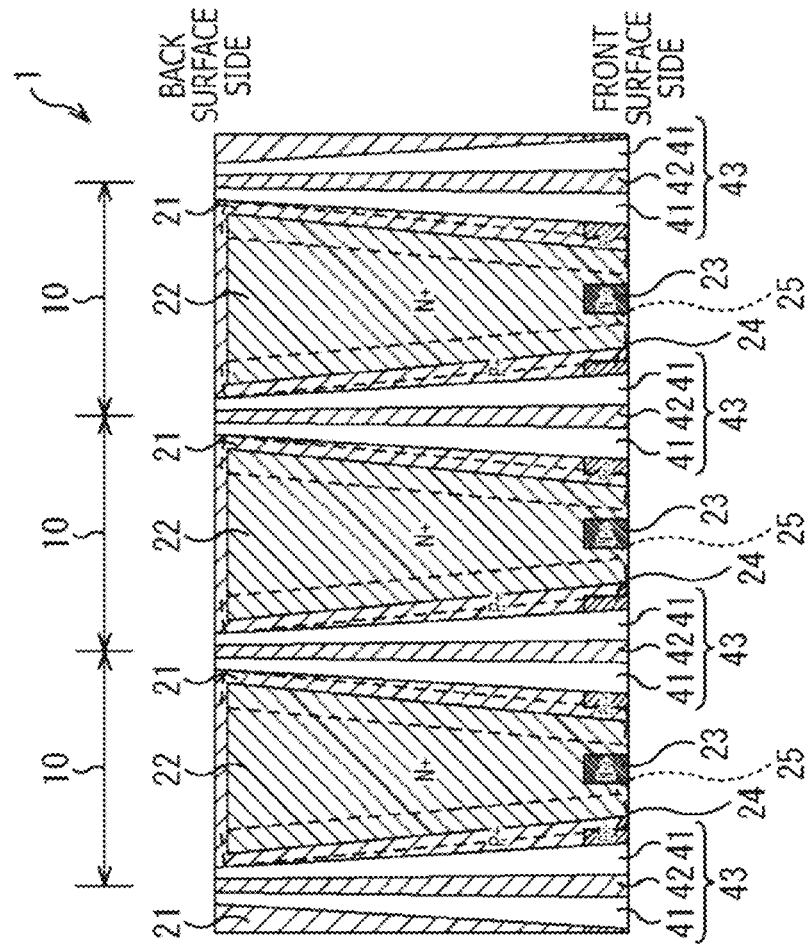
FIG. 4 is a sectional view in a case where the second embodiment has taper-shaped separating portions.

Also, the sectional shape of the separating portion 43 may be a tapered shape such that planar region areas of the back surface side and the front surface side are different from each other as in FIG. 4.

FIG. 4 illustrates an example of formation of the separating portion 43 in a case where a trench for burying the insulating film 41 and the metallic film 42 is formed from the front surface side. In this case, the sectional shape of the separating portion 43 is a downwardly widening tapered shape increased in planar region area toward the front surface side from the back surface side. Conversely, though not depicted, in a case where a trench for burying the insulating film 41 and the metallic film 42 is formed from the back surface side, the sectional shape of the separating portion 43 is a downwardly narrowing tapered shape decreased in planar region area toward the front surface side from the back surface side.

3. Third Embodiment

Figure 5:
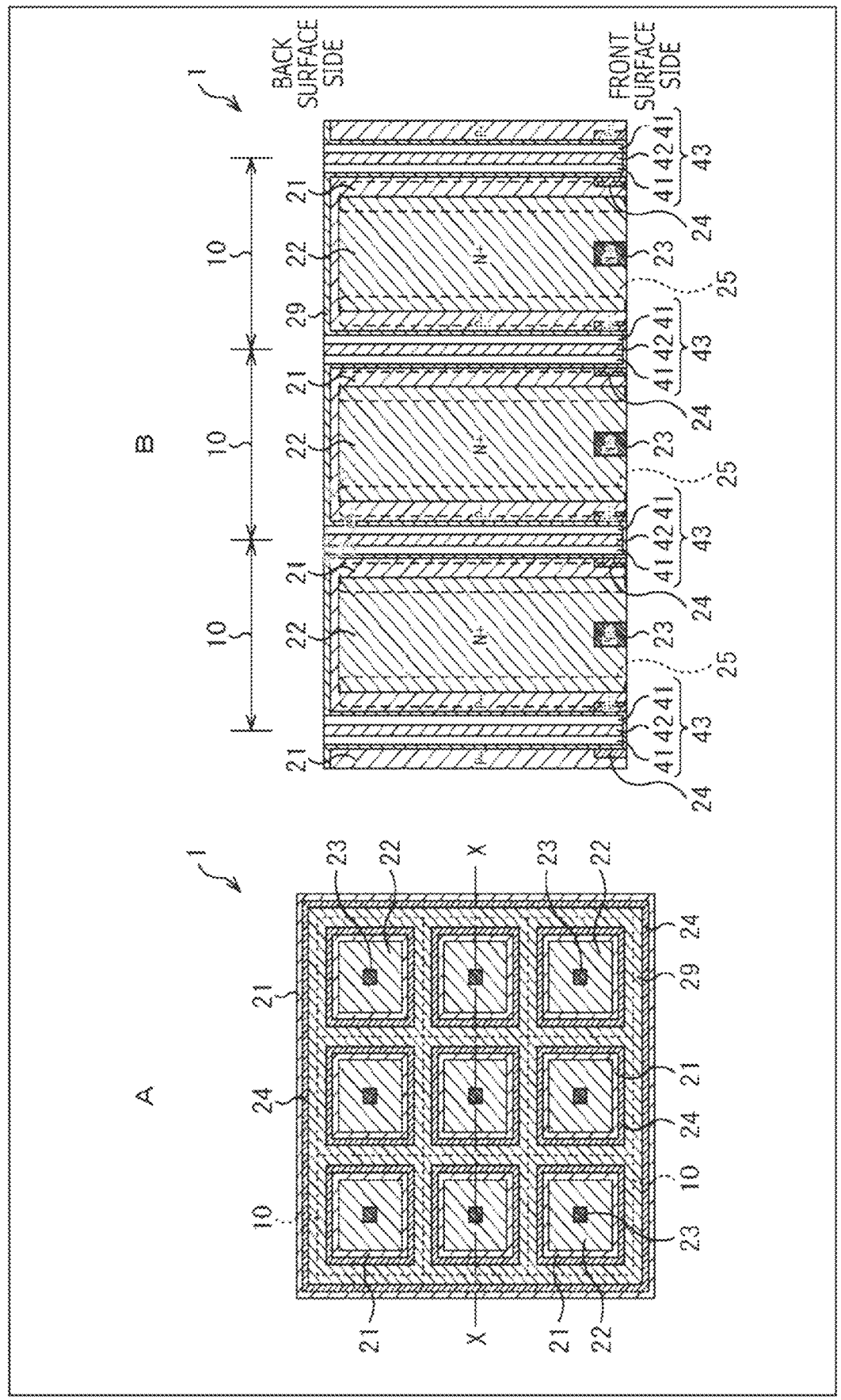
FIG. 5 is a diagram depicting an example of configuration of a third embodiment of the photodiode array as a light detecting element to which the present technology is applied.

FIG. 5 depicts an example of configuration of a third embodiment of the photodiode array as a light detecting element to which the present technology is applied.

A of FIG. 5 is a plan view of a semiconductor substrate of a photodiode array 1. B of FIG. 5 is a sectional view of the semiconductor substrate of the photodiode array 1. The front-back relation of the semiconductor substrate in the plan view and sectional view of FIG. 5 is assumed to be similar to that of the first embodiment.

In FIG. 5, parts corresponding to those of the second embodiment depicted in FIG. 3 are identified by the same reference numerals. Description of the parts will be omitted as appropriate. Parts where the third embodiment is different from the second embodiment will be described.

The photodiode array 1 depicted in FIG. 5 is a structure formed by specializing the photodiode array 1 according to the second embodiment depicted in FIG. 3 for the back surface irradiation type. The photodiode array 1 depicted in FIG. 5 is formed by adding anew a fixed charge film 29 to the configuration of FIG. 3.

The fixed charge film 29 is formed at the back surface side interface of the semiconductor substrate, and can suppress dark current occurring at the back surface side interface. In a part where there is a separating portion 43, the fixed charge film 29 is formed between the P+ type first semiconductor layer 21 and the insulating film 41, and suppresses dark current occurring at the interface between the separating portion 43 and the P+ type first semiconductor layer 21.

The sectional shape of the separating portion 43 may be a tapered shape as in the second embodiment. When the sectional shape of the separating portion 43 is a tapered shape, a trench for burying the insulating film 41 and the metallic film 42 is formed from the back surface side, and therefore a downwardly narrowing tapered shape is formed, as in FIG. 6.

4. Fourth Embodiment

Figure 7:
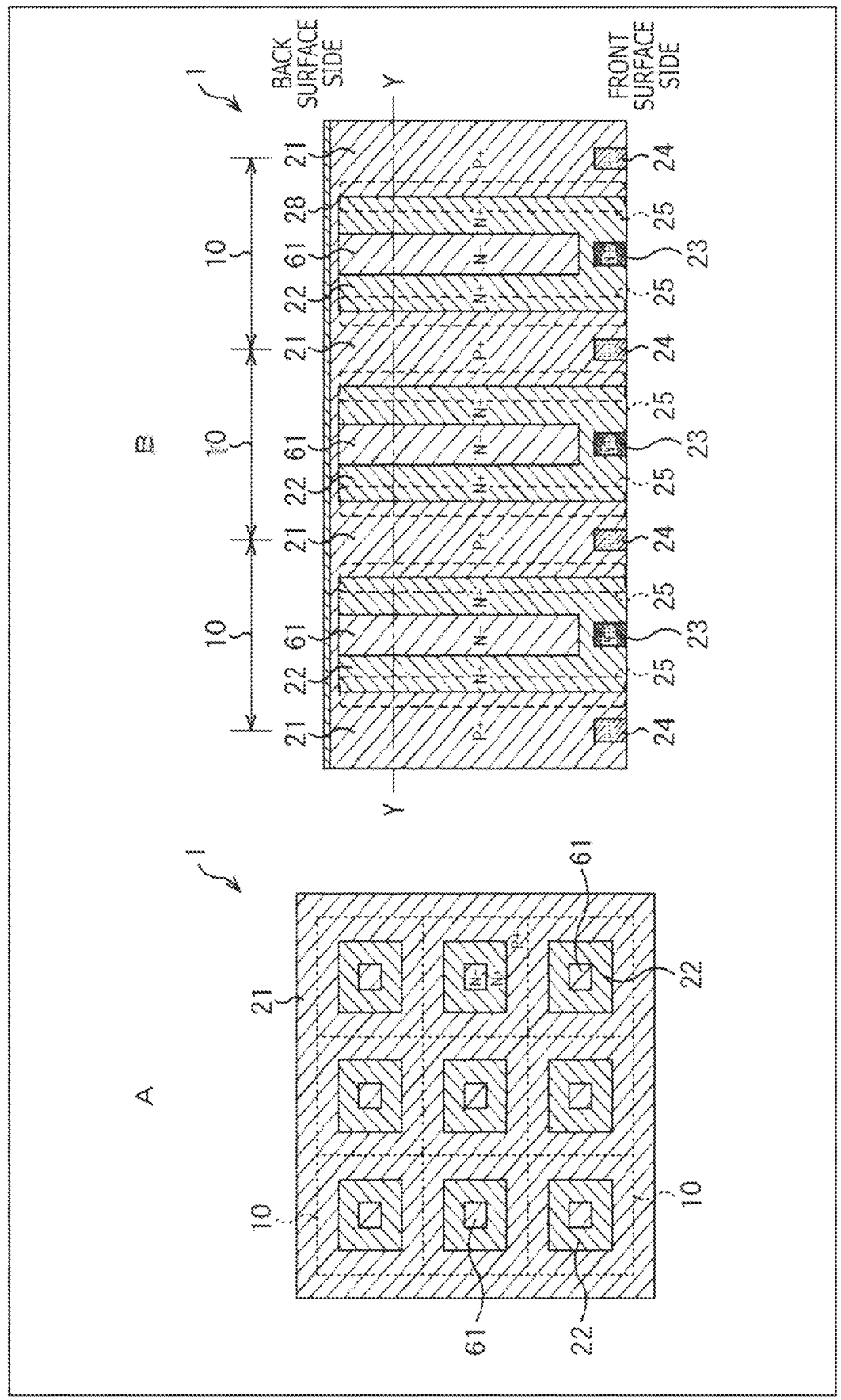
FIG. 7 is a diagram depicting an example of configuration of a fourth embodiment of the photodiode array as a light detecting element to which the present technology is applied.

FIG. 7 depicts an example of configuration of a fourth embodiment of the photodiode array as a light detecting element to which the present technology is applied.

A of FIG. 7 is a plan view of a semiconductor substrate of a photodiode array 1. B of FIG. 7 is a sectional view of the semiconductor substrate of the photodiode array 1. The plan view of A of FIG. 7 is a plan view taken along a line Y-Y of B of FIG. 7.

In the sectional view illustrated in B of FIG. 7, a fixed charge film 28 for suppressing dark current is formed at the back surface interface of the semiconductor substrate. FIG. 7 depicts an example of configuration of the back surface irradiation type.

In the configuration of the back surface irradiation type of the first embodiment depicted in FIG. 2, an N+ type second semiconductor layer 22 connected to a cathode contact 23 is formed by an N type impurity region that is uniform and is in high concentration within the region.

On the other hand, in the fourth embodiment depicted in FIG. 7, an N type (N−) third semiconductor layer 61 (hereinafter referred to as an N− type third semiconductor layer 61) of lower concentration than the N+ type second semiconductor layer 22 is formed on the inside of the N+ type second semiconductor layer 22 connected to the cathode contact 23. As depicted in A of FIG. 7, the N− type third semiconductor layer 61 is formed in a central portion of a pixel 10 on the inside of the high-concentration N+ type second semiconductor layer 22 as viewed in plan.

The other configuration of the fourth embodiment of FIG. 7 is similar to the configuration of the back surface irradiation type of the first embodiment depicted in FIG. 2, and therefore description thereof will be omitted.

When the low-concentration N− type third semiconductor layer 61 is disposed in the central portion of the pixel as viewed in plan, and the high-concentration N+ type second semiconductor layer 22 is disposed on the outside of the low-concentration N− type third semiconductor layer 61, or in other words in a direction in which a PN junction is disposed, as in the fourth embodiment, a charge generated by photoelectric conversion of incident light can be efficiently captured into the high-concentration N+ type second semiconductor layer 22 by a potential gradient (potential gradient) formed in a planar direction.

Incidentally, the structure in which the N type impurity region connected to the cathode contact 23 is thus formed by the high-concentration N+ type second semiconductor layer 22 and the N− type third semiconductor layer 61 on the inside of the high-concentration N+ type second semiconductor layer 22 can be applied also to the foregoing second and third embodiments.

Figure 8:
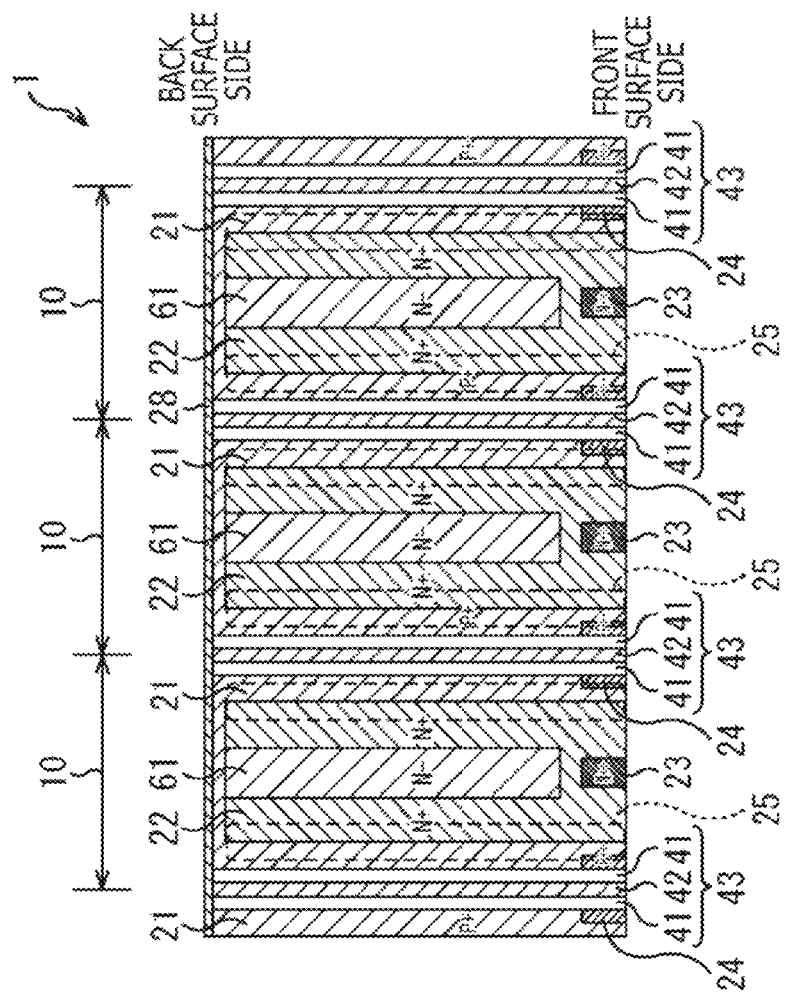
FIG. 8 is a sectional view depicting an example of a configuration in which the characteristic configuration of the fourth embodiment is added to the photodiode array of FIG. 3.

FIG. 8 is a sectional view depicting an example of a configuration in which the characteristic configuration of the fourth embodiment is added to the photodiode array 1 according to the second embodiment having the separating portions 43, the photodiode array 1 being depicted in FIG. 3.

In FIG. 8, N− type third semiconductor layers 61 are added to the insides of the N+ type second semiconductor layers 22 of the photodiode array 1 depicted in FIG. 3.

Figure 9:
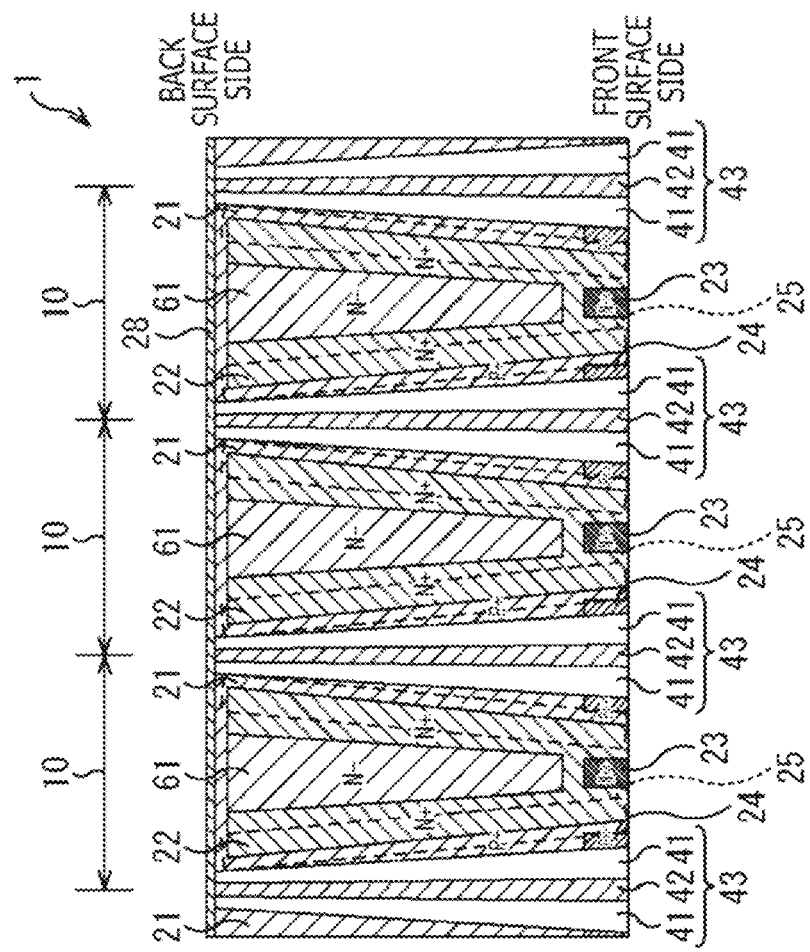
FIG. 9 is a sectional view depicting an example of a configuration in which the characteristic configuration of the fourth embodiment is added to the photodiode array of FIG. 4.

FIG. 9 is a sectional view depicting an example of a configuration in which the characteristic configuration of the fourth embodiment is added to the photodiode array 1 according to the second embodiment having the taper-shaped separating portions 43, the photodiode array 1 being depicted in FIG. 4.

In FIG. 9, N− type third semiconductor layers 61 are added to the insides of the N+ type second semiconductor layers 22 of the photodiode array 1 depicted in FIG. 3. Incidentally, FIG. 8 and FIG. 9 represent examples of the back surface irradiation type, and the fixed charge film 28 is also formed at a back surface side interface.

Figure 10:
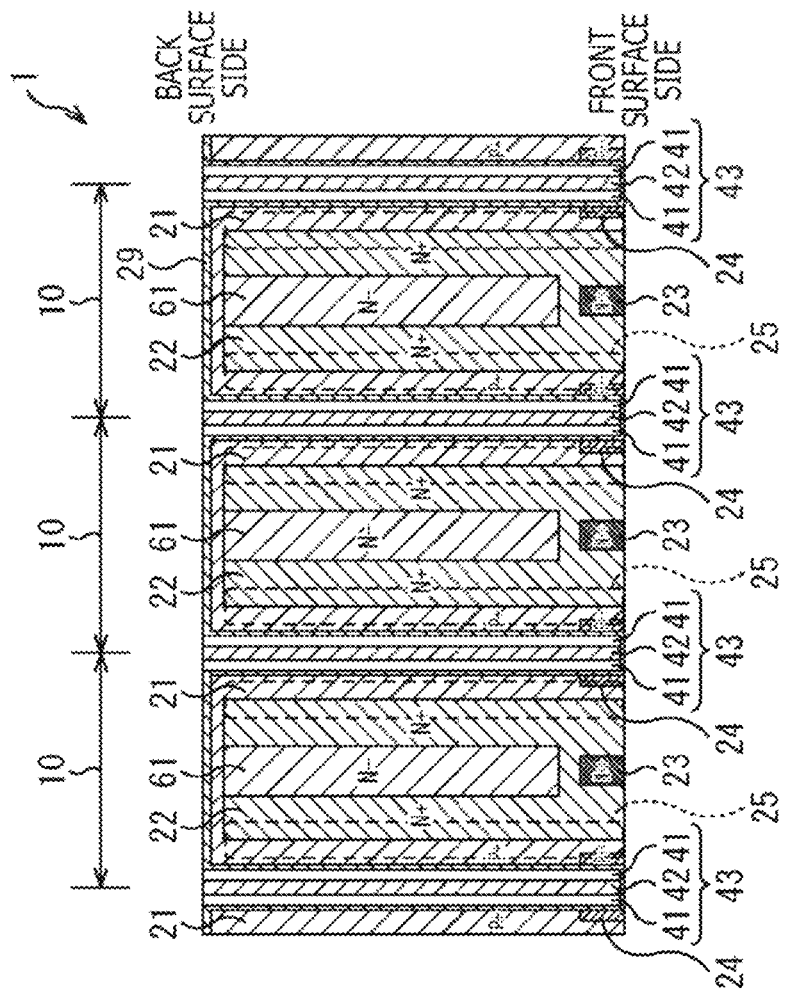
FIG. 10 is a sectional view depicting an example of a configuration in which the characteristic configuration of the fourth embodiment is added to the photodiode array of FIG. 5.

FIG. 10 is a sectional view depicting an example of a configuration in which the characteristic configuration of the fourth embodiment is added to the photodiode array 1 according to the third embodiment having the fixed charge film 29, the photodiode array 1 being depicted in FIG. 5.

In FIG. 10, N− type third semiconductor layers 61 are added to the insides of the N+ type second semiconductor layers 22 of the photodiode array 1 depicted in FIG. 5.

Figure 6:
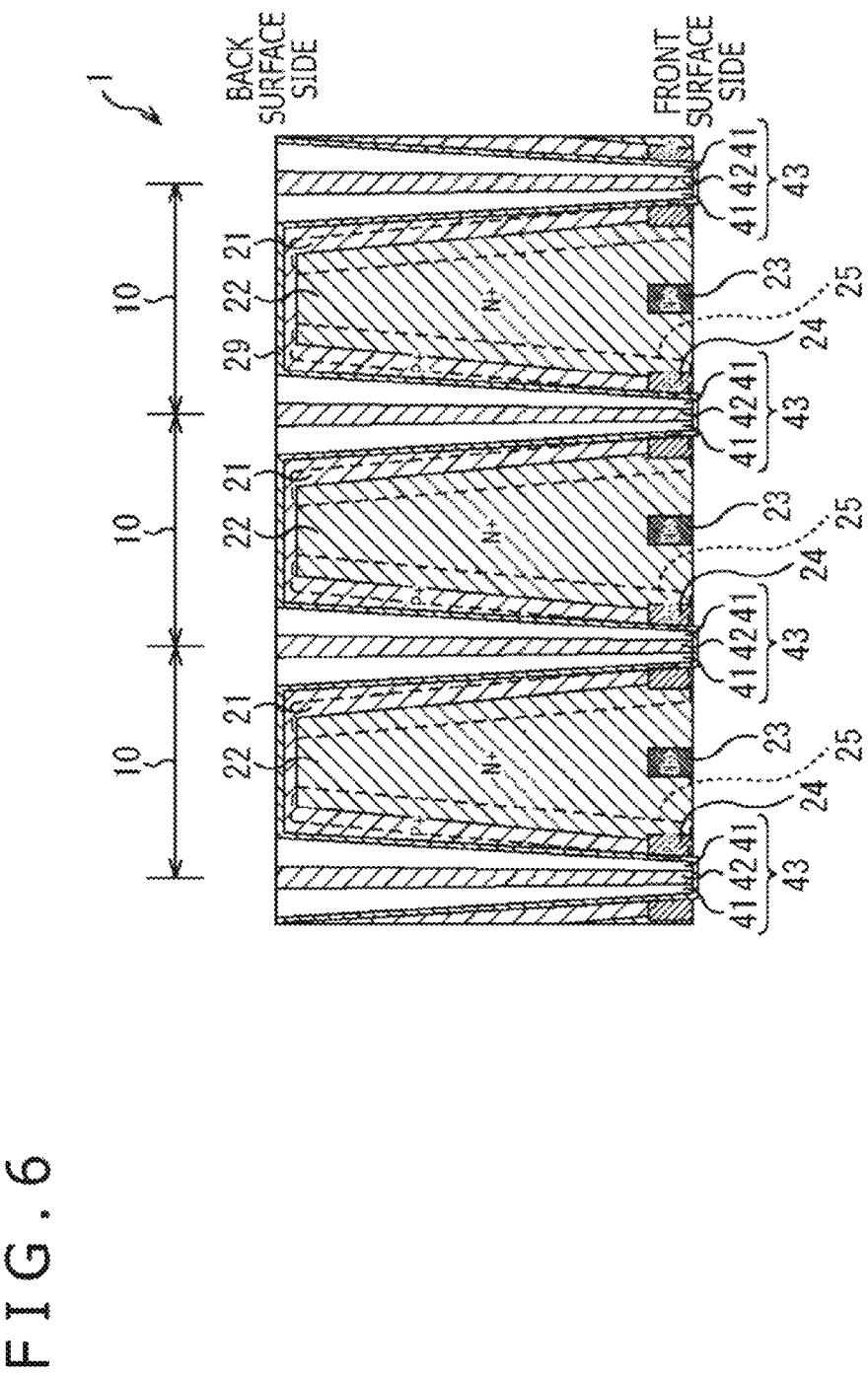
FIG. 6 is a sectional view in a case where the third embodiment has taper-shaped separating portions.
Figure 11:
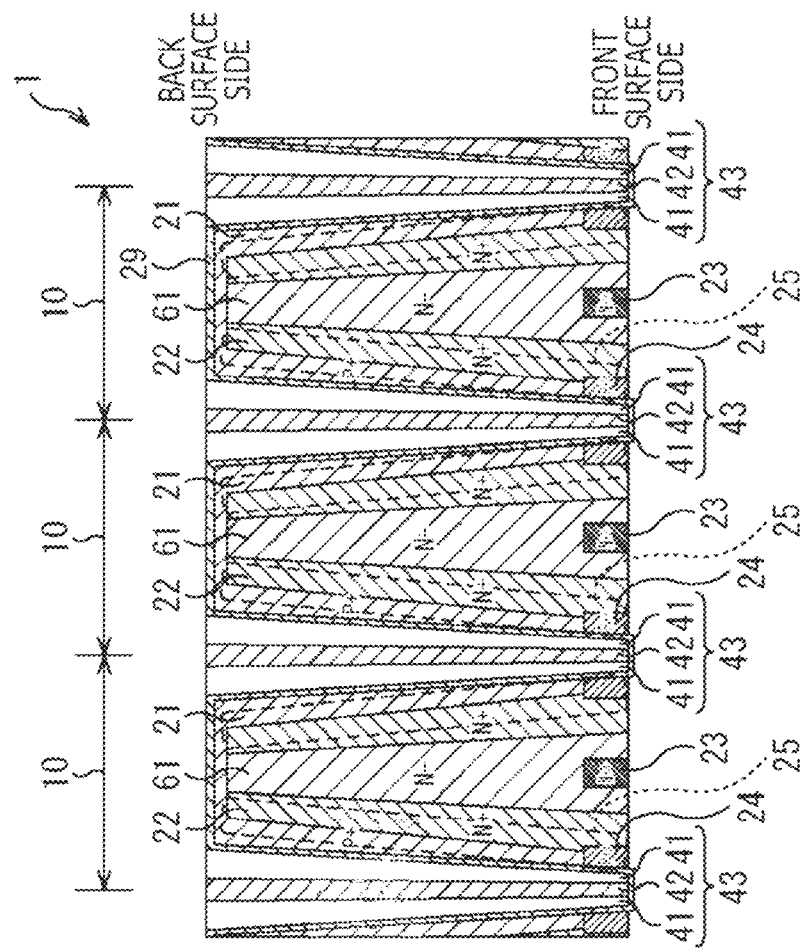
FIG. 11 is a sectional view depicting an example of a configuration in which the characteristic configuration of the fourth embodiment is added to the photodiode array of FIG. 6.

FIG. 11 is a sectional view depicting an example of a configuration in which the characteristic configuration of the fourth embodiment is added to the photodiode array 1 according to the third embodiment having the taper-shaped separating portions 43, the photodiode array 1 being depicted in FIG. 6.

FIG. 11, N− type third semiconductor layers 61 are added to the insides of the N+ type second semiconductor layers 22 of the photodiode array 1 depicted in FIG. 6.

In any of the configurations of FIGS. 8 to 11, a charge generated by the photoelectric conversion of incident light can be efficiently captured into the high-concentration N+ type second semiconductor layers 22 by a potential gradient formed in the planar direction.

Incidentally, while FIGS. 8 to 11 each represent an example of the back surface irradiation type, FIGS. 8 to 11 are of course applicable also to a front surface irradiation type.

5. Fifth Embodiment

Figure 12:
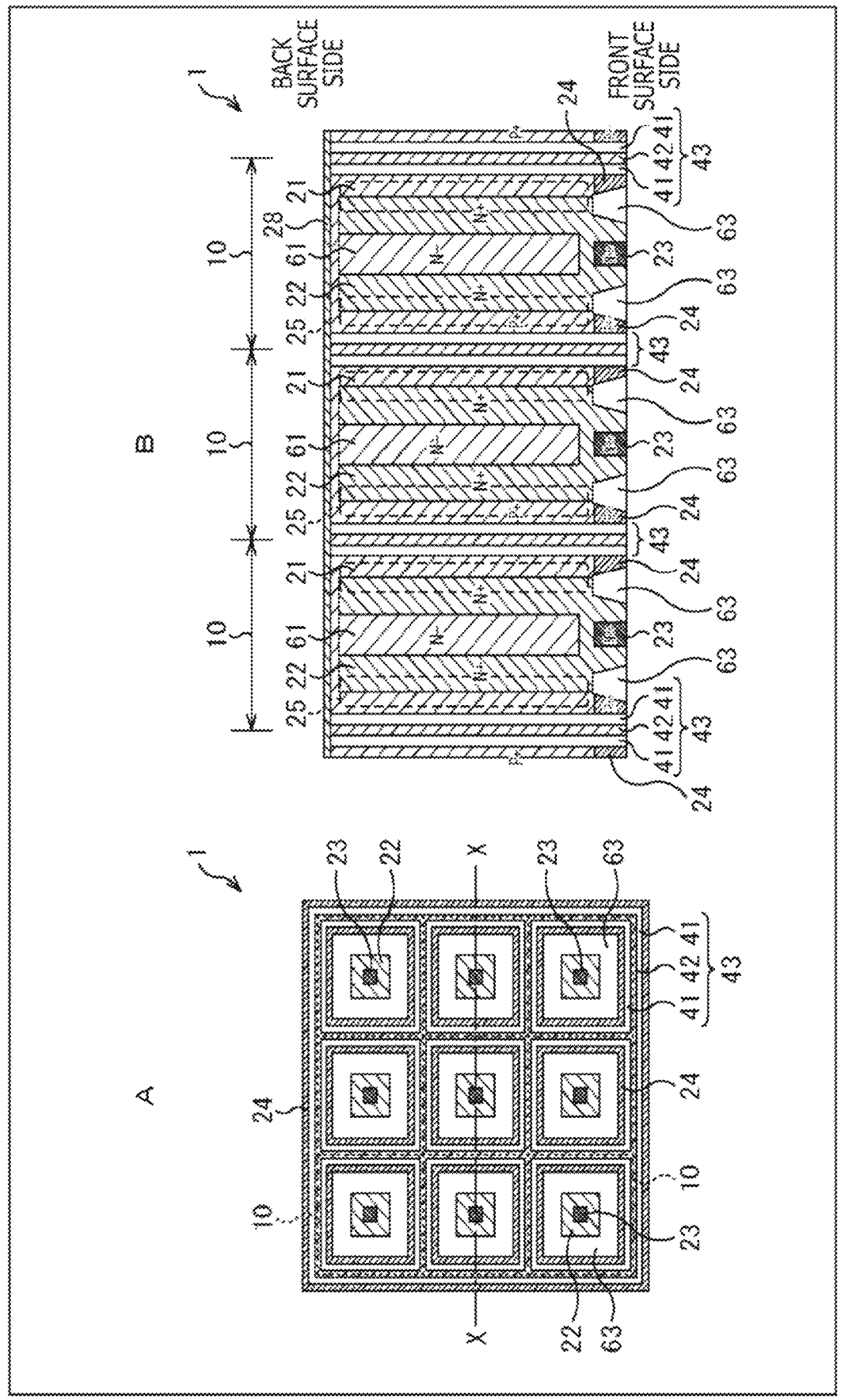
FIG. 12 is a diagram depicting an example of configuration of a fifth embodiment of the photodiode array as a light detecting element to which the present technology is applied.

FIG. 12 depicts an example of configuration of a fifth embodiment of the photodiode array as a light detecting element to which the present technology is applied.

A of FIG. 12 is a plan view of a semiconductor substrate of a photodiode array 1. B of FIG. 12 is a sectional view of the semiconductor substrate of the photodiode array 1. The front-back relation of the semiconductor substrate in the plan view and sectional view of FIG. 12 is assumed to be similar to that of the first embodiment.

In FIG. 12, parts corresponding to those of the foregoing first to fourth embodiments are identified by the same reference numerals. Description of the parts will be omitted as appropriate, and different parts will be described.

When the sectional view of B of FIG. 12 is compared with the sectional view of the fourth embodiment which sectional view is depicted in FIG. 8, an STI (Shallow Trench Isolation) 63 is newly added to the front surface side of the semiconductor substrate in the fifth embodiment. The STI 63 electrically separates an anode contact 24 connected to a P+ type first semiconductor layer 21 from a cathode contact 23 connected to an N+ type second semiconductor layer 22. Also, due to the STI 63, an interface between the P+ type first semiconductor layer 21 and the N+ type second semiconductor layer 22 forming a high field region 25 avoids contacting the front surface of the semiconductor substrate. It is thereby possible to suppress multiplication of dark current occurring in the front surface of the semiconductor substrate.

Incidentally, while the N+ type second semiconductor layer 22 is disposed between the cathode contact 23 and the STI 63 in the front surface of the substrate in the configuration example depicted in FIG. 12, a configuration may be adopted in which ST is 63 are formed in all of portions between cathode contacts 23 and anode contacts 24 in the front surface of the substrate so that the N+ type second semiconductor layers 22 are not exposed on the front surface of the substrate.

6. Sixth Embodiment

Figure 13:
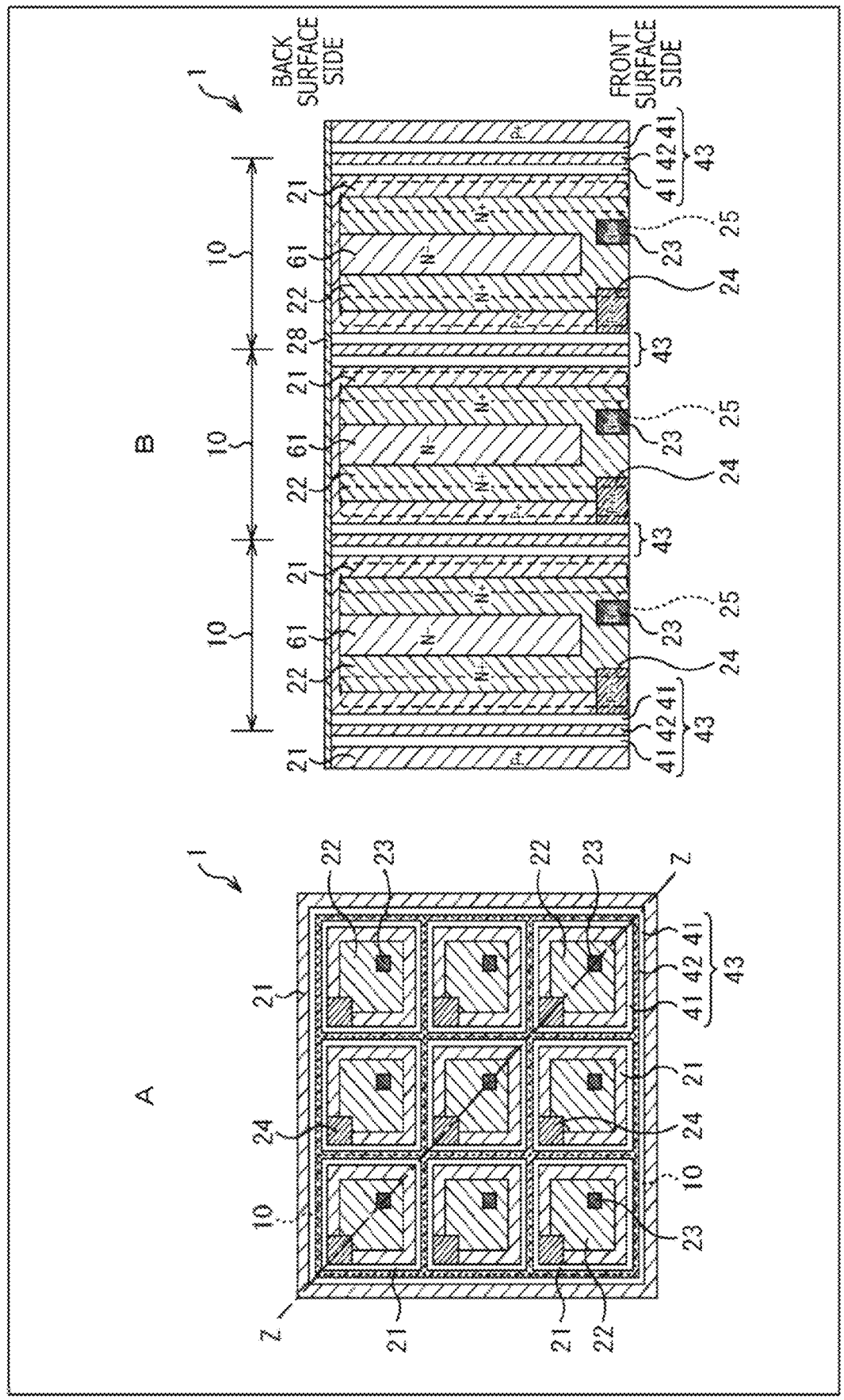
FIG. 13 is a diagram depicting an example of configuration of a sixth embodiment of the photodiode array as a light detecting element to which the present technology is applied.

FIG. 13 depicts an example of configuration of a sixth embodiment of the photodiode array as a light detecting element to which the present technology is applied.

A of FIG. 13 is a plan view of a semiconductor substrate of a photodiode array 1. B of FIG. 13 is a sectional view of the semiconductor substrate of the photodiode array 1. A of FIG. 13 is a plan view of the lower surface of the semiconductor substrate in the sectional view of B of FIG. 13, the lower surface corresponding to the front surface side of the semiconductor substrate. B of FIG. 13 is a sectional view taken along a line Z-Z of A of FIG. 13.

In FIG. 13, parts corresponding to those of the foregoing first to fifth embodiments are identified by the same reference numerals. Description of the parts will be omitted as appropriate, and different parts will be described.

When the sectional view of B of FIG. 13 is compared with the sectional view of the fourth embodiment which sectional view is depicted in FIG. 8, an anode contact 24 is formed so as to be adjacent to each of separating portions 43 on both sides which separating portions are formed at pixel boundaries in FIG. 8, whereas an anode contact 24 is formed so as to be adjacent to only one of separating portions 43 on both sides in FIG. 13. In addition, a cathode contact 23 is disposed so as to be shifted to the side of the separating portion 43 where the anode contact 24 is not formed, rather than in the central portion of the pixel 10.

As viewed in the plan view of A of FIG. 13, the anode contact 24 is disposed in contact with the separating portion 43 at one corner of the rectangular pixel 10 (upper left in A of FIG. 13), and the cathode contact 23 is disposed so as to be shifted to a position closer to a corner diagonal to the corner where the anode contact 24 is disposed than to the central portion of the N+ type second semiconductor layer 22 (central portion of the pixel).

Thus, in the sixth embodiment, the cathode contact 23 and the anode contact 24 are arranged in a diagonal direction within the planar region of the rectangular pixel 10. A distance between the cathode contact 23 and the anode contact 24 can therefore be increased in a possible range within the pixel. It is thereby possible to avoid causing an electric field to become higher than in a high field region 25 due to proximity between the cathode contact 23 and the anode contact 24 as high-concentration layers of the N type and the P type on the front surface side of the semiconductor substrate, and thus suppress an unintended breakdown.

7. Seventh Embodiment

Figure 14:
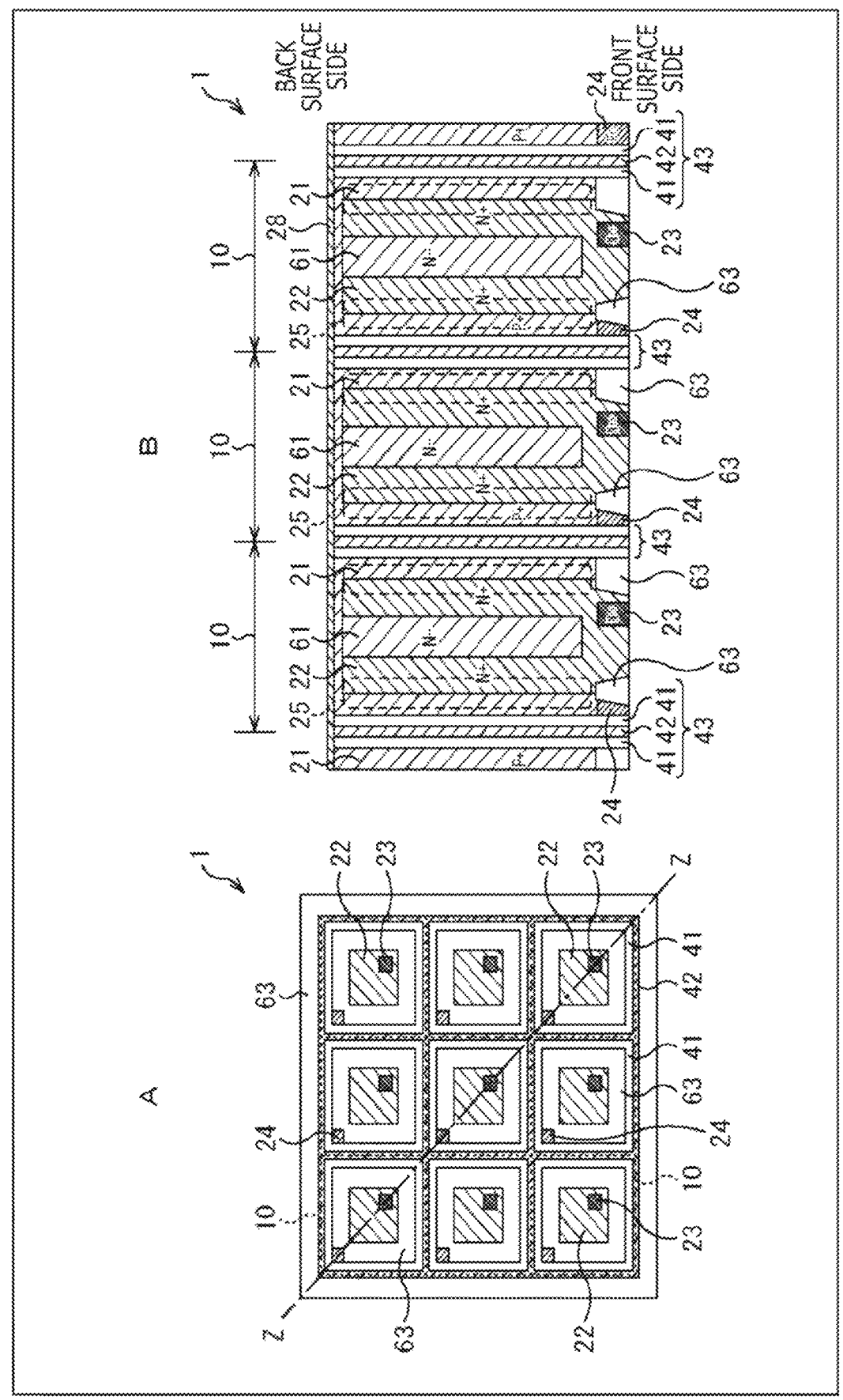
FIG. 14 is a diagram depicting an example of configuration of a seventh embodiment of the photodiode array as a light detecting element to which the present technology is applied.

FIG. 14 depicts an example of configuration of a seventh embodiment of the photodiode array as a light detecting element to which the present technology is applied.

A of FIG. 14 is a plan view of a semiconductor substrate of a photodiode array 1. B of FIG. 14 is a sectional view of the semiconductor substrate of the photodiode array 1. A of FIG. 14 is a plan view of the lower surface of the semiconductor substrate in the sectional view of B of FIG. 14, the lower surface corresponding to the front surface side of the semiconductor substrate. B of FIG. 14 is a sectional view taken along a line Z-Z of A of FIG. 14.

In FIG. 14, parts corresponding to those of the foregoing first to sixth embodiments are identified by the same reference numerals. Description of the parts will be omitted as appropriate, and different parts will be described.

The seventh embodiment of FIG. 14 is a mode having both of the characteristic configurations of the fifth embodiment of FIG. 12 and the sixth embodiment of FIG. 13.

Specifically, as in the fifth embodiment of FIG. 12, the seventh embodiment of FIG. 14 is provided with an STI 63. The STI 63 electrically separates an anode contact 24 connected to a P+ type first semiconductor layer 21 from a cathode contact 23 connected to an N+ type second semiconductor layer 22 on the front surface side of the semiconductor substrate. Also, as in the sixth embodiment of FIG. 13, in the seventh embodiment of FIG. 14, the cathode contact 23 and the anode contact 24 are arranged in a diagonal direction within the planar region of the rectangular pixel 10.

It is thereby possible to suppress multiplication of dark current occurring in the front surface of the semiconductor substrate. Also, it is possible to avoid causing an electric field to become higher than in a high field region 25 due to proximity between the cathode contact 23 and the anode contact 24 on the front surface side of the semiconductor substrate, and thus suppress an unintended breakdown.

8. Eighth Embodiment

Figure 15:
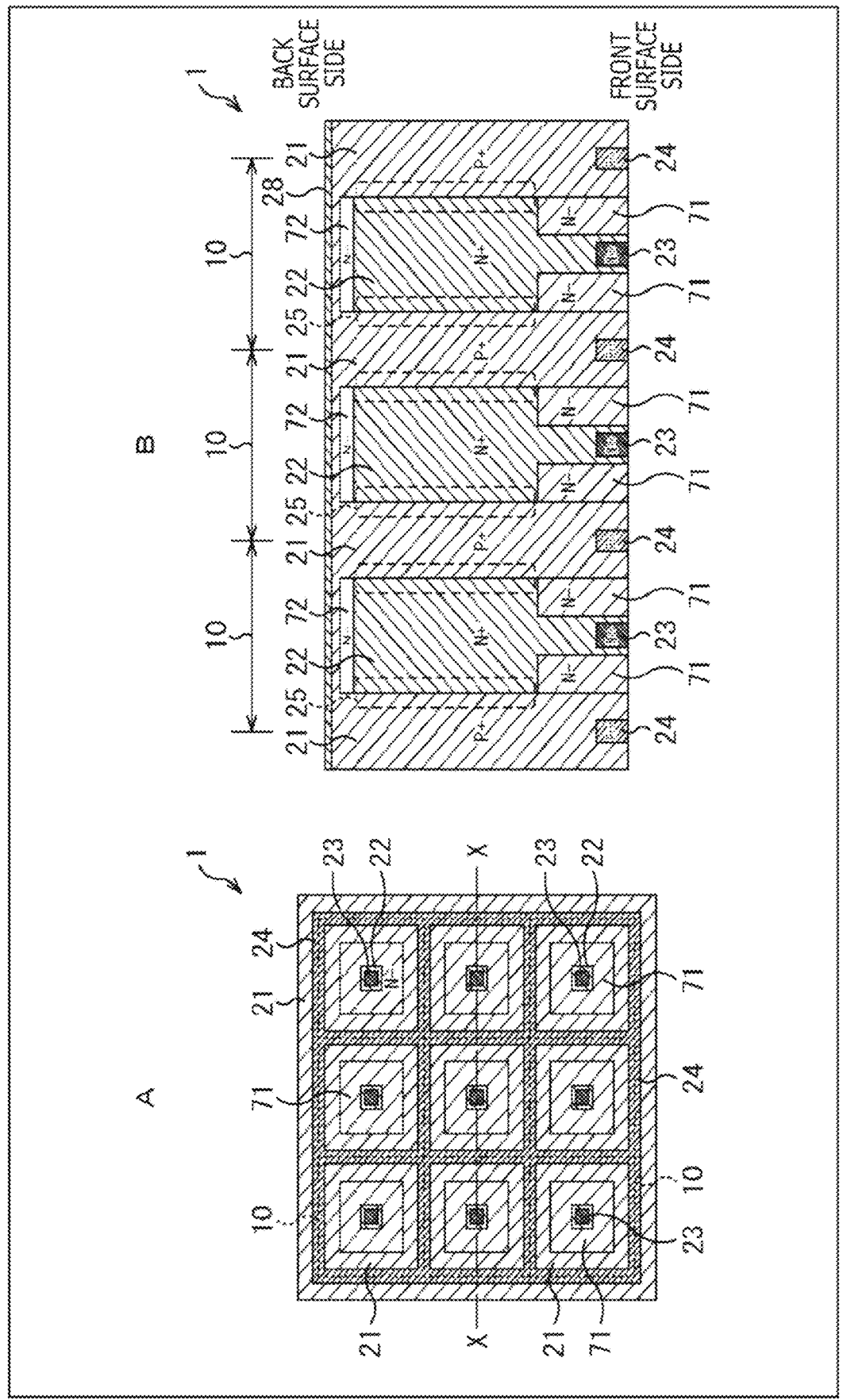
FIG. 15 is a diagram depicting an example of configuration of an eighth embodiment of the photodiode array as a light detecting element to which the present technology is applied.

FIG. 15 depicts an example of configuration of an eighth embodiment of the photodiode array as a light detecting element to which the present technology is applied.

A of FIG. 15 is a plan view of a semiconductor substrate of a photodiode array 1. B of FIG. 15 is a sectional view of the semiconductor substrate of the photodiode array 1. A of FIG. 15 is a plan view of the lower surface of the semiconductor substrate in the sectional view of B of FIG. 15, the lower surface corresponding to the front surface side of the semiconductor substrate. B of FIG. 15 is a sectional view taken along a line X-X of A of FIG. 15.

In the sectional view illustrated in B of FIG. 15, a fixed charge film 28 for suppressing dark current is formed at the back surface side interface of the semiconductor substrate. FIG. 15 depicts an example of configuration of the back surface irradiation type.

In the eighth embodiment depicted in FIG. 15, as compared with the configuration of the first embodiment depicted in FIG. 2, an N type fourth semiconductor layer 71 of lower impurity concentration than N+ type second semiconductor layers 22 (the N type fourth semiconductor layer 71 will hereinafter be referred to as an N− type fourth semiconductor layer 71) is formed between an N+ type second semiconductor layer 22 and the front surface of the semiconductor substrate. Also, an N type fifth semiconductor layer 72 of lower impurity concentration than the N+ type second semiconductor layer 22 (the N type fifth semiconductor layer 72 will hereinafter be referred to as an N− type fifth semiconductor layer 72) is formed between the N+ type second semiconductor layer 22 and the back surface of the semiconductor substrate. It suffices for the impurity concentrations of the N− type fourth semiconductor layer 71 and the N− type fifth semiconductor layer 72 to be lower than that of the N+ type second semiconductor layer 22, and the impurity concentrations of the N− type fourth semiconductor layer 71 and the N− type fifth semiconductor layer 72 do not need to be the same concentration.

As depicted in A of FIG. 15, in the planar direction, the N− type fourth semiconductor layer 71 is formed in the shape of concentric rectangles between the N+ type second semiconductor layer 22 and a P+ type first semiconductor layer 21. The N− type fifth semiconductor layer 72 is formed in the same planar region as the N+ type second semiconductor layer 22 with which the N− type fifth semiconductor layer 72 is in contact.

The other configuration of the eighth embodiment of FIG. 15 is similar to the configuration of the back surface irradiation type of the first embodiment depicted in FIG. 2, and therefore description thereof will be omitted.

When the N− type fourth semiconductor layer 71 of lower impurity concentration than the N+ type second semiconductor layer 22 is formed between the N+ type second semiconductor layer 22 and the front surface of the semiconductor substrate, an interface between the P+ type first semiconductor layer 21 and the N+ type second semiconductor layer 22 forming a high field region 25 avoids contacting the front surface of the semiconductor substrate. It is thereby possible to suppress multiplication of dark current occurring in the front surface of the semiconductor substrate.

When the N− type fifth semiconductor layer 72 of lower impurity concentration than the N+ type second semiconductor layer 22 is formed between the N+ type second semiconductor layer 22 and the back surface of the semiconductor substrate, the interface between the P+ type first semiconductor layer 21 and the N+ type second semiconductor layer 22 forming the high field region 25 avoids contacting the back surface of the semiconductor substrate. It is thereby possible to suppress multiplication of dark current occurring in the back surface of the semiconductor substrate.

Incidentally, the structure in which the N− type fourth semiconductor layer 71 and the N− type fifth semiconductor layer 72 are thus arranged so as to be adjacent to the N+ type second semiconductor layer 22 in a substrate depth direction can be applied also to the other embodiments described above.

Figure 16:
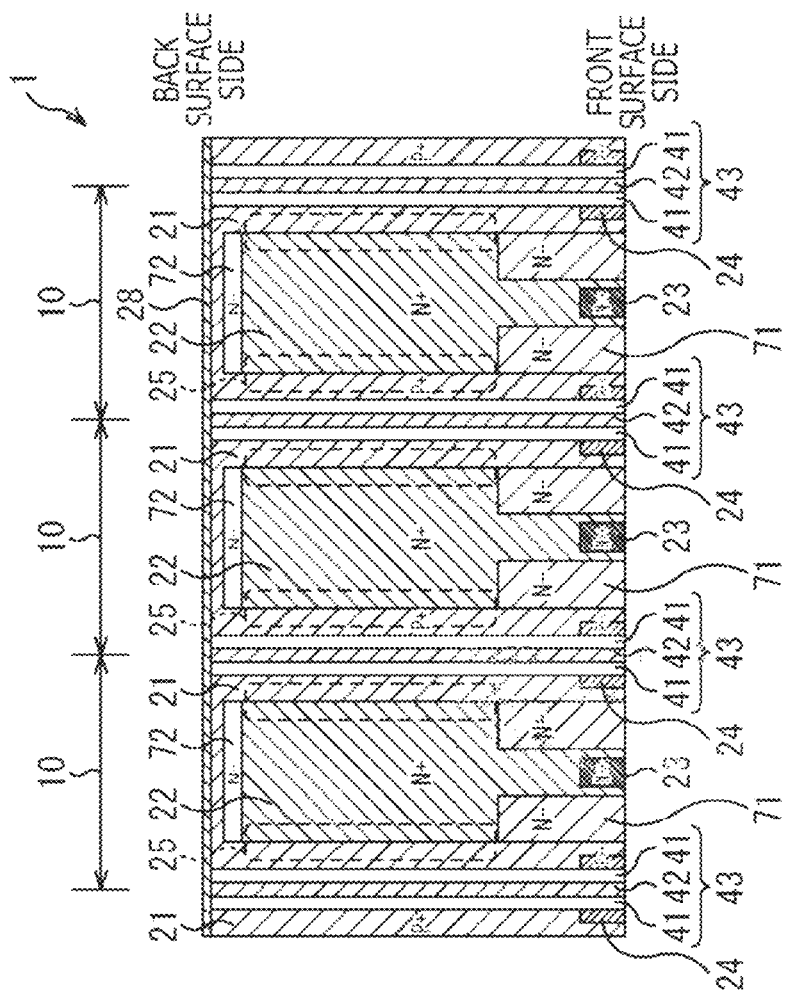
FIG. 16 is a sectional view depicting an example of a configuration in which the characteristic configuration of the eighth embodiment is added to the photodiode array of FIG. 3.

FIG. 16 is a sectional view depicting an example of a configuration in which the characteristic configuration of the eighth embodiment is added to the photodiode array 1 according to the second embodiment having the separating portions 43, the photodiode array 1 being depicted in FIG. 3.

In FIG. 16, the length in the substrate depth direction of the N+ type second semiconductor layers 22 forming the high field regions 25 of the photodiode array 1 depicted in FIG. 3 is shortened, and N− type fourth semiconductor layers 71 and N− type fifth semiconductor layers 72 are added so as to be adjacent to the N+ type second semiconductor layers 22 on the front surface side and the back surface side of the substrate.

Figure 17:
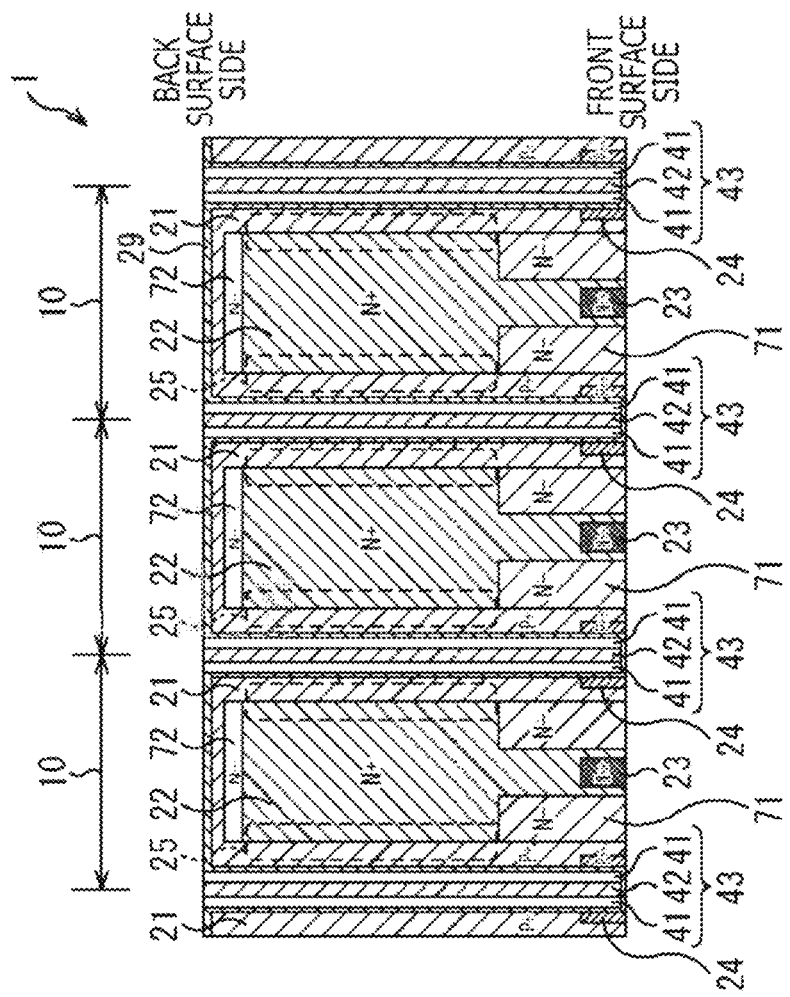
FIG. 17 is a sectional view depicting an example of a configuration in which the characteristic configuration of the eighth embodiment is added to the photodiode array of FIG. 5.

FIG. 17 is a sectional view depicting an example of a configuration in which the characteristic configuration of the eighth embodiment is added to the photodiode array 1 according to the third embodiment having the fixed charge film 29, the photodiode array 1 being depicted in FIG. 5.

In FIG. 17, the length in the substrate depth direction of the N+ type second semiconductor layers 22 forming the high field regions 25 of the photodiode array 1 depicted in FIG. 5 is shortened, and N− type fourth semiconductor layers 71 and N− type fifth semiconductor layers 72 are added so as to be adjacent to the N+ type second semiconductor layers 22 on the front surface side and the back surface side of the substrate.

Figure 18:
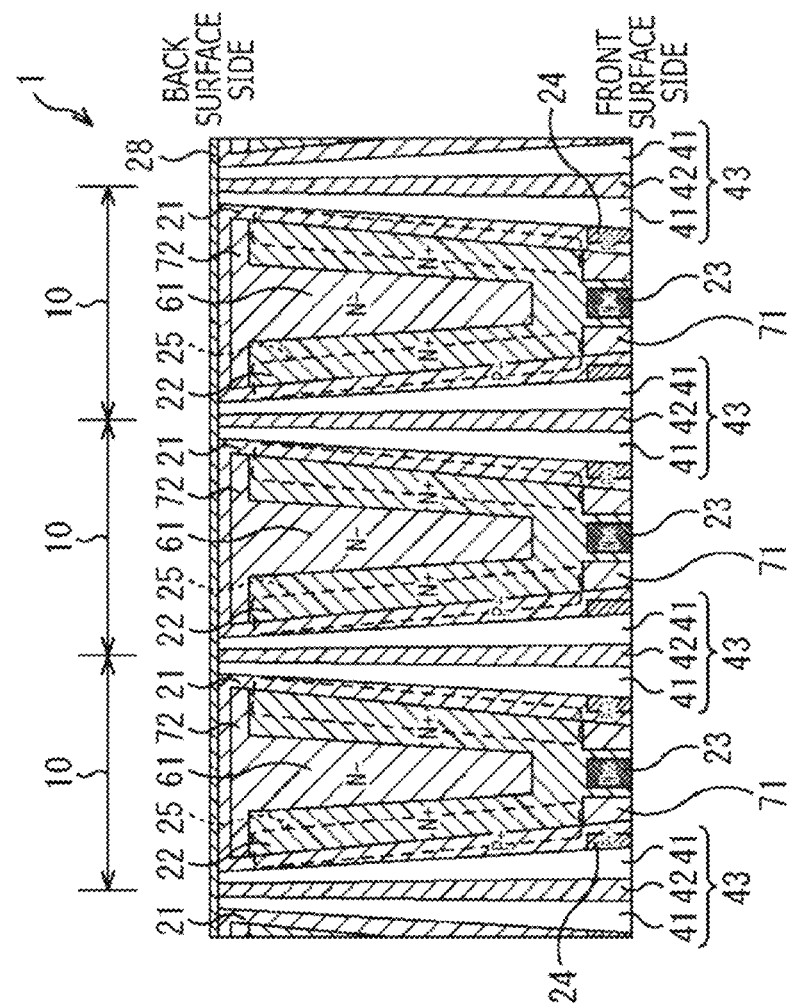
FIG. 18 is a sectional view depicting an example of a configuration in which the characteristic configuration of the eighth embodiment is added to the photodiode array of FIG. 9.

FIG. 18 is a sectional view depicting an example of a configuration in which the characteristic configuration of the eighth embodiment is added to the photodiode array 1 according to the fourth embodiment having the taper-shaped separating portions 43 and the low-concentration N− type third semiconductor layers 61 in the central portions of pixels, the photodiode array 1 being depicted in FIG. 9.

FIG. 18 is a sectional view depicting an example of a configuration in which the characteristic configuration of the eighth embodiment is added to the photodiode array 1 according to the fourth embodiment having the taper-shaped separating portions 43 and the low-concentration N− type third semiconductor layers 61 in the central portions of pixels, the photodiode array 1 being depicted in FIG. 9.

Figure 19:
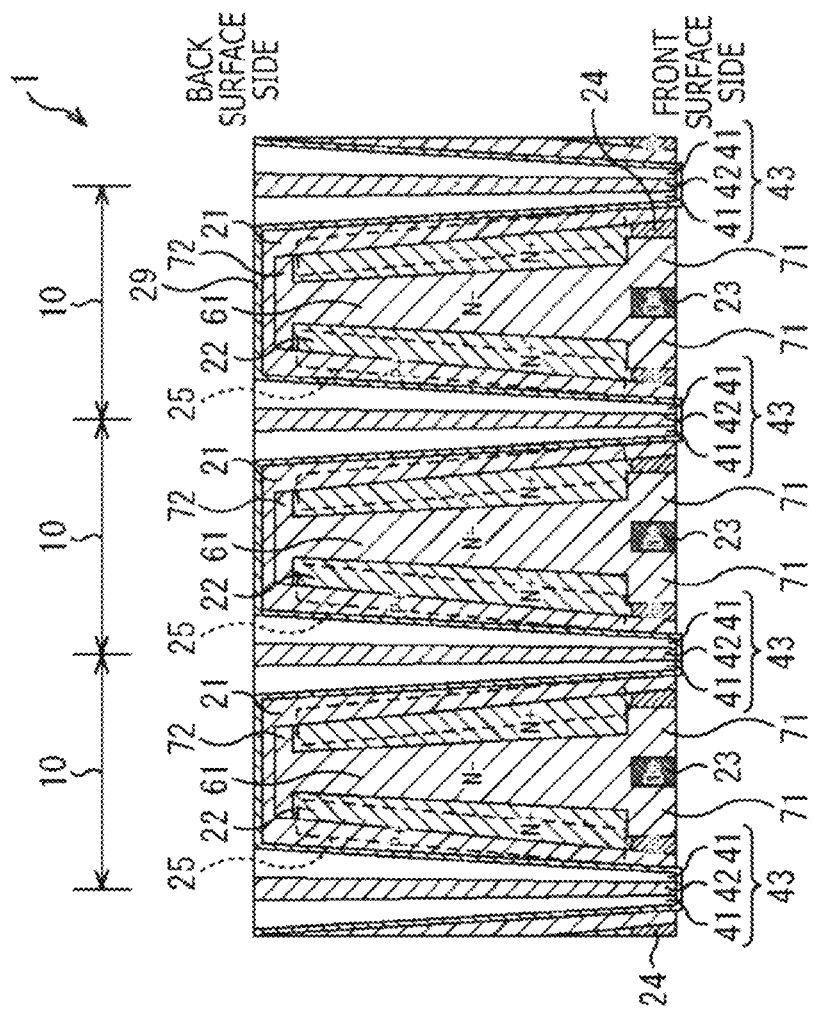
FIG. 19 is a sectional view depicting an example of a configuration in which the characteristic configuration of the eighth embodiment is added to the photodiode array of FIG. 11.

FIG. 19 is a sectional view depicting an example of a configuration in which the characteristic configuration of the eighth embodiment is added to the photodiode array 1 according to the fourth embodiment having the taper-shaped separating portions 43 and the low-concentration N− type third semiconductor layers 61 in the central portions of pixels, the photodiode array 1 being depicted in FIG. 11.

In FIG. 19, the length in the substrate depth direction of the N+ type second semiconductor layers 22 forming the high field regions 25 of the photodiode array 1 depicted in FIG. 11 is shortened, and N− type fourth semiconductor layers 71 and N− type fifth semiconductor layers 72 are added so as to be adjacent to the N+ type second semiconductor layers 22 on the front surface side and the back surface side of the substrate.

In any of the configurations of FIGS. 16 to 19, multiplication of dark current occurring in the front surface and the back surface of the semiconductor substrate can be suppressed by providing the N− type fourth semiconductor layers 71 and the N− type fifth semiconductor layers 72.

9. Ninth Embodiment

Figure 20:
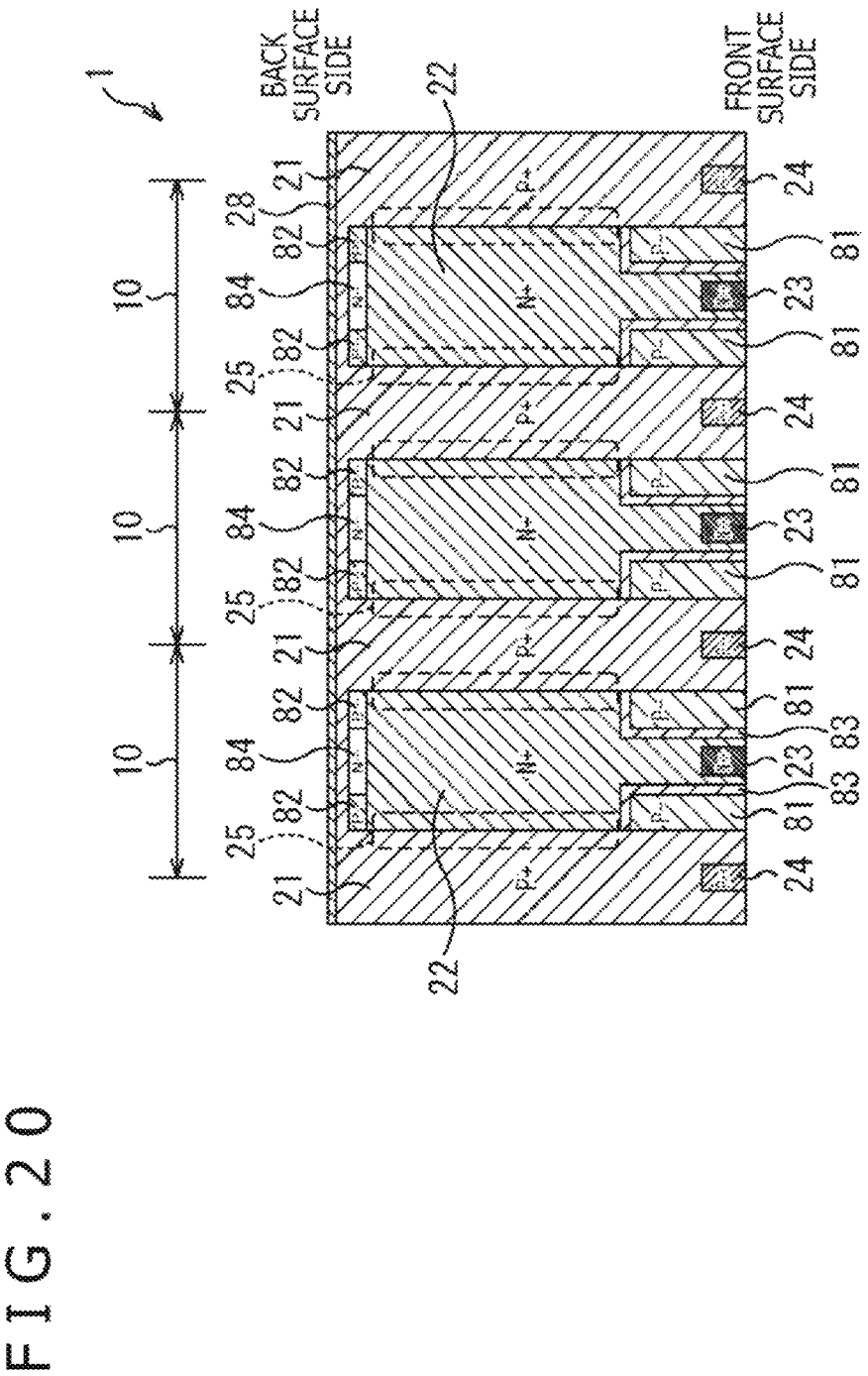
FIG. 20 is a diagram depicting an example of configuration of a ninth embodiment of the photodiode array as a light detecting element to which the present technology is applied.

FIG. 20 depicts an example of configuration of a ninth embodiment of the photodiode array as a light detecting element to which the present technology is applied.

The ninth embodiment will be described in comparison with the eighth embodiment depicted in FIGS. 15 to 19.

In the photodiode array 1 according to the ninth embodiment depicted in FIG. 20, a P type sixth semiconductor layer 81 and a P type seventh semiconductor layer 82 of lower impurity concentration than P+ type first semiconductor layers 21 (the P type sixth semiconductor layer 81 will hereinafter be referred to as a P− type sixth semiconductor layer 81 and the P type seventh semiconductor layer 82 will hereinafter be referred to as a P− type seventh semiconductor layer 82) are formed in the regions of the N− type fourth semiconductor layer 71 and the N− type fifth semiconductor layer 72 formed so as to be adjacent to the N+ type second semiconductor layer 22 on the substrate front surface side and the substrate back surface side in the eighth embodiment depicted in FIG. 15.

Incidentally, a low-concentration N type (N− type) eighth semiconductor layer 83 (hereinafter referred to as an N− type eighth semiconductor layer 83) is inserted with a small film thickness between the P− type sixth semiconductor layer 81 and the N+ type second semiconductor layer 22. However, this N− type eighth semiconductor layer 83 may be replaced with the P− type sixth semiconductor layer 81.

Also, a low-concentration N type (N− type) ninth semiconductor layer 84 (hereinafter referred to as an N− type ninth semiconductor layer 84) is formed on the inside in the planar direction of the P− type seventh semiconductor layer 82. However, this N− type ninth semiconductor layer 84 may be replaced with the P− type seventh semiconductor layer 82.

Figure 21:
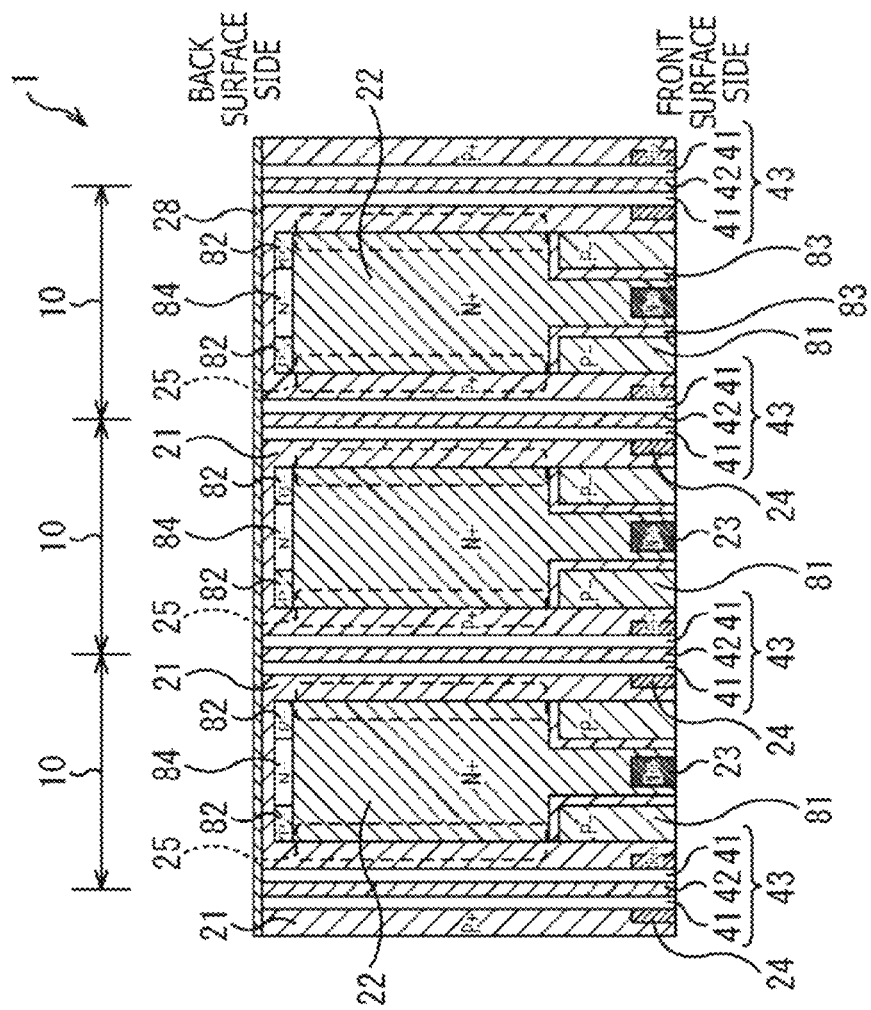
FIG. 21 is a sectional view depicting an example of a configuration in which the characteristic configuration of the ninth embodiment is added to the photodiode array of FIG. 16.

A photodiode array 1 according to the ninth embodiment which photodiode array is depicted in FIG. 21 corresponds to a configuration example according to the eighth embodiment which configuration example is depicted in FIG. 16. The N− type fourth semiconductor layers 71 and the N− type fifth semiconductor layers 72 formed so as to be adjacent to the N+ type second semiconductor layers 22 on the front surface side and the back surface side of the substrate in FIG. 16 are replaced with P− type sixth semiconductor layers 81 and P− type seventh semiconductor layers 82 and N− type eighth semiconductor layers 83 and N− type ninth semiconductor layers 84 in FIG. 21.

Figure 22:
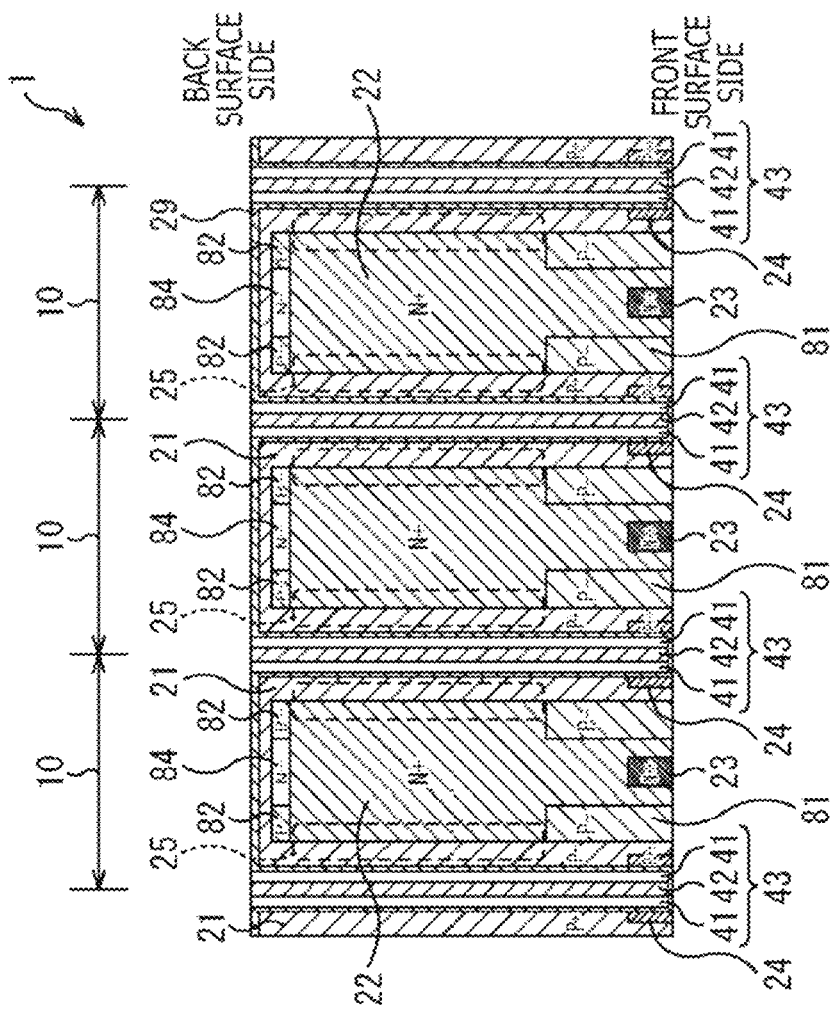
FIG. 22 is a sectional view depicting an example of a configuration in which the characteristic configuration of the ninth embodiment is added to the photodiode array of FIG. 17.

A photodiode array 1 according to the ninth embodiment which photodiode array is depicted in FIG. 22 corresponds to a configuration example according to the eighth embodiment which configuration example is depicted in FIG. 17. The N− type fourth semiconductor layers 71 and the N− type fifth semiconductor layers 72 formed so as to be adjacent to the N+ type second semiconductor layers 22 on the front surface side and the back surface side of the substrate in FIG. 17 are replaced with P− type sixth semiconductor layers 81 and P− type seventh semiconductor layers 82 and N− type eighth semiconductor layers 83 and N− type ninth semiconductor layers 84 in FIG. 22.

Figure 23:
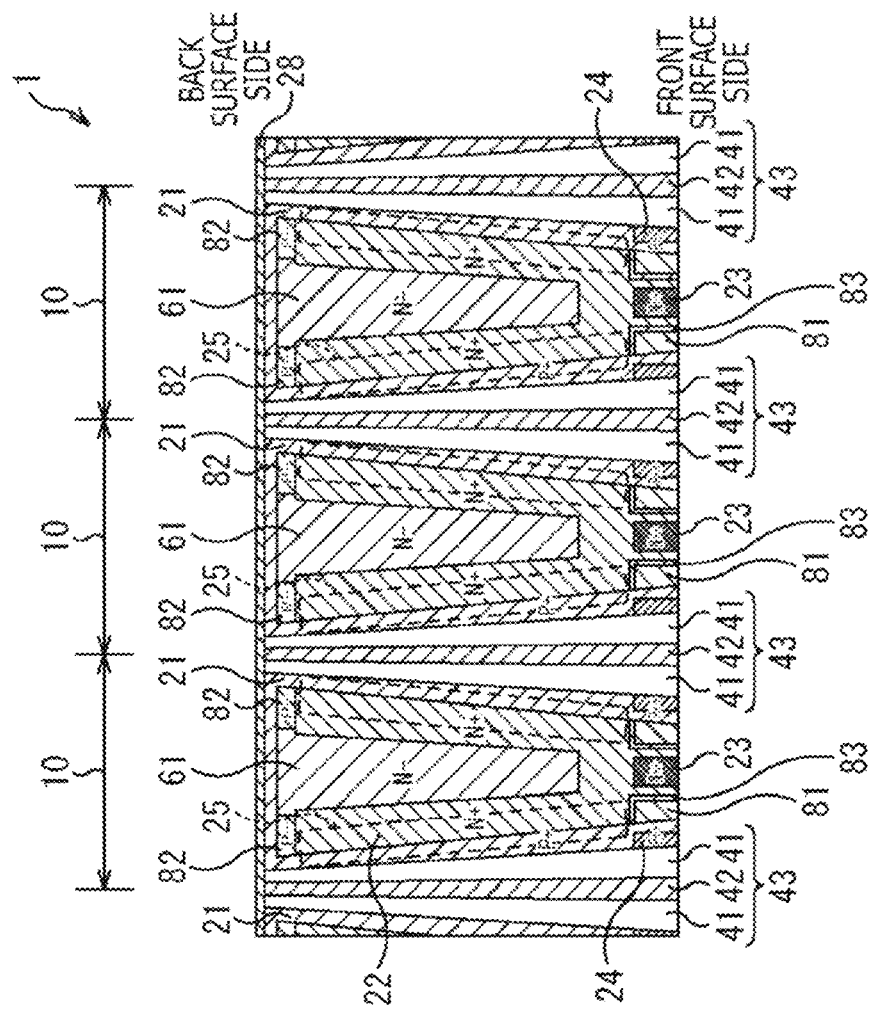
FIG. 23 is a sectional view depicting an example of a configuration in which the characteristic configuration of the ninth embodiment is added to the photodiode array of FIG. 18.

A photodiode array 1 according to the ninth embodiment which photodiode array is depicted in FIG. 23 corresponds to a configuration example according to the eighth embodiment which configuration example is depicted in FIG. 18. The N− type fourth semiconductor layers 71 and the N− type fifth semiconductor layers 72 formed so as to be adjacent to the N+ type second semiconductor layers 22 on the front surface side and the back surface side of the substrate in FIG. 18 are replaced with P− type sixth semiconductor layers 81 and P− type seventh semiconductor layers 82 and N-type eighth semiconductor layers 83 and N− type ninth semiconductor layers 84 in FIG. 23. Incidentally, in FIG. 23, the N− type ninth semiconductor layers 84 are depicted as N− type third semiconductor layers 61 of the same type and the same concentration.

Figure 24:
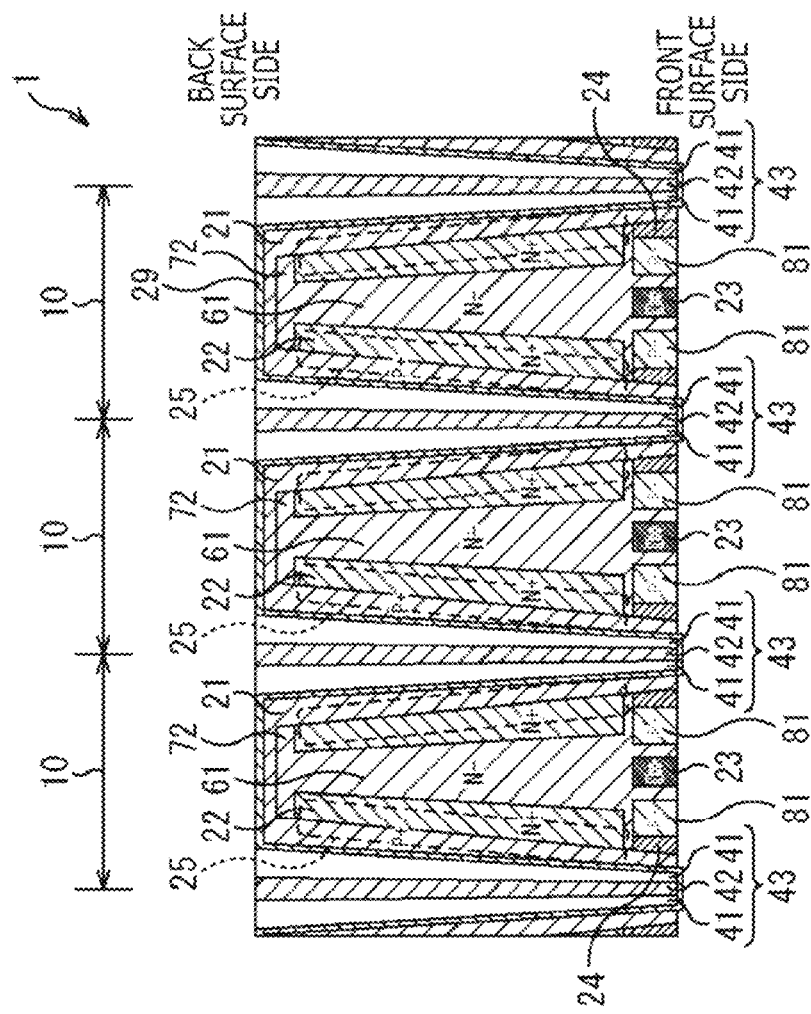
FIG. 24 is a sectional view depicting an example of a configuration in which the characteristic configuration of the ninth embodiment is added to the photodiode array of FIG. 19.

A photodiode array 1 according to the ninth embodiment which photodiode array is depicted in FIG. 24 corresponds to a configuration example according to the eighth embodiment which configuration example is depicted in FIG. 19. The N− type fourth semiconductor layers 71 formed so as to be adjacent to the N+ type second semiconductor layers 22 on the front surface side of the substrate in FIG. 19 are replaced with P− type sixth semiconductor layers 81 in FIG. 24.

Incidentally, as in FIG. 20, in FIGS. 21 to 23, the N− type eighth semiconductor layers 83 and the-type ninth semiconductor layers 84 may be replaced with the P− type sixth semiconductor layers 81 and the P− type seventh semiconductor layers 82, respectively.

According to the ninth embodiment of FIGS. 21 to 24, a P− type sixth semiconductor layer 81 of lower impurity concentration than an N+ type second semiconductor layer 22 is formed between the N+ type second semiconductor layer 22 and the front surface of the semiconductor substrate. Thus, an interface between a P+ type first semiconductor layer 21 and the N+ type second semiconductor layer 22 forming a high field region 25 avoids contacting the front surface of the semiconductor substrate. It is thereby possible to suppress multiplication of dark current occurring in the front surface of the semiconductor substrate.

AP− type seventh semiconductor layer 82 of a lower impurity concentration than the N+ type second semiconductor layer 22 is formed between the N+ type second semiconductor layer 22 and the back surface of the semiconductor substrate. Thus, the interface between the P+ type first semiconductor layer 21 and the N+ type second semiconductor layer 22 forming the high field region 25 avoids contacting the back surface of the semiconductor substrate. It is thereby possible to suppress multiplication of dark current occurring in the back surface of the semiconductor substrate.

10. Tenth Embodiment

Figure 25:
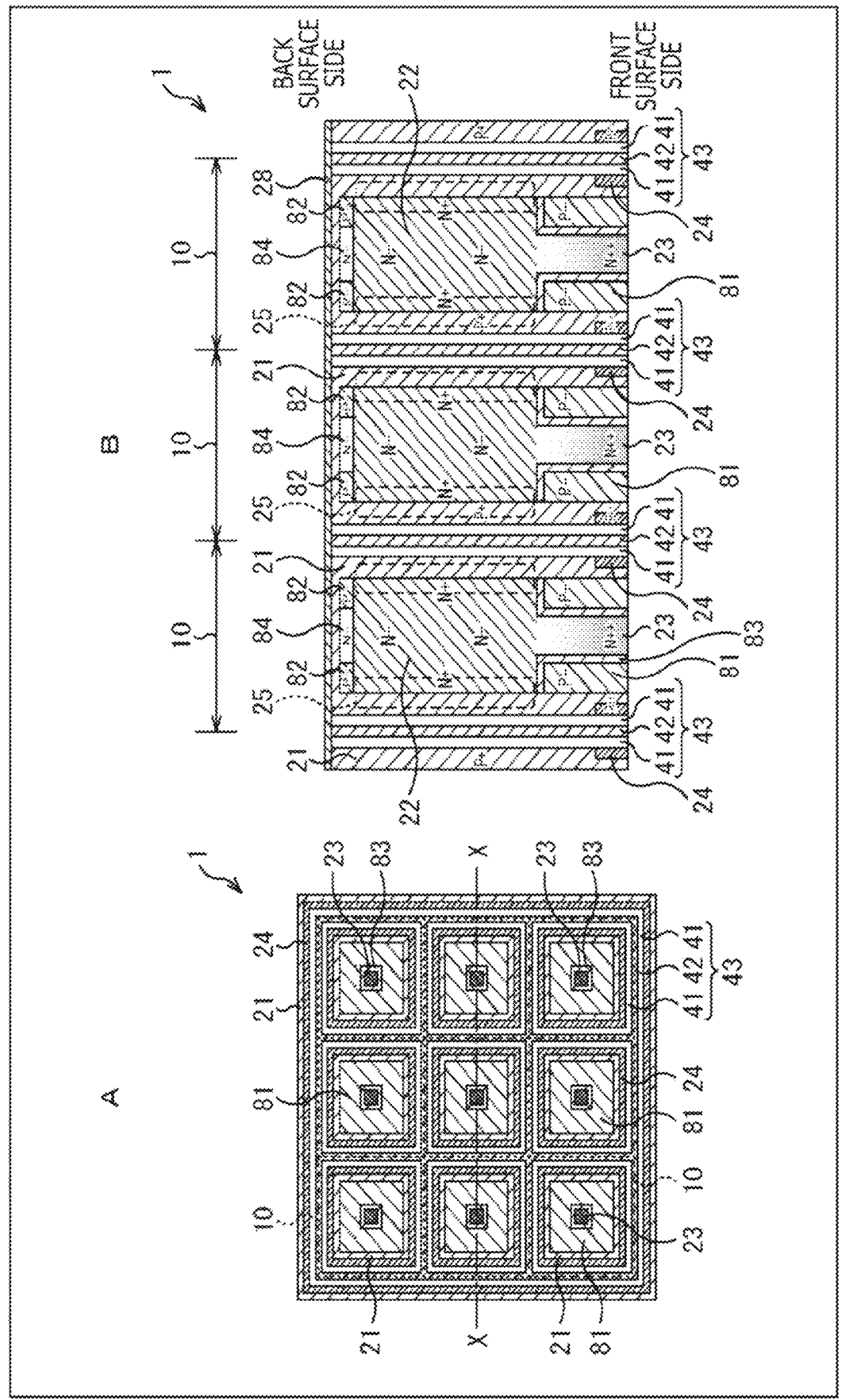
FIG. 25 is a diagram depicting an example of configuration of a tenth embodiment of the photodiode array as a light detecting element to which the present technology is applied.

FIG. 25 depicts an example of configuration of a tenth embodiment of the photodiode array as a light detecting element to which the present technology is applied.

A of FIG. 25 is a plan view of a semiconductor substrate of a photodiode array 1. B of FIG. 25 is a sectional view of the semiconductor substrate of the photodiode array 1. A of FIG. 25 is a plan view of the lower surface of the semiconductor substrate in the sectional view of B of FIG. 25, the lower surface corresponding to the front surface side of the semiconductor substrate. B of FIG. 25 is a sectional view taken along a line X-X of A of FIG. 25.

In the tenth embodiment depicted in FIG. 25, concentration distribution within the region of an N+ type second semiconductor layer 22 is different as compared with the ninth embodiment depicted in FIG. 21.

Specifically, in the ninth embodiment depicted in FIG. 21, the impurity concentration within the region of the N+ type second semiconductor layer 22 is formed uniformly.

On the other hand, in the tenth embodiment of FIG. 25, the impurity concentration is increased from the back surface of the substrate to the front surface of the substrate in a substrate depth direction, and becomes the impurity concentration of a cathode contact 23 at the front surface of the substrate. Also, in the planar direction orthogonal to the substrate depth direction, the impurity concentration is increased from the central portion of the pixel to a pixel boundary, and becomes a sufficiently high concentration for forming a high field region 25 at the interface between the P+ type first semiconductor layer 21 and the N+ type second semiconductor layer 22.

When a potential gradient is formed in the planar direction, a charge generated by photoelectric conversion of incident light can be efficiently captured into the high field region 25, as in the fourth embodiment depicted in FIG. 7 and the like.

Also, when a potential gradient is formed in the substrate depth direction, a charge multiplied in the high field region 25 can be efficiently collected into the cathode contact 23.

11. Eleventh Embodiment

Figure 26:
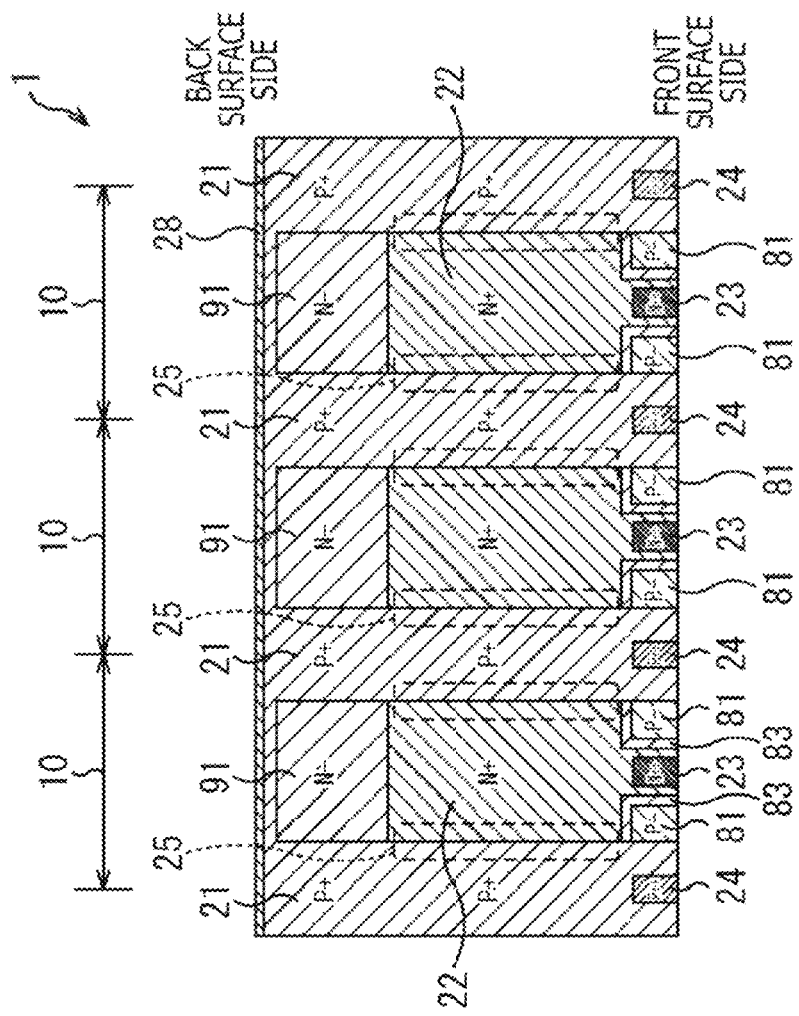
FIG. 26 is a diagram depicting an example of configuration of an eleventh embodiment of the photodiode array as a light detecting element to which the present technology is applied.

FIG. 26 depicts an example of configuration of an eleventh embodiment of the photodiode array as a light detecting element to which the present technology is applied.

The eleventh embodiment will be described in comparison with the ninth embodiment depicted in FIGS. 20 to 24.

the photodiode array 1 according to the eleventh embodiment depicted in FIG. 26, the P− type seventh semiconductor layers 82 and the N− type ninth semiconductor layers 84 formed so as to be adjacent to the N+ type second semiconductor layers 22 on the back surface side of the substrate in the ninth embodiment depicted in FIG. 20 are replaced with low-concentration N type (N− type) tenth semiconductor layers 91 (hereinafter referred to as N− type tenth semiconductor layers 91). The N− type tenth semiconductor layers 91 are formed with a larger thickness in a substrate depth direction than the P− type seventh semiconductor layers 82 and the N− type ninth semiconductor layers 84 in FIG. 20. The region of each high field region 25 is correspondingly formed with a short length in the substrate depth direction.

When the region of the high field region 25 is thus formed with a short length in the substrate depth direction and separated from the front surface of the substrate and the back surface of the substrate, an interface between the P+ type first semiconductor layer 21 and the N+ type second semiconductor layer 22 forming the high field region 25 avoids contacting the front surface and the back surface of the semiconductor substrate. It is thereby possible to suppress multiplication of dark current occurring in the front surface and the back surface of the semiconductor substrate.

Figure 27:
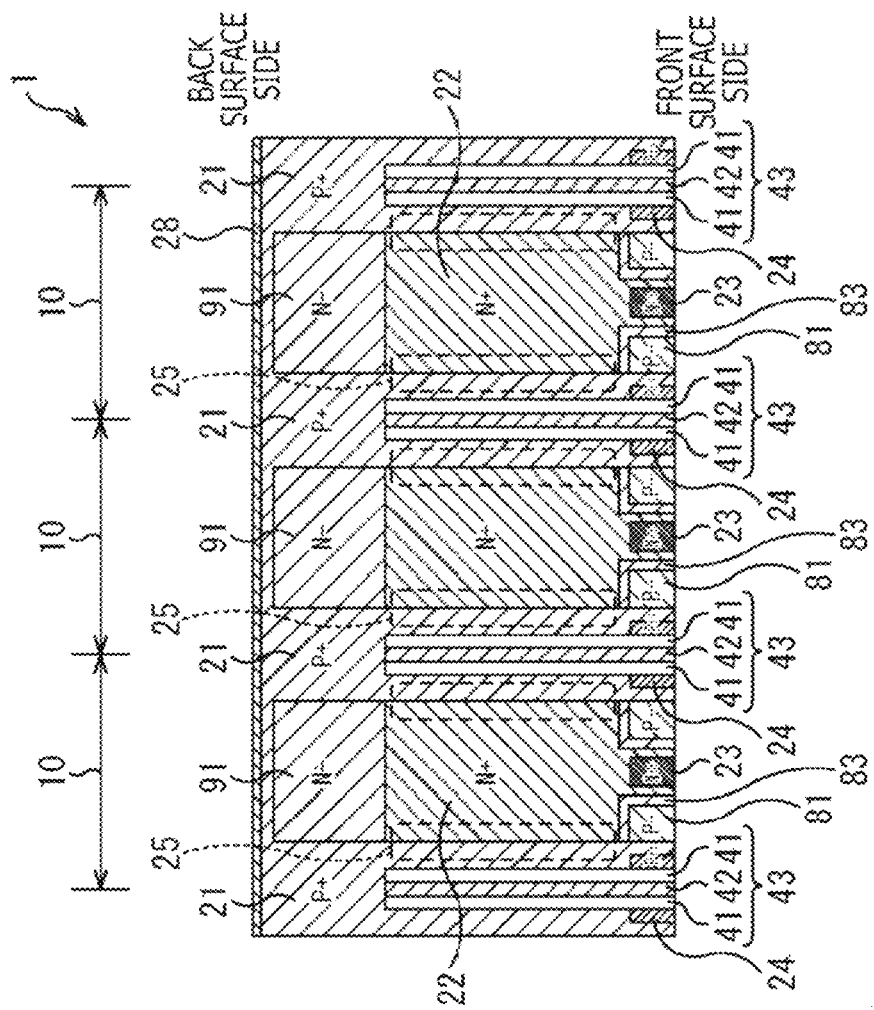
FIG. 27 is a sectional view depicting an example of a configuration in which the characteristic configuration of the eleventh embodiment is added to the photodiode array of FIG. 21.

A photodiode array 1 according to the eleventh embodiment depicted in FIG. 27 corresponds to a configuration example according to the ninth embodiment which configuration example is depicted in FIG. 21. The P− type seventh semiconductor layers 82 and the N− type ninth semiconductor layers 84 formed so as to be adjacent to the N+ type second semiconductor layers 22 on the back surface side of the substrate in FIG. 21 are replaced with N− type tenth semiconductor layers 91 in FIG. 27. Also, the separating portions 43 formed at boundaries between pixels 10 are formed from the front surface side of the substrate so as to correspond to the length in the substrate depth direction of the regions of high field regions 25.

Figure 28:
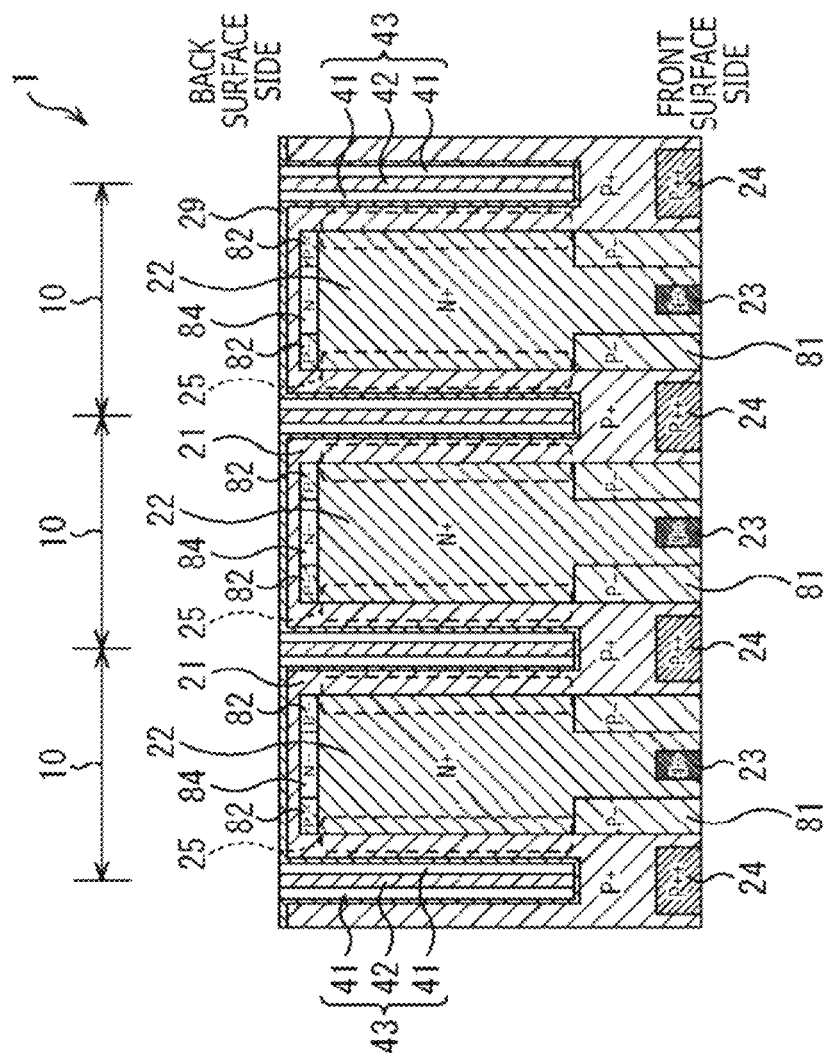
FIG. 28 is a sectional view depicting an example of a configuration in which the characteristic configuration of the eleventh embodiment is added to the photodiode array of FIG. 22.

A photodiode array 1 according to the eleventh embodiment depicted in FIG. 28 corresponds to a configuration example according to the ninth embodiment which configuration example is depicted in FIG. 22. The separating portions 43 formed at boundaries between pixels 10 in FIG. 22 are formed from the back surface side of the substrate so as to correspond to the length in the substrate depth direction of the regions of high field regions 25 in FIG. 28.

Figure 29:
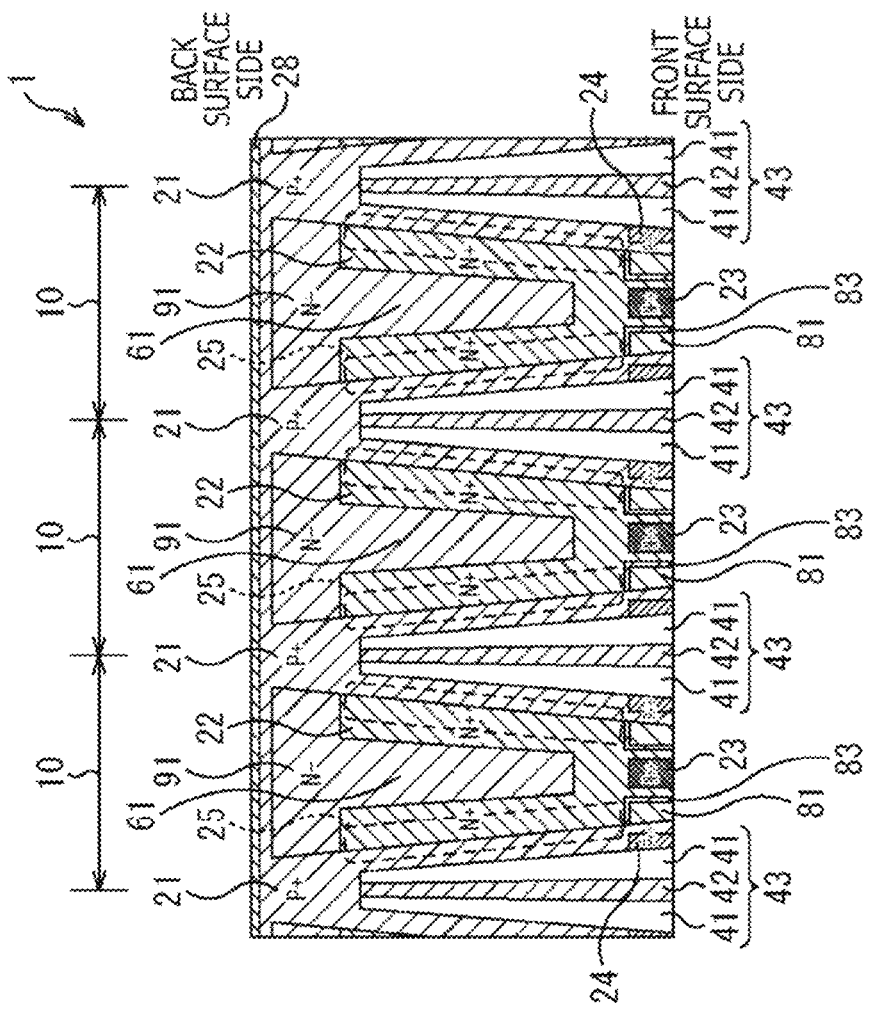
FIG. 29 is a sectional view depicting an example of a configuration in which the characteristic configuration of the eleventh embodiment is added to the photodiode array of FIG. 23.

A photodiode array 1 according to the eleventh embodiment depicted in FIG. 29 corresponds to a configuration example according to the ninth embodiment which configuration example is depicted in FIG. 23. The N− type third semiconductor layers 61 and the P− type seventh semiconductor layers 82 formed so as to be adjacent to the N+ type second semiconductor layers 22 on back surface side of the substrate in FIG. 23 are replaced with N-type tenth semiconductor layers 91 in FIG. 29. Also, the separating portions 43 formed at boundaries between pixels 10 are formed from the front surface side of the substrate so as to correspond to the length in the substrate depth direction of the regions of high field regions 25.

A photodiode array 1 according to the eleventh embodiment depicted in FIG. 28 corresponds to a configuration example according to the ninth embodiment which configuration example is depicted in FIG. 22. The separating portions 43 formed at boundaries between pixels 10 in FIG. 22 are formed from the back surface side of the substrate so as to correspond to the length in the substrate depth direction of the regions of high field regions 25 in FIG. 28.

A photodiode array 1 according to the eleventh embodiment depicted in FIG. 29 corresponds to a configuration example according to the ninth embodiment which configuration example is depicted in FIG. 23. The N− type third semiconductor layers 61 and the P− type seventh semiconductor layers 82 formed so as to be adjacent to the N+ type second semiconductor layers 22 on the back surface side of the substrate in FIG. 23 are replaced with N-type tenth semiconductor layers 91 in FIG. 29. Also, the separating portions 43 formed at boundaries between pixels 10 are formed from the front surface side of the substrate so as to correspond to the length in the substrate depth direction of the regions of high field regions 25.

Figure 30:
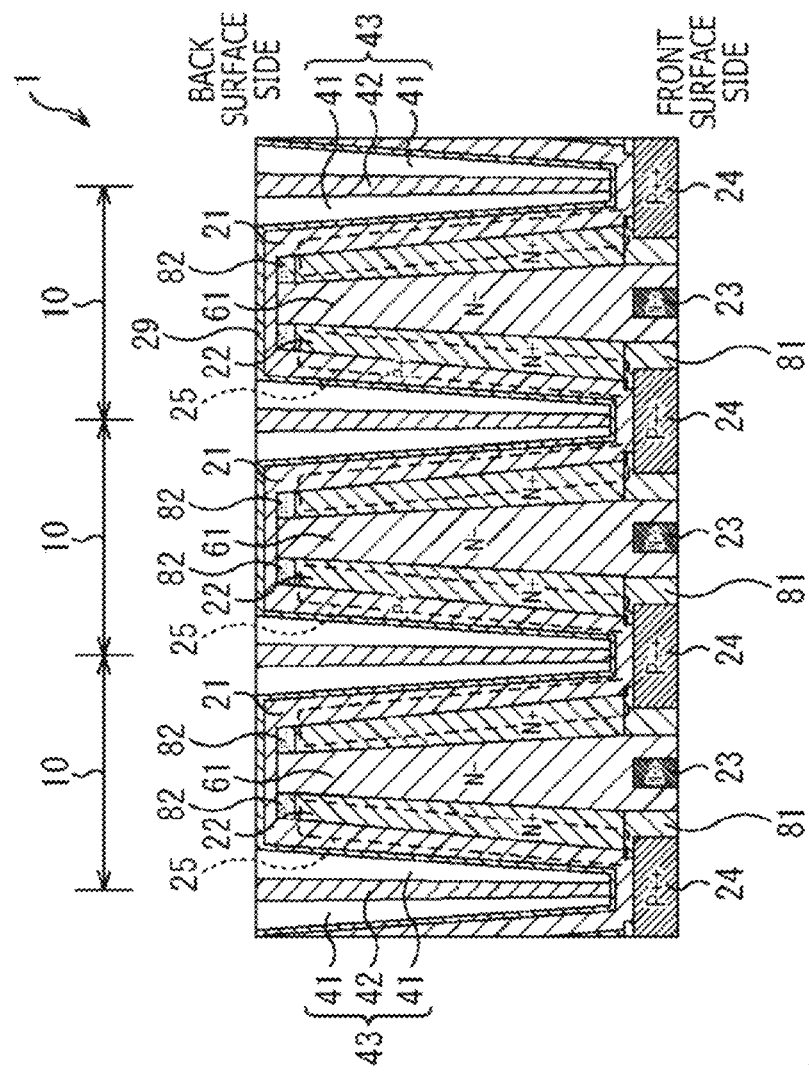
FIG. 30 is a sectional view depicting an example of a configuration in which the characteristic configuration of the eleventh embodiment is added to the photodiode array of FIG. 24.

A photodiode array 1 according to the eleventh embodiment depicted in FIG. 30 corresponds to a configuration example according to the ninth embodiment which configuration example is depicted in FIG. 24. The N− type fifth semiconductor layers 72 formed so as to be adjacent to the N+ type second semiconductor layers 22 on the back surface side of the substrate in FIG. 23 are replaced with P− type seventh semiconductor layers 82 in FIG. 30. Also, the separating portions 43 formed at boundaries between pixels 10 are formed from the back surface side of the substrate so as to correspond to the length in the substrate depth direction of the regions of high field regions 25.

According to the eleventh embodiment of FIGS. 26 to 30, the region of the high field region 25 is formed with a short length in the substrate depth direction, and is separated from the front surface of the substrate and the back surface of the substrate. Thus, the interface between the P+ type first semiconductor layer 21 and the N+ type second semiconductor layer 22 forming the high field region 25 avoids contacting the front surface and the back surface of the semiconductor substrate. It is thereby possible to suppress multiplication of dark current occurring in the front surface and the back surface of the semiconductor substrate. The smaller the area of the region of the high field region 25 becomes, the more the OCR can be improved. The OCR can therefore be improved.

12. Twelfth Embodiment

A twelfth to a fifteenth embodiment to be described with reference to FIGS. 31 to 38 represent configuration examples in which OCLs (On Chip Lens) are added to a light incidence surface side. As for a configuration within a semiconductor substrate in FIGS. 31 to 38, description will be made by taking an example in which a configuration according to the ninth embodiment which configuration is depicted in FIG. 21 is adopted. However, the configurations of the other embodiments can also be adopted.

Figure 31:
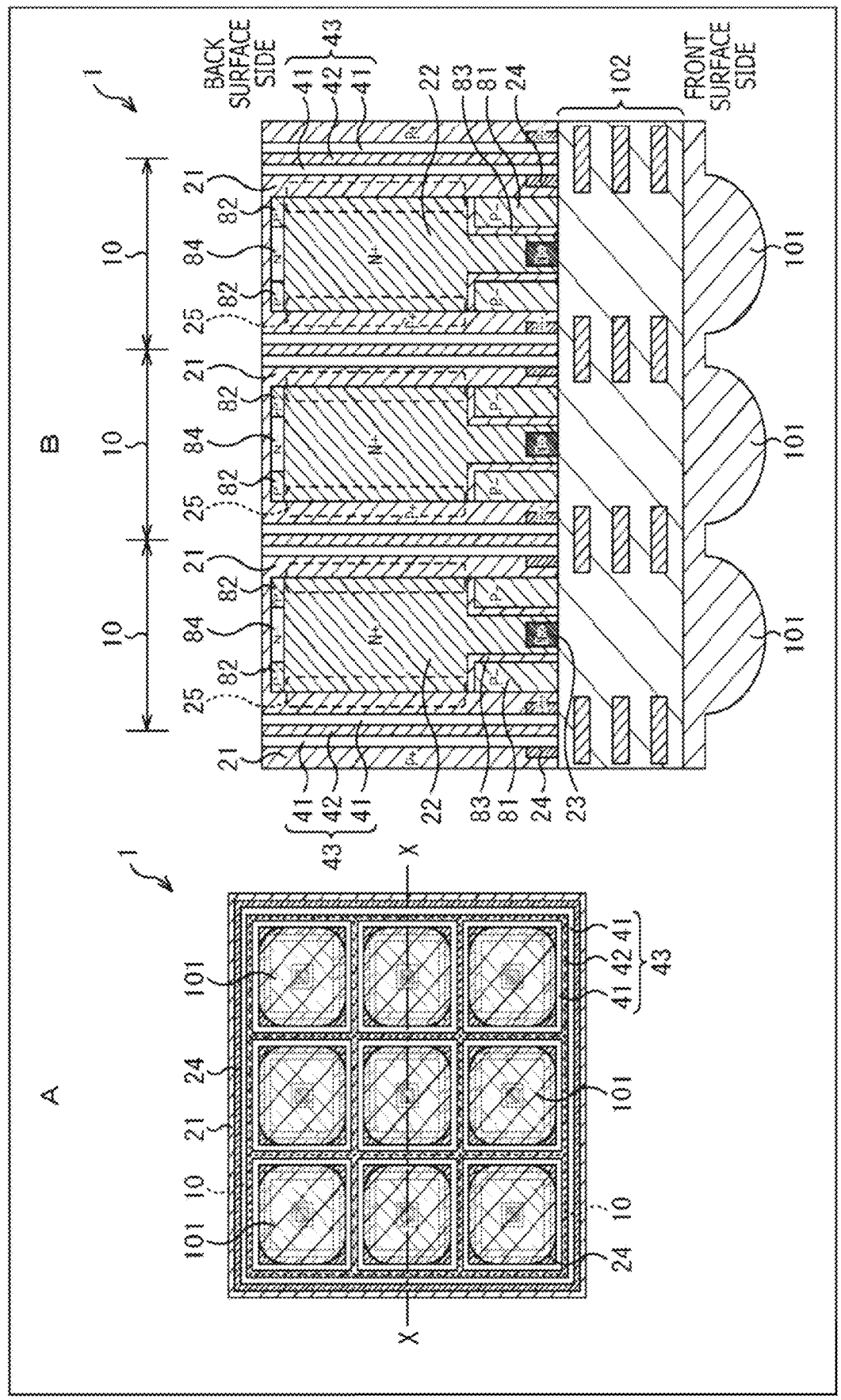
FIG. 31 is a diagram depicting an example of configuration of a twelfth embodiment of the photodiode array as a light detecting element to which the present technology is applied.

FIG. 31 depicts an example of configuration of a twelfth embodiment of the photodiode array as a light detecting element to which the present technology is applied.

A of FIG. 31 is a plan view of the front surface side of a semiconductor substrate of a photodiode array 1. B of FIG. 31 is a sectional view taken along a line X-X of A of FIG. 31.

the twelfth embodiment of FIG. 31, OCLs 101 are formed in units of one pixel on the front surface side of the semiconductor substrate on which a wiring layer 102 is formed. Consequently, the photodiode array 1 of FIG. 31 is an example of a front surface irradiation type in which a light incidence surface is the front surface of the semiconductor substrate. Incidentally, the plan view of A of FIG. 31 does not depict the wiring layer 102.

When the OCLs 101 are thus formed on the light incidence surface side, incident light can be efficiently captured into the high field regions 25, so that sensitivity can be improved.

Figure 32:
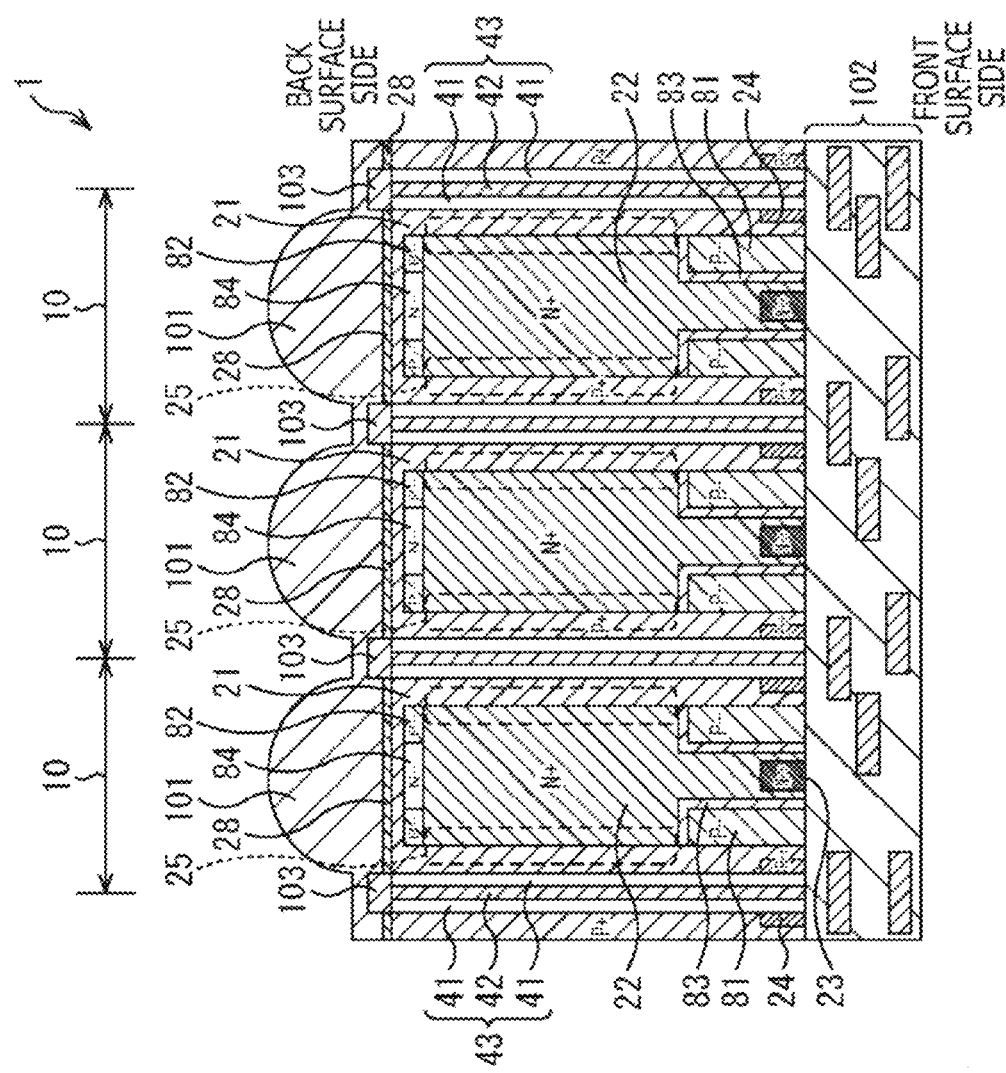
FIG. 32 is a sectional view in the case of the back surface irradiation type in the twelfth embodiment.

FIG. 32 depicts an example of configuration of a photodiode array 1 according to the twelfth embodiment in the case of the back surface irradiation type.

In the case where a light incidence surface is the back surface of the semiconductor substrate in the twelfth embodiment, OCLs 101 are formed in units of one pixel on the upper surface of the fixed charge film 28 on the back surface. An inter-pixel light shielding film 103 for which a metallic material such as tungsten (W), aluminum (Al), copper (Cu), or the like is used is also disposed at pixel boundaries on the back surface of the semiconductor substrate.

In the case of the back surface irradiation type in which the light incidence surface is the back surface of the semiconductor substrate, there is no wiring layer 102 on an optical path. It is therefore possible to suppress vignetting of light by the wiring layer 102, and thus further improve sensitivity.

13. Thirteenth Embodiment

Figure 33:
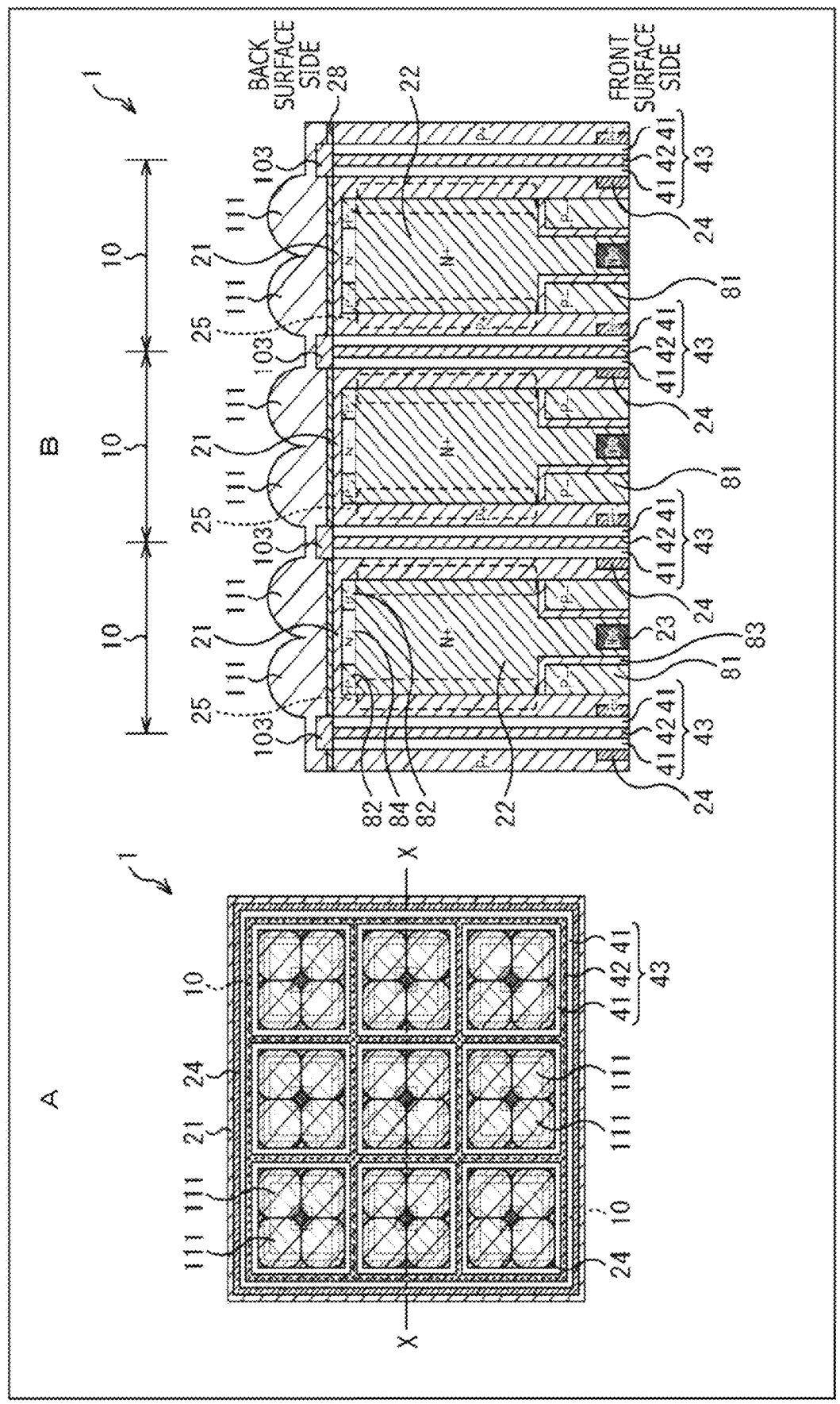
FIG. 33 is a diagram depicting an example of configuration of a thirteenth embodiment of the photodiode array as a light detecting element to which the present technology is applied.

FIG. 33 depicts an example of configuration of a thirteenth embodiment of the photodiode array as a light detecting element to which the present technology is applied.

A of FIG. 33 is a diagram obtained by superimposing OCLs on a plan view of the front surface side of a semiconductor substrate of a photodiode array 1. B of FIG. 33 is a sectional view taken along a line X-X of A of FIG. 33.

The thirteenth embodiment of FIG. 33 is an example of the back surface irradiation type in which the light incidence surface is the back surface of the semiconductor substrate. The thirteenth embodiment of FIG. 33 has a different OCL configuration from that of the twelfth embodiment of the back surface irradiation type depicted in FIG. 32.

Specifically, whereas one OCL 101 is formed for one pixel in the twelfth embodiment of FIG. 32, four 2×2 (two rows and two columns) OCLs 111 are formed for one pixel in the thirteenth embodiment of FIG. 33.

When a plurality of OCLs 111 are thus formed for one pixel, incident light can be collected into the high field regions 25 formed in the vicinities of pixel boundaries. That is, the incident light can be efficiently captured into the high field regions 25, and therefore sensitivity can be improved.

Incidentally, while FIG. 33 represents an example in which four OCLs 111 are arranged for one pixel, the number and arrangement of OCLs 111 arranged for one pixel are not limited to this, but are arbitrary.

14. Fourteenth Embodiment

Figure 34:
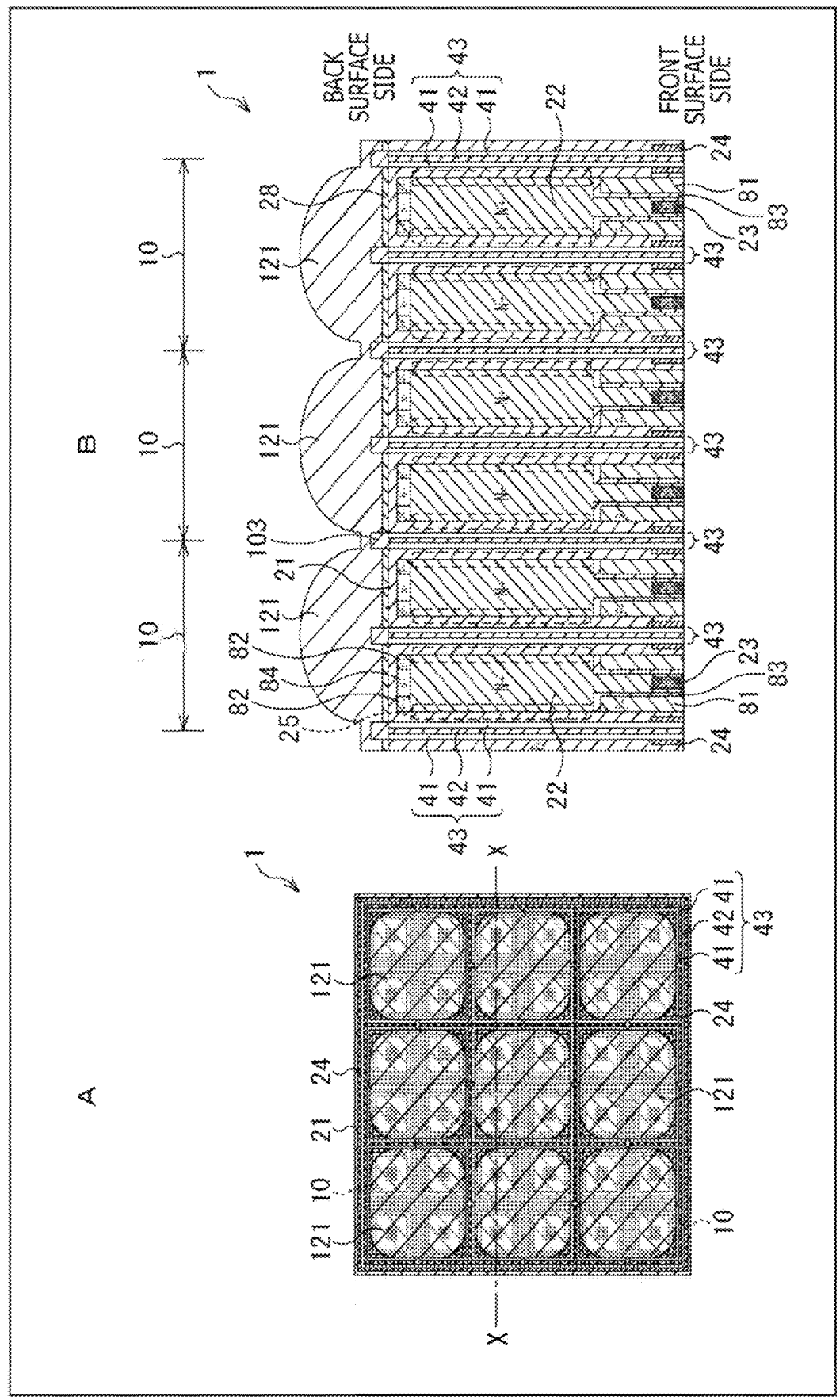
FIG. 34 is a diagram depicting an example of configuration of a fourteenth embodiment of the photodiode array as a light detecting element to which the present technology is applied.

FIG. 34 depicts an example of configuration of a fourteenth embodiment of the photodiode array as a light detecting element to which the present technology is applied.

A of FIG. 34 is a diagram obtained by superimposing OCLs on a plan view of the front surface side of a semiconductor substrate of a photodiode array 1. B of FIG. is a sectional view taken along a line X-X of A of FIG. 34.

The fourteenth embodiment of FIG. 34 is an example of the back surface irradiation type in which the light incidence surface is the back surface of the semiconductor substrate. The fourteenth embodiment of FIG. 34 has a different OCL configuration from that of the twelfth embodiment of the back surface irradiation type depicted in FIG. 32.

Specifically, whereas one OCL 101 is formed for one pixel in the twelfth embodiment of FIG. 32, one OCL 121 is formed for four 2×2 pixels in the fourteenth embodiment of FIG. 34.

When one OCL 121 is thus formed for a plurality of pixels, the area of high field regions 25 can be increased, and therefore light usage efficiency can be improved.

Figure 35:
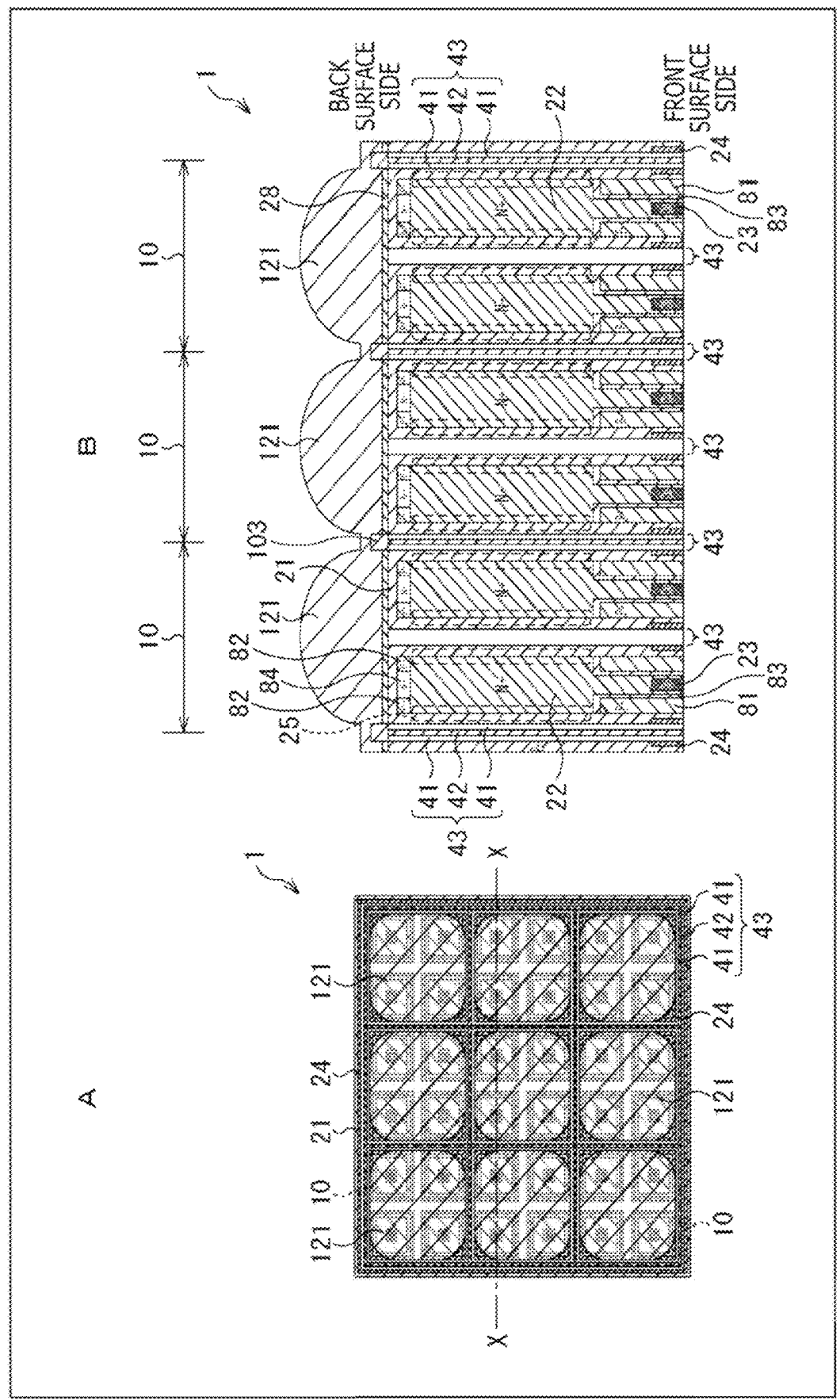
FIG. 35 is a diagram depicting another configuration example according to the fourteenth embodiment.

Incidentally, in the case where the photodiode array 1 is configured such that one OCL 121 is formed for a plurality of pixels, it is preferable not to bury a metallic film 42 in a separating portion 43 below one OCL 121, as depicted in FIG. 35. FIG. 34 and FIG. 35 are different from each other only in terms of whether a separating portion 43 below one OCL 121 has a metallic film 42 or not. In the case of the arrangement in which one OCL 121 is formed for four 2×2 pixels, as depicted in A of FIG. 34, a metallic film 42 is buried in the separating portion 43 of a 2×2 rectangle which separating portion surrounds the periphery of the OCL 121, whereas the metallic film 42 is omitted in the separating portion 43 on the inside of the 2×2 rectangle which separating portion is below the OCL 121. It is thereby possible to suppress vignetting of light condensed by the OCL 121.

FIG. 34 and FIG. 35 are examples in which one OCL 121 is disposed for four 2×2 pixels. However, the number and arrangement of pixels 10 for which one OCL 121 is disposed are not limited to this, but are arbitrary.

Figure 36:
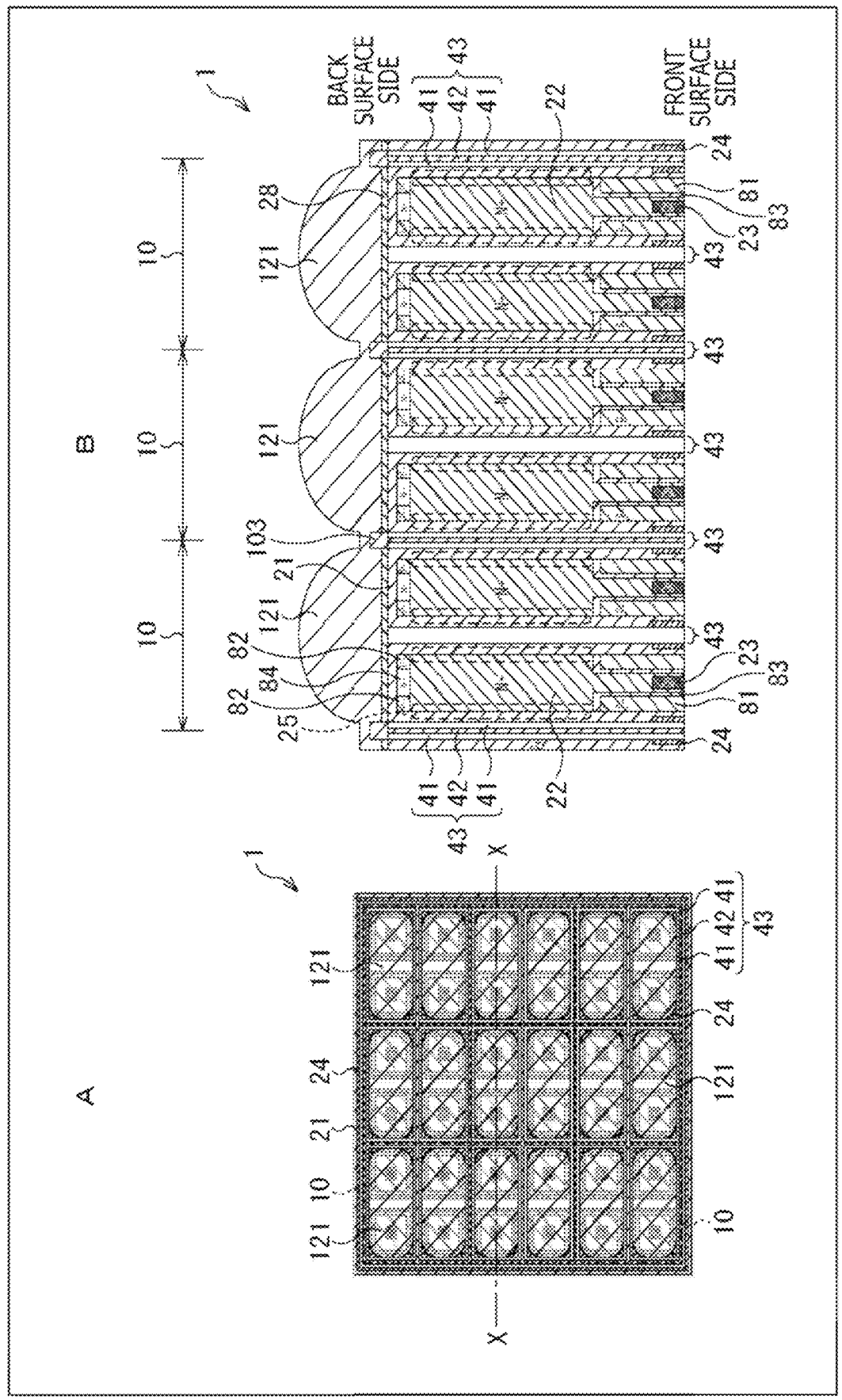
FIG. 36 is a diagram depicting another configuration example according to the fourteenth embodiment.

For example, FIG. 36 depicts an example in which one OCL 121 is disposed for two 1×2 (one row and two columns) pixels. In this case, the planar shape of one OCL 121 is substantially rectangular.

Also in FIG. 36, a metallic film 42 is buried in the separating portion 43 of a rectangle of 1×2 pixels which separating portion surrounds the periphery of one OCL 121, whereas the metallic film 42 is omitted in the separating portion 43 on the inside of the rectangle of the 1×2 pixels which separating portion is below the OCL 121. It is thereby possible to suppress vignetting of light condensed by the OCL 121.

Also, the planar shape of pixels 10 in cases where one OCL 121 is disposed for a plurality of pixels may be a shape other than a square shape, for example, a rectangular shape or a circular shape.

Figure 37:
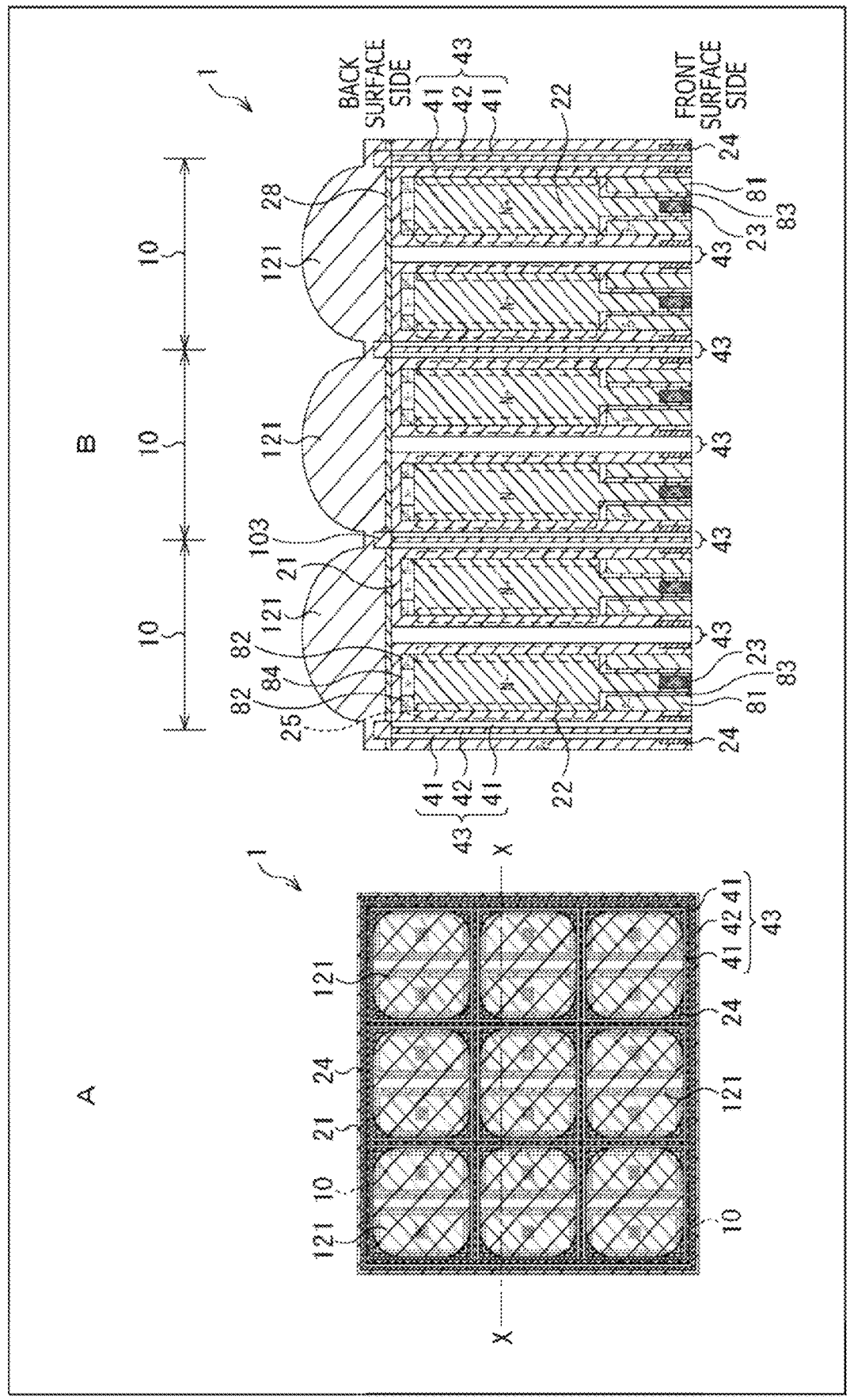
FIG. 37 is a diagram depicting another configuration example according to the fourteenth embodiment.

FIG. 37 illustrates an example in which the planar shape of pixels 10 is a rectangular shape, and one OCL 121 is disposed for two rectangular pixels 10. In this case, the planar shape of one OCL 121 is substantially a square shape.

Also in FIG. 37, a metallic film 42 is buried in the separating portion 43 of a rectangle of 1×2 pixels which separating portion surrounds the periphery of one OCL 121, whereas the metallic film 42 is omitted in the separating portion 43 on the inside of the rectangle of the 1×2 pixels which separating portion is below the OCL 121. It is thereby possible to suppress vignetting of light condensed by the OCL 121.

15. Fifteenth Embodiment

Figure 38:
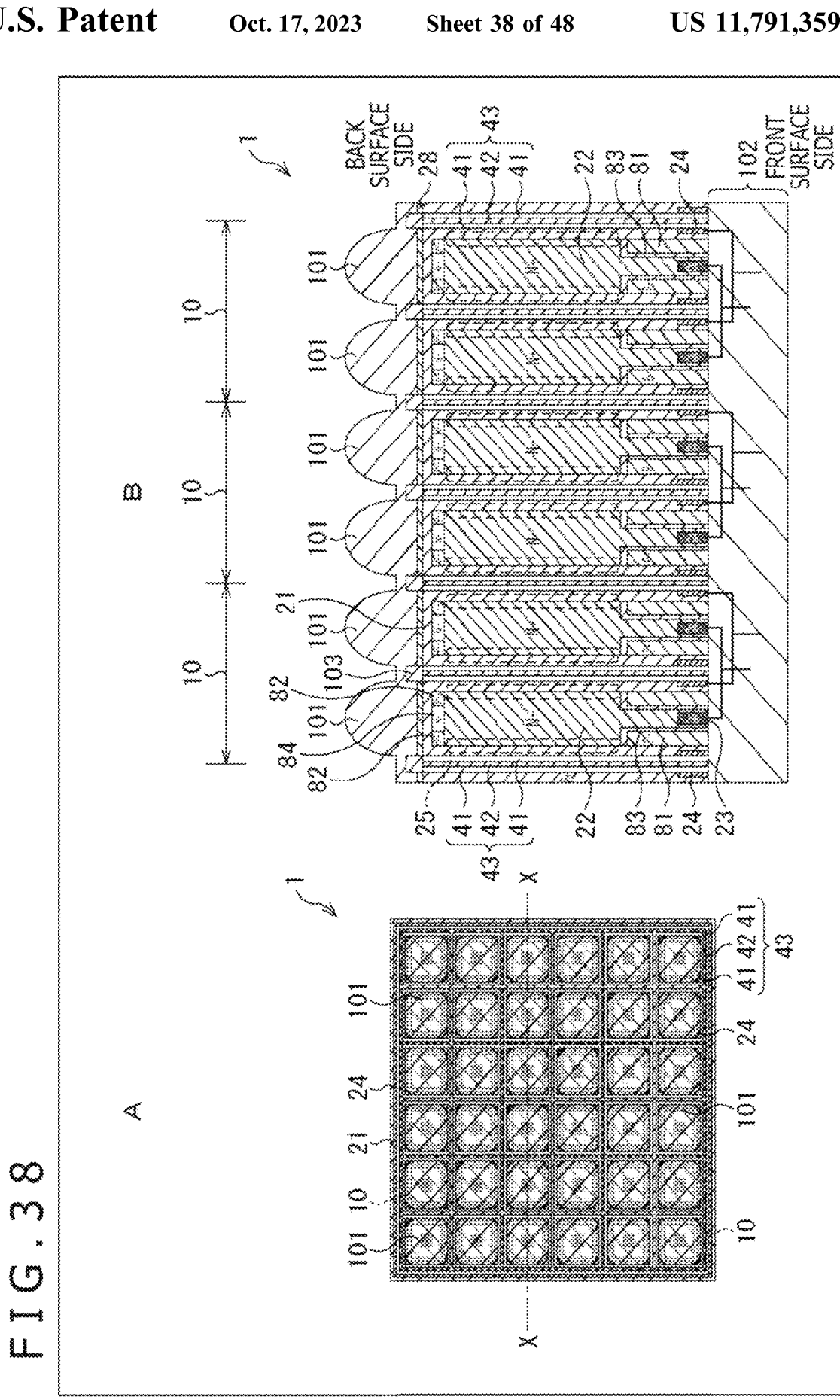
FIG. 38 is a diagram depicting an example of configuration of a fifteenth embodiment of the photodiode array as a light detecting element to which the present technology is applied.

FIG. 38 depicts an example of configuration of a fifteenth embodiment of the photodiode array as a light detecting element to which the present technology is applied.

A of FIG. 38 is a diagram obtained by superimposing OCLs on a plan view of the front surface side of a semiconductor substrate of a photodiode array 1. B of FIG. 38 is a sectional view taken along a line X-X of A of FIG. 38.

The fourteenth embodiment of FIG. 38 is different from the twelfth embodiment of FIG. 32 as the photodiode array 1 of the back surface irradiation type in which one OCL 101 is formed for each pixel in terms of a configuration within the wiring layer 102 formed on the front surface side of the semiconductor substrate.

Specifically, in the wiring layer 102 of FIG. 38, cathode contacts 23 are connected to each other and anode contacts 24 are connected to each other in units of four 2×2 pixels so that optical signals resulting from photoelectric conversion in the four 2×2 pixels are output as a signal of one pixel.

When the plurality of adjacent pixels thus output one signal, higher sensitivity can be achieved.

16. Sixteenth Embodiment

Figure 39:
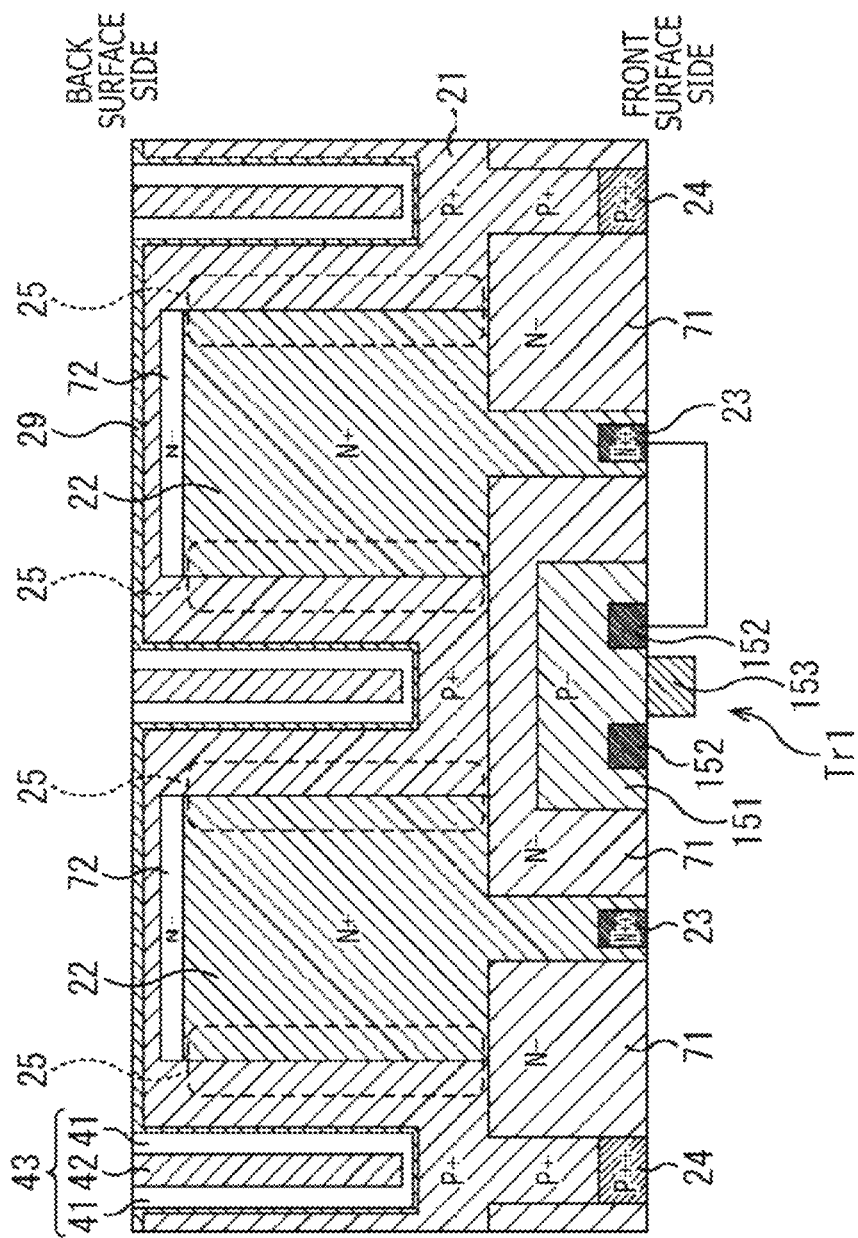
FIG. 39 is a diagram depicting an example of configuration of a sixteenth embodiment of the photodiode array as a light detecting element to which the present technology is applied.

FIG. 39 depicts an example of configuration of a sixteenth embodiment of the photodiode array as a light detecting element to which the present technology is applied.

The sixteenth embodiment depicted in FIG. 39 is a configuration formed by adding a readout circuit region to the front surface side of the semiconductor substrate in a configuration according to the eighth embodiment which configuration is depicted in FIG. 17.

Specifically, in the sixteenth embodiment of FIG. 39, an N− type fourth semiconductor layer 71 in the eighth embodiment depicted in FIG. 17 is expanded, and a well 151 of an opposite conductivity type (P type) from the N− type fourth semiconductor layer 71 and of low impurity concentration (which well will hereinafter be referred to as a P− type well 151) is formed within the N− type fourth semiconductor layer 71. A transistor Tr1 constituted of two source/drain regions 152 and a gate electrode 153 is formed in the P− type well 151. One of the two source/drain regions 152 is connected to a cathode contact 23 on a right side in the figure. A cathode contact 23 on a left side in the figure is connected to a transistor Tr1 of a P− type well 151 not depicted in the figure.

Thus vertically stacking the readout circuit region constituted of a plurality of transistors and high field regions 25 in a substrate depth direction can improve area usage efficiency and reduce pixel size as compared with a configuration in which the readout circuit region and the high field regions 25 are arranged in the planar direction.

The readout circuit region may be shared by a plurality of pixels.

Figure 40:
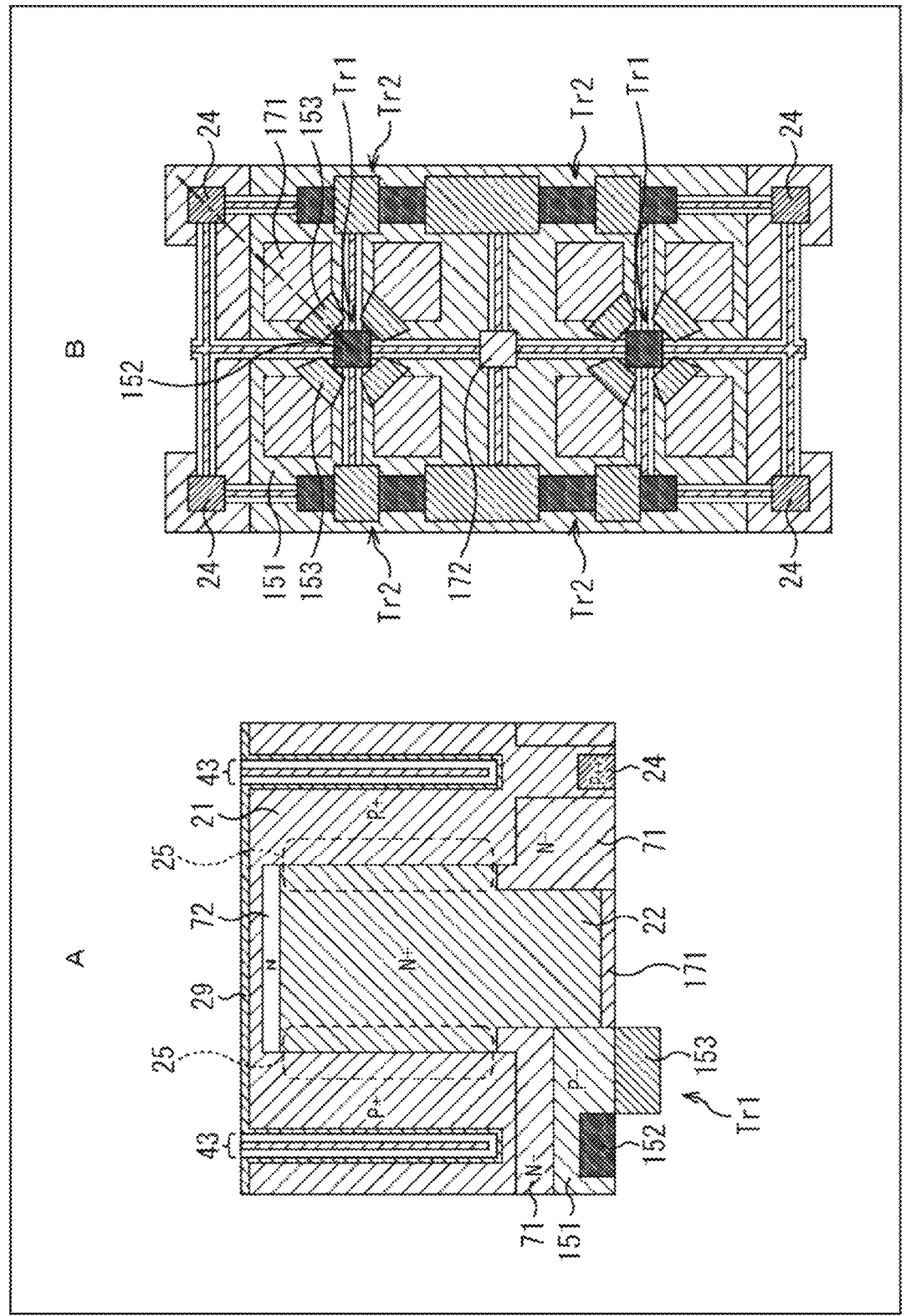
FIG. 40 is a diagram depicting a configuration example in a case where a reading circuit region is shared by a plurality of pixels.

FIG. 40 depicts a configuration example in a case where the readout circuit region is shared by a plurality of pixels.

A of FIG. 40 is a sectional view of a semiconductor substrate of a photodiode array 1 in a case where a readout circuit region is shared by a plurality of pixels. B of FIG. 40 is a plan view of the photodiode array 1 in the case where the readout circuit region is shared by the plurality of pixels. The sectional view of A of FIG. 40 corresponds to a part indicated by alternate long and short dashed lines in B of FIG. 40.

As depicted in A of FIG. 40, one of the two source/drain regions 152 of the transistor Tr1 in FIG. 39 is replaced with an N+ type second semiconductor layer 22, and a pinning layer 171 for suppressing dark current is formed on the upper surface of the N+ type second semiconductor layer 22. The pinning layer 171 is formed by a semiconductor layer of the P type as a conductivity type opposite from that of the N+ type second semiconductor layer 22. Switching is performed between signal accumulation and readout for the N+ type second semiconductor layer 22 by controlling a voltage supplied to the gate electrode 153 of the transistor Tr1.

As depicted in B of FIG. 40, the transistor Tr1 is disposed in a central portion of four 2×2 (two rows and two columns) pixels, and is shared by the four pixels. Also, anode contacts 24 are arranged at four corners of eight 4×2 (four rows and two columns) pixels, and a contact 172 that controls the voltage of a P− type well 151 is disposed in a central portion of the eight 4×2 pixels. A predetermined voltage such as zero V or the like, for example, is supplied to the contact 172. A plurality of control transistors Tr2 other than the transistor Tr1 for signal readout are arranged in the outer peripheral portion of the eight 4×2 pixels.

17. First Manufacturing Method

Figure 41:
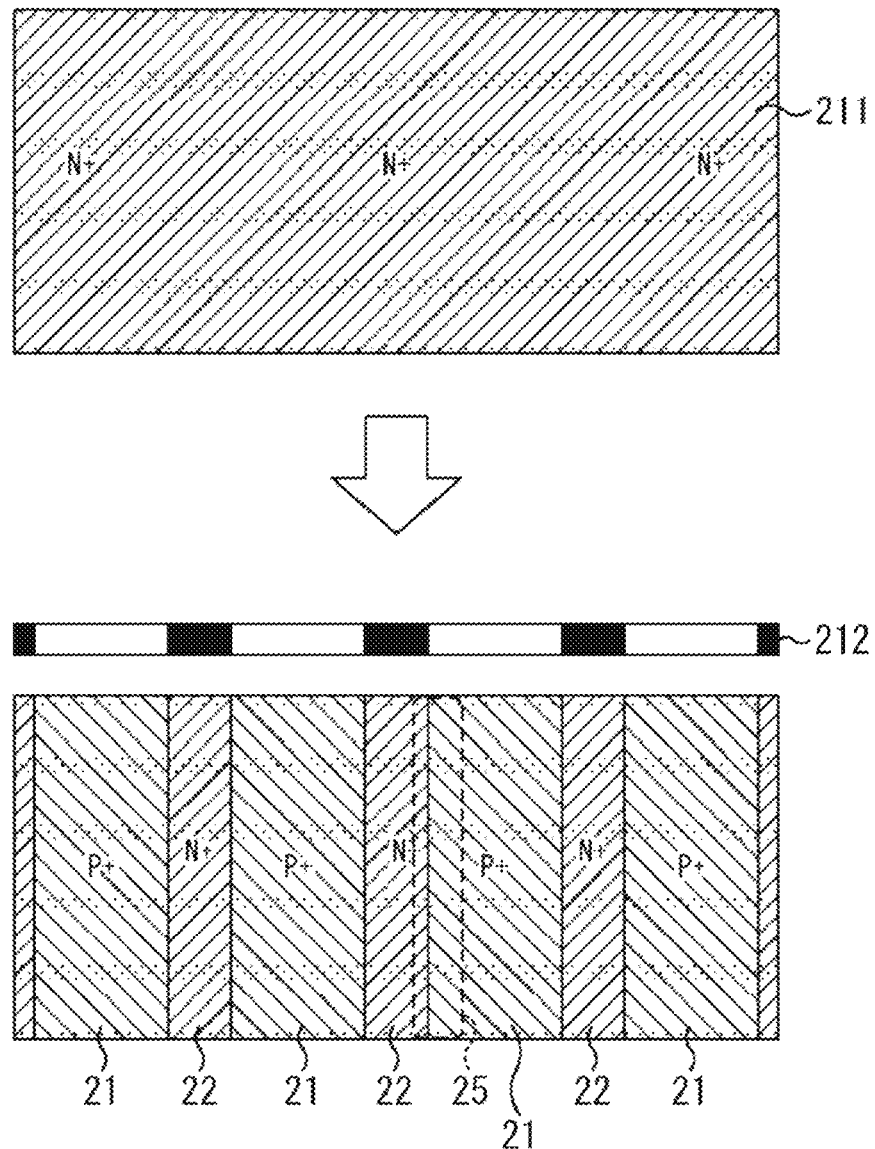
FIG. 41 is a diagram of assistance in explaining a first manufacturing method.

Next, referring to FIG. 41, description will include a first manufacturing method of forming P+ type first semiconductor layers 21 and N+ type second semiconductor layers 22 in the semiconductor substrate of a photodiode array 1. The first manufacturing method can be applied to the first embodiment depicted in FIG. 1 and FIG. 2, for example.

First, a well 211 of an N+ type (which well will hereinafter be referred to as an N+ type well 211) is formed by performing ion implantation of an N type impurity such as phosphorus (P) or the like in the depth direction of the semiconductor substrate a plurality of times.

Next, P+ type first semiconductor layers 21 are formed by performing ion implantation of a P type impurity such as boron (B) or the like a plurality of times in the depth direction of the semiconductor substrate by using a mask 212 patterned according to regions for forming the P+ type first semiconductor layers 21. The regions in which the P+ type first semiconductor layers 21 are formed correspond to outer peripheral portions at the boundaries of pixels 10 and in the vicinities thereof, as in the plan view of A of FIG. 1, for example. Regions of the N+ type well 211 other than the formed P+ type first semiconductor layers 21 become N+ type second semiconductor layers 22. Consequently, high field regions 25 can be formed in the depth direction of the semiconductor substrate.

In the method of forming the N+ type well 211 and the P+ type first semiconductor layers 21 by performing ion implantation a plurality of times in the depth direction of the semiconductor substrate, concentration differences occur in the depth direction in the respective regions of the N+ type well 211 and the P+ type first semiconductor layers 21, as indicated by shading in FIG. 41. The impurity concentration of the N+ type well 211 is preferably controlled to be, for example, approximately 1015 to 1017/cm3. Also, the impurity concentration of the P+ type first semiconductor layers 21 is preferably a higher concentration than the impurity concentration of the N+ type well 211.

Subsequently, a P+ type first semiconductor layer 21 is formed in an entire region of a back surface side interface by performing ion implantation of the P type impurity in the entire region of the back surface side interface. Incidentally, the ion implantation of the P type impurity may be performed only in the regions of the N+ type second semiconductor layers 22 by using a mask rather than in the entire region of the back surface side interface. Alternatively, as depicted in FIG. 2, in the case where a fixed charge film 28 for suppressing dark current is formed at the back surface side interface, positive holes are accumulated in the fixed charge film 28, and therefore the fixed charge film 28 may be additionally formed without the P+ type first semiconductor layer 21 being formed in the entire region of the back surface side interface.

Next, cathode contacts 23 and anode contacts 24 are formed at the front surface side interface of the semiconductor substrate.

The P+ type first semiconductor layers 21 and the N+ type second semiconductor layers 22 can be formed as described above.

18. Second Manufacturing Method

Figure 42:
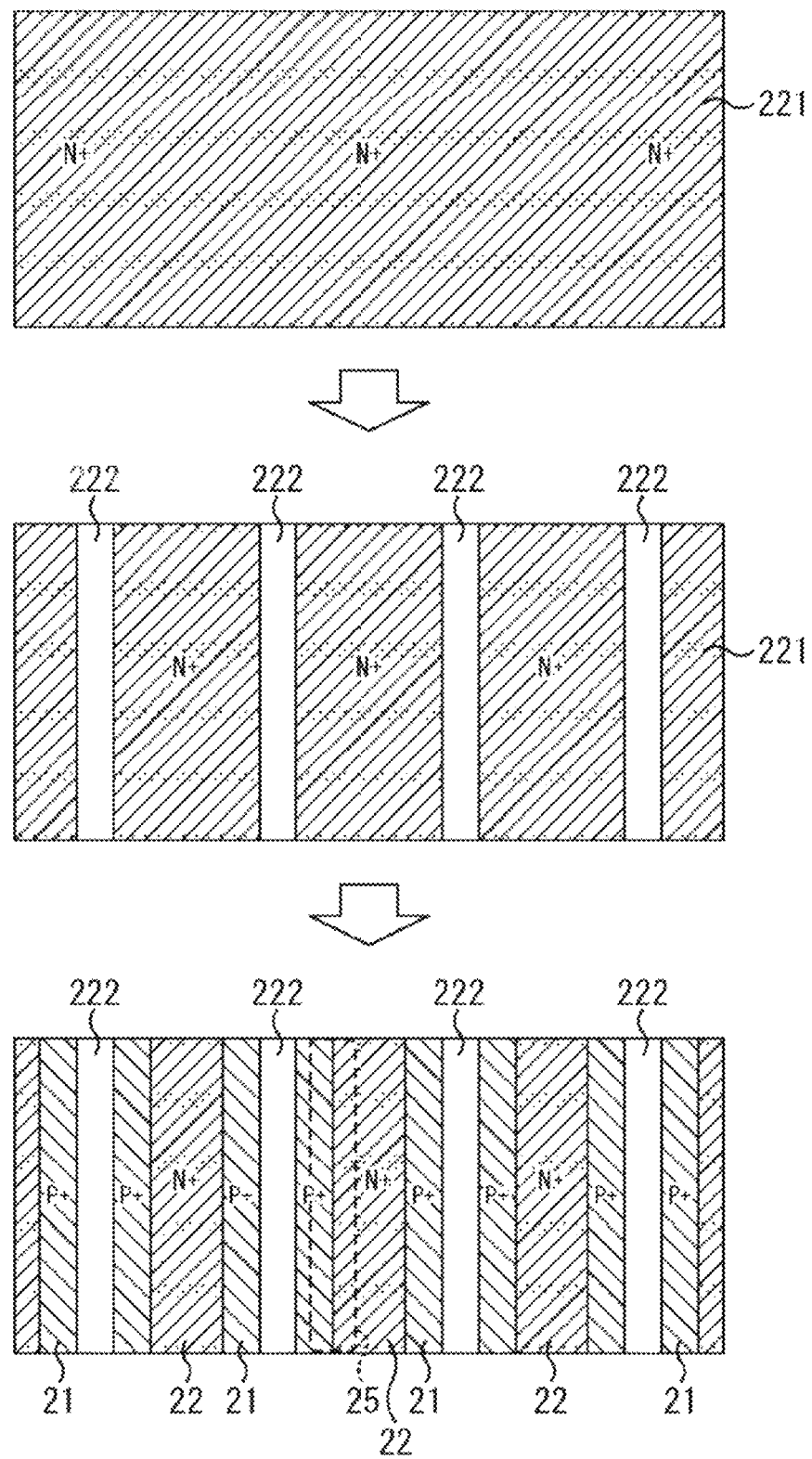
FIG. 42 is a diagram of assistance in explaining a second manufacturing method.

Next, referring to FIG. 42, description will be made of a second manufacturing method of forming P+ type first semiconductor layers 21 and N+ type second semiconductor layers 22 in the semiconductor substrate of a photodiode array 1. The second manufacturing method is applicable to a case where separating portions 43 are provided at the boundaries of pixels 10 as in the second embodiment of FIG. 3.

First, a well 221 of an N+ type (which well will hereinafter be referred to as an N+ type well 221) is formed by performing ion implantation of an N type impurity such as phosphorus (P) or the like a plurality of times in the depth direction of the semiconductor substrate.

Next, oxide films 222 including P type ions are buried in the substrate depth direction in regions corresponding to outer peripheral portions at the boundaries of pixels 10 and in the vicinities thereof within the N+ type well 221, and P+ type first semiconductor layers 21 are formed by thermal diffusion. Regions of the N+ type well 221 other than the formed P+ type first semiconductor layers 21 become N+ type second semiconductor layers 22. Consequently, high field regions 25 can be formed in the depth direction of the semiconductor substrate.

The impurity concentration of the N+ type well 221 is preferably controlled to be, for example, approximately 1015 to 1017/cm3. Also, the impurity concentration of the P+ type first semiconductor layers 21 is preferably a higher concentration than the impurity concentration of the N+ type well 221. The P+ type first semiconductor layers 21 formed by thermal diffusion may have concentration differences occurring therein in the horizontal direction orthogonal to the substrate depth direction within a range where carrier movement is not affected.

Subsequent processes are similar to those of the first manufacturing method described with reference to FIG. 41.

Specifically, a P type impurity is ion-implanted in the entire region of a back surface side interface or only in the regions of the N+ type second semiconductor layers 22, and thereby a P+ type first semiconductor layer 21 is formed in the entire region of the back surface side interface. Alternatively, the process of forming the P+ type first semiconductor layer 21 in the entire region of the back surface side interface is omitted, and a fixed charge film 28 is formed at a back surface interface. In addition, cathode contacts 23 and anode contacts 24 are formed at the front surface side interface of the semiconductor substrate.

The oxide films 222 are left as they are as insulating films 41 constituting the separating portions 43. Furthermore, in a case where metallic films 42 are provided on the insides of the insulating films 41 as the separating portions 43, a part of the oxide films 222 as the insulating films 41 are opened, and a metallic material is buried therein.

19. Third Manufacturing Method

Figure 43:
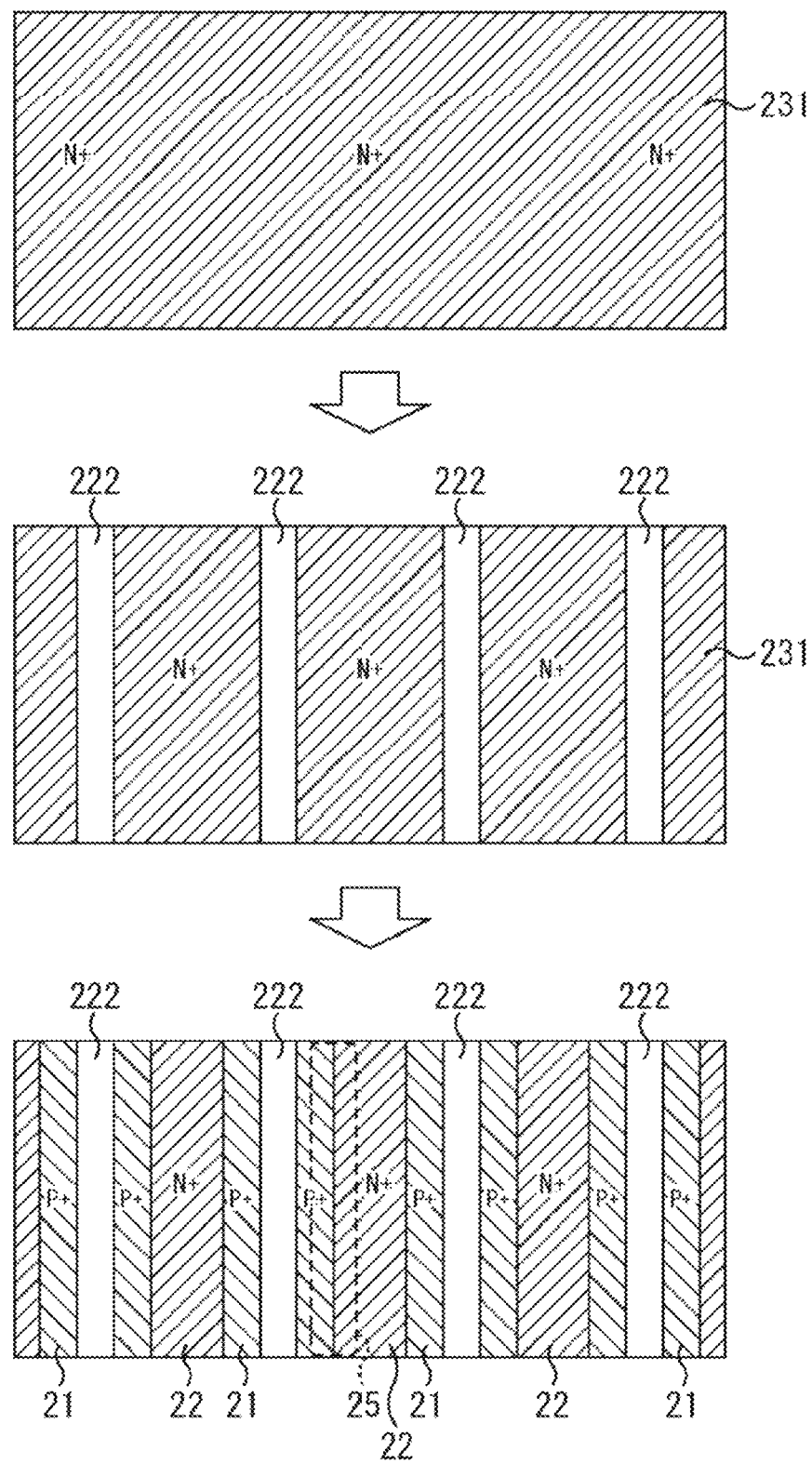
FIG. 43 is a diagram of assistance in explaining a third manufacturing method.

Next, referring to FIG. 43, description will be made of a third manufacturing method of forming P+ type first semiconductor layers 21 and N+ type second semiconductor layers 22 in the semiconductor substrate of photodiode array 1. The third manufacturing method is also a manufacturing method in a case where separating portions 43 are provided at the boundaries of pixels 10.

In the second manufacturing method described with reference to FIG. 42, an N+ type well 221 is first formed by performing ion implantation of an N type impurity such as phosphorus (P) or the like a plurality of times in the depth direction of the semiconductor substrate. The third manufacturing method uses an N type (N+) semiconductor substrate 231 of high concentration instead of forming the N+ type well 221 in the semiconductor substrate. The method is otherwise similar to the second manufacturing method described with reference to FIG. 41.

The impurity concentration of the N+ type semiconductor substrate 231 is preferably controlled to be, for example, approximately 1015 to 1017/cm3. The impurity concentration of the P+ type first semiconductor layers 21 is preferably a higher concentration than the impurity concentration of the N+ type semiconductor substrate 231. The P+ type first semiconductor layers 21 formed by thermal diffusion have concentration differences occurring therein in the horizontal direction orthogonal to the substrate depth direction within a range where carrier movement is not affected.

Subsequent processes are similar to those of the first manufacturing method described with reference to FIG. 41.

20. Fourth Manufacturing Method

Figure 44:
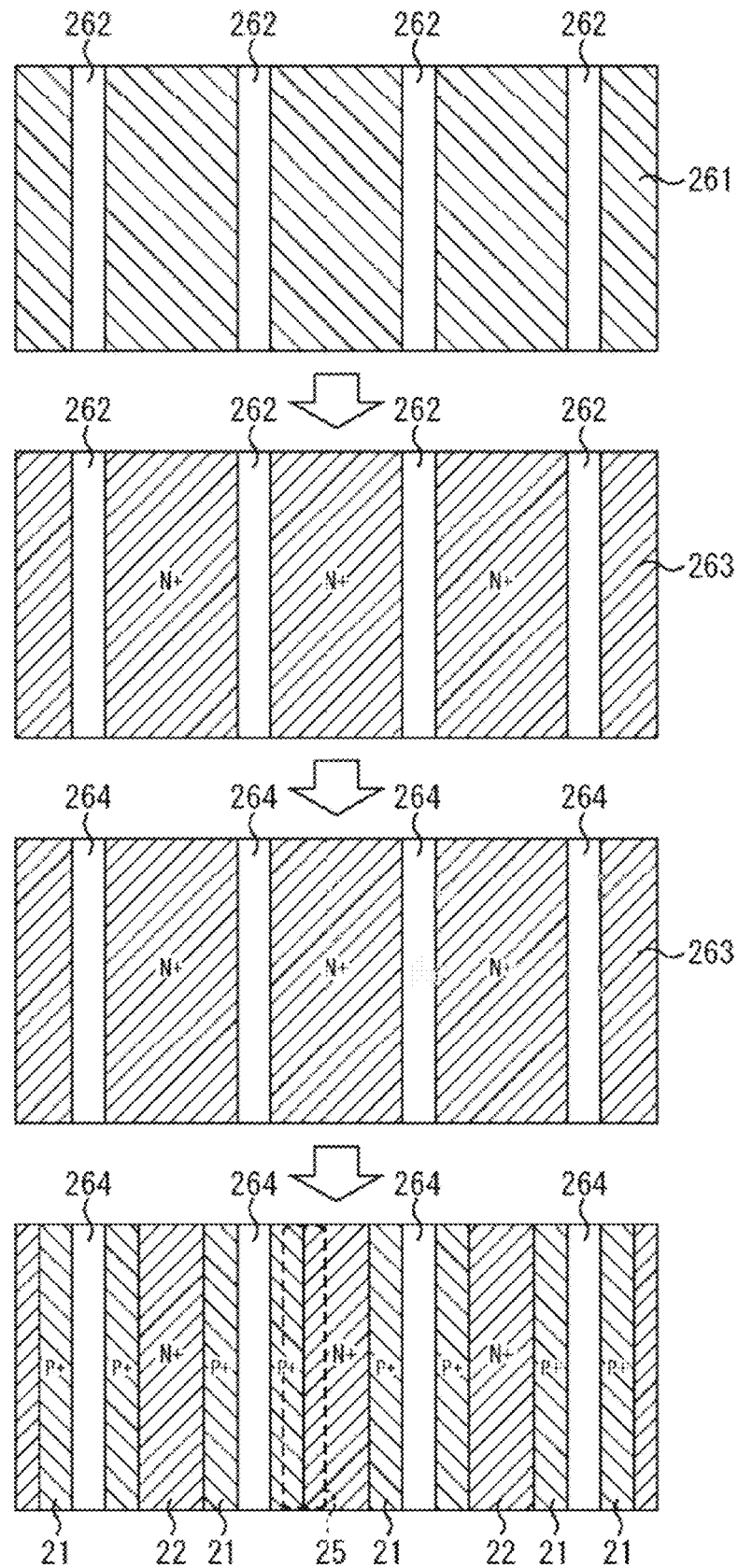
FIG. 44 is a diagram of assistance in explaining a fourth manufacturing method.

Next, referring to FIG. 44, description will be made of a fourth manufacturing method of forming P+ type first semiconductor layers 21 and N+ type second semiconductor layers 22 in the semiconductor substrate of a photodiode array 1. The fourth manufacturing method is also a manufacturing method in a case where separating portions 43 are provided at the boundaries of pixels 10.

First, first oxide films 262 including N type ions are buried in a substrate depth direction in regions corresponding to outer peripheral portions at the boundaries of pixels 10 and in the vicinities thereof in a semiconductor substrate 261, and N+ type semiconductor layers 263 are formed by thermal diffusion.

Next, the formed first oxide films 262 including the N type ions are removed. Second oxide films 264 including P type ions are buried in the parts from which the first oxide films 262 are removed, and P+ type semiconductor layers 21 are formed by thermal diffusion. The regions of the N+ type semiconductor layers 263 other than the formed P+ type first semiconductor layers 21 become N+ type second semiconductor layers 22. Consequently, high field regions 25 can be formed in the depth direction of the semiconductor substrate.

The impurity concentration of the N+ type second semiconductor layers 22 is preferably controlled to be, for example, approximately 1015 to 1017/cm3. The impurity concentration of the P+ type first semiconductor layers 21 is preferably a higher concentration than the impurity concentration of the N+ type second semiconductor layers 22. The P+ type first semiconductor layers 21 and the N+ type second semiconductor layers 22 formed by thermal diffusion may have concentration differences occurring therein in the horizontal direction orthogonal to the substrate depth direction within a range where carrier movement is not affected.

Subsequent processes are similar to those of the first manufacturing method described with reference to FIG. 41.

21. Fifth Manufacturing Method

Figure 45:
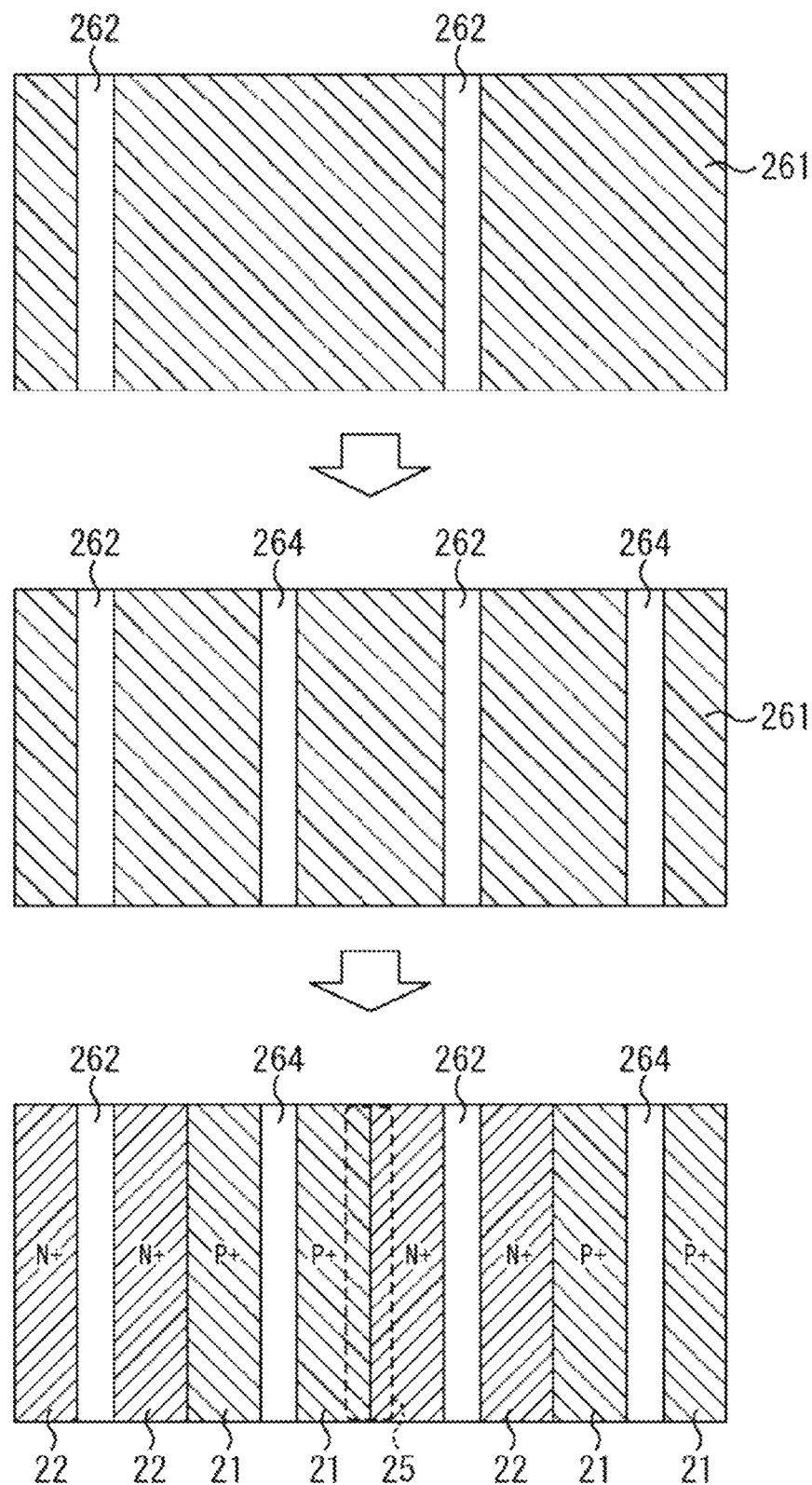
FIG. 45 is a diagram of assistance in explaining a fifth manufacturing method.

Next, referring to FIG. 45, description will be made of a fifth manufacturing method of forming P+ type first semiconductor layers 21 and N+ type second semiconductor layers 22 in the semiconductor substrate of a photodiode array 1. The fifth manufacturing method is also a manufacturing method in a case where separating portions 43 are provided at the boundaries of pixels 10.

First, first oxide films 262 including N type ions are buried in a substrate depth direction in regions corresponding to outer peripheral portions at boundaries of pixels 10 and in the vicinities thereof in a semiconductor substrate 261.

Next, second oxide films 264 including P type ions are buried in the substrate depth direction in regions corresponding to outer peripheral portions at boundaries of pixels 10 and in the vicinities thereof in the semiconductor substrate 261. The regions in which the second oxide films 264 including the P type ions are buried are regions different from the regions in which the first oxide films 262 including the N type ions are buried. The regions in which the first oxide films 262 including the N type ions are buried and the regions in which the second oxide films 264 including the P type ions are buried respectively correspond to the regions of insulating films 41 of the separating portions 43.

Next, P+ type semiconductor layers 21 and N+ type second semiconductor layers 22 are formed by performing thermal diffusion. Consequently, high field regions 25 can be formed in the depth direction of the semiconductor substrate.

The impurity concentration of the N+ type second semiconductor layers 22 is preferably controlled to be, for example, approximately 1015 to 1017/cm3. The impurity concentration of the P+ type first semiconductor layers 21 is preferably a higher concentration than the impurity concentration of the N+ type second semiconductor layers 22. The P+ type first semiconductor layers 21 and the N+ type second semiconductor layers 22 formed by thermal diffusion may have concentration differences occurring therein in the horizontal direction orthogonal to the substrate depth direction within a range where carrier movement is not affected.

Subsequent processes are similar to those of the first manufacturing method described with reference to FIG. 41.

22. Sixth Manufacturing Method

Next, referring to FIG. 46, description will be made of a sixth manufacturing method of forming P+ type first semiconductor layers 21 and N+ type second semiconductor layers 22 in the semiconductor substrate of a photodiode array 1. The sixth manufacturing method is a manufacturing method in a case where taper-shaped separating portions 43 are formed by digging from the front surface side of the substrate as in the fourth embodiment depicted in FIG. 9.

Figure 46:
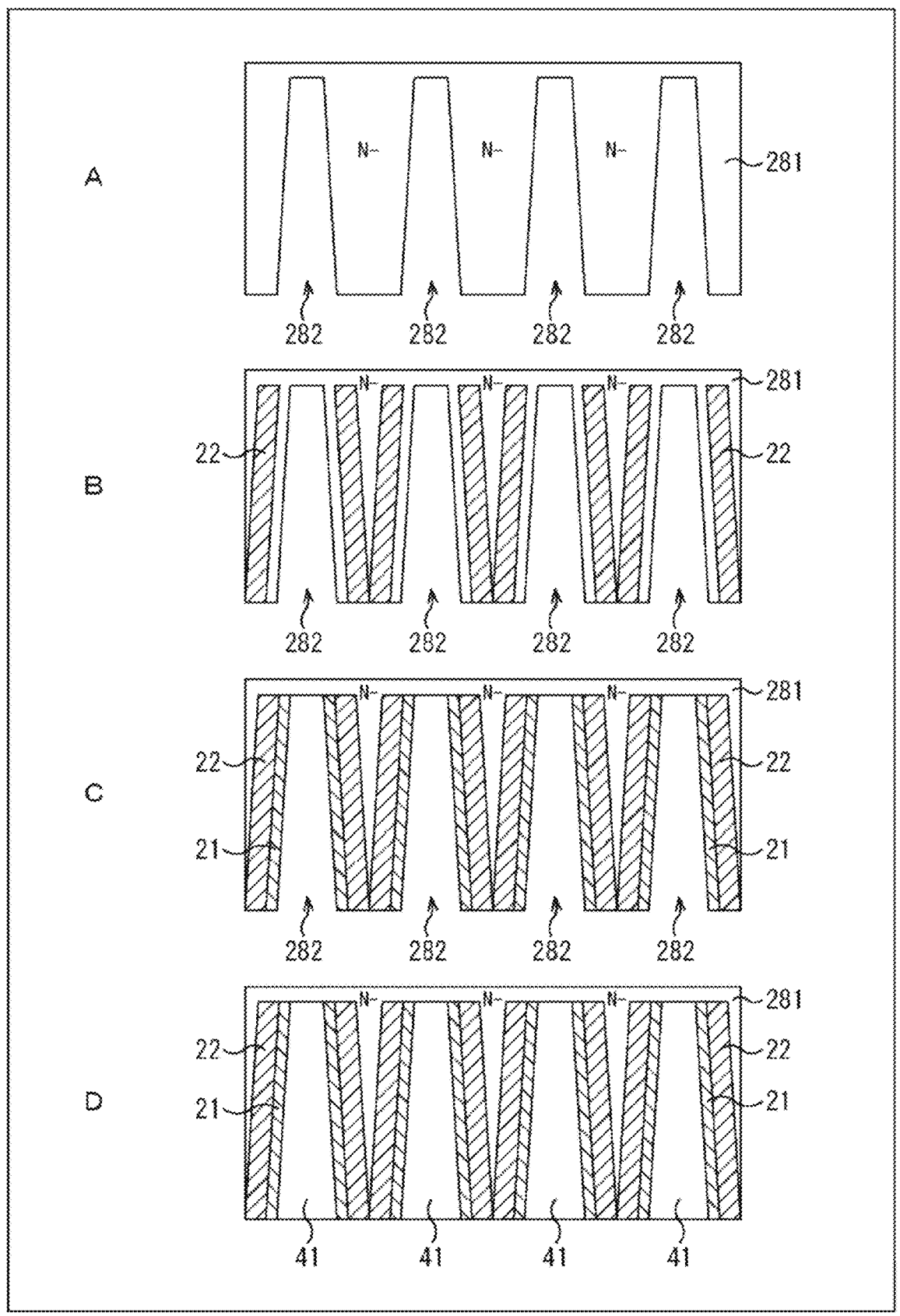
FIG. 46 is a diagram of assistance in explaining a sixth manufacturing method.

First, as depicted in A of FIG. 46, trenches 282 are formed by digging to a predetermined depth from the front surface side of a low-concentration N type (N−) semiconductor substrate 281. The trenches 282 are fabricated in a tapered shape having a wide opening area on a front surface side and a narrow opening area on a back surface side as a bottom portion.

Next, as depicted in B of FIG. 46, N+ type second semiconductor layers 22 are formed along the side surfaces of the trenches 282 by performing ion implantation of an N type impurity such as phosphorus (P) or the like from the side surfaces of the trenches 282.

Next, as depicted in C of FIG. 46, P+ type first semiconductor layers 21 are formed by performing ion implantation of a P type impurity such as boron (B) or the like within a shallower substrate than the N+ type second semiconductor layers 22 from the side surfaces of the trenches 282. An electric field can be provided more easily by performing shallow implantation by plasma doping, for example, as the ion implantation.

Next, as depicted in D of FIG. 46, separating portions 43 are formed by burying oxide films 41 within the trenches 282. In a case where metallic films 42 are also provided as the separating portions 43, a part of the oxide films 41 are opened and the metallic films 42 are buried after the oxide films 41 are buried.

Subsequent processes are similar to those of the first manufacturing method described with reference to FIG. 41.

23. Seventh Manufacturing Method

Next, referring to FIG. 47 and FIG. 48, description will be made of a seventh manufacturing method of forming P+ type first semiconductor layers 21 and N+ type second semiconductor layers 22 in the semiconductor substrate of a photodiode array 1. The seventh manufacturing method is a manufacturing method in a case where taper-shaped separating portions 43 are formed by digging from the back surface side of the substrate as in the ninth embodiment depicted in FIG. 24.

Figure 47:
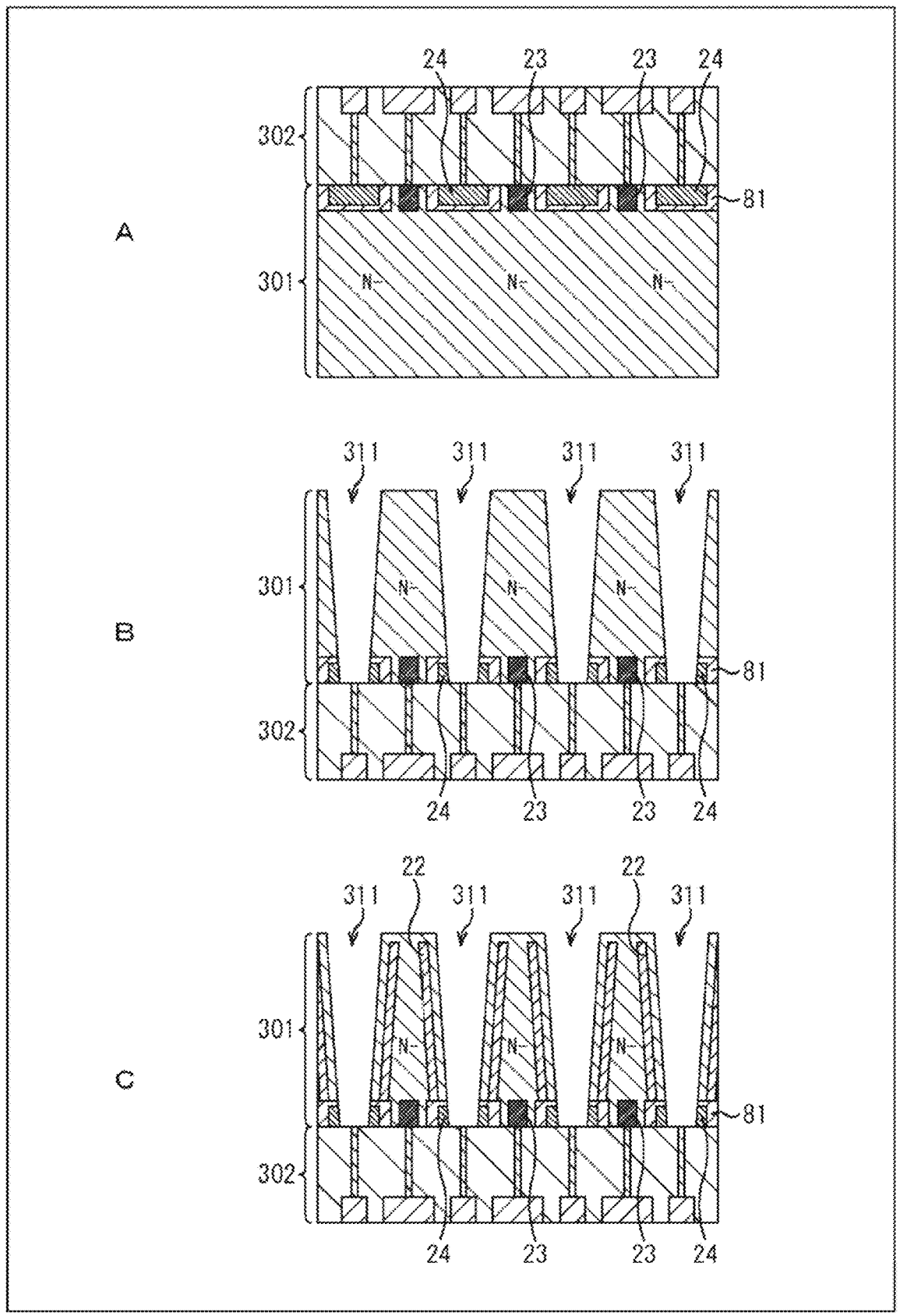
FIG. 47 is a diagram of assistance in explaining a seventh manufacturing method.

In the case where the taper-shaped separating portions 43 are formed by digging from the back surface side of the substrate, as depicted in A of FIG. 47, for example, cathode contacts 23, anode contacts 24, and P− type sixth semiconductor layers 81 on the peripheries of the anode contacts 24 or the like are first formed on the front surface side of a low-concentration N type (N−) semiconductor substrate 301. Subsequently, a wiring layer 302 is formed on the front surface of the substrate in which the cathode contacts 23 and the anode contacts 24 and the like are formed.

After the wiring layer 302 is formed, as depicted in B of FIG. 47, the semiconductor substrate 301 is vertically inverted, and trenches 311 are formed to a predetermined depth from the back surface side of the semiconductor substrate 301.

Next, as depicted in C of FIG. 47, N+ type second semiconductor layers 22 are formed by performing ion implantation of an N type impurity such as phosphorus (P) or the like from the side surfaces of the trenches 311.

Figure 48:
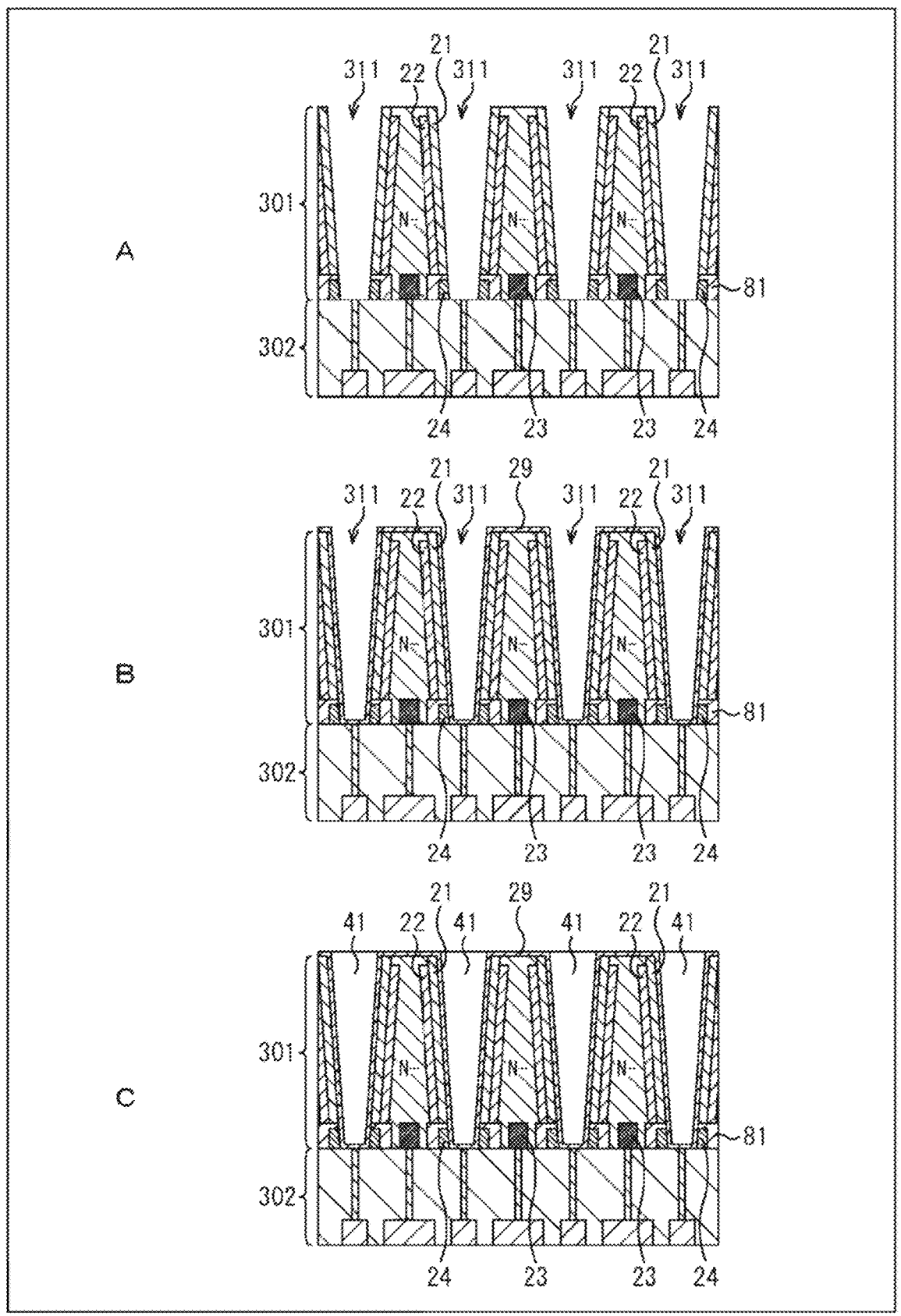
FIG. 48 is a diagram of assistance in explaining the seventh manufacturing method.

Next, as depicted in A of FIG. 48, P+ type first semiconductor layers 21 are formed by performing ion implantation of a P type impurity such as boron (B) or the like within a shallower substrate than the N+ type second semiconductor layers 22 from the side surfaces of the trenches 311. An electric field can be provided more easily by performing shallow implantation by plasma doping, for example, as the ion implantation.

Next, as depicted in B of FIG. 48, a fixed charge film 29 is formed on the side surfaces and bottom surfaces of the trenches 311 and the back surface interfaces of the semiconductor substrate 301 at which back surface interfaces the trenches 311 are not formed. The fixed charge film 29 is, for example, a film of Hf2, Al2O3, or the like.

Next, as depicted in C of FIG. 48, oxide films 41 are buried within the trenches 311, and separating portions 43 are thereby formed. In a case where metallic films 42 are also provided as the separating portions 43, a part of the oxide films 41 are opened and the metallic films 42 are buried after the oxide films 41 are buried.

As described above, the photodiode array 1 having the taper-shaped separating portions 43 formed from the back surface side of the substrate can be manufactured.

24. Summary

As described above, the photodiode arrays 1 according to the first to sixteenth embodiments include: a plurality of pixels 10 arranged in a form of a matrix; the pixels 10 each including a first semiconductor layer (P+ type first semiconductor layer 21) of a first conductivity type (for example, a P type), the first semiconductor layer being formed in an outer peripheral portion in a vicinity of a pixel boundary, and a second semiconductor layer (N+ type second semiconductor layer 22) of a second conductivity type (for example, an N type) opposite from the first conductivity type, the second semiconductor layer being formed on an inside of the first semiconductor layer as viewed in plan, a high field region 25 formed by the first semiconductor layer and the second semiconductor layer when a reverse bias voltage is applied being configured to be formed in a depth direction of a substrate.

Because the high field region 25 is formed in the substrate depth direction (vertical direction), the high field region 25 can be formed in a small area in the planar direction without any guard ring being provided, so that pixel size can be reduced.

Furthermore, in a case where a separating portion 43 is formed at the pixel boundary in the photodiode array 1, electric and optical crosstalk can be reduced.

The first semiconductor layer (P+ type first semiconductor layer 21) of the first conductivity type (for example, the P type) and the second semiconductor layer (N+ type second semiconductor layer 22) of the second conductivity type (for example, the N type) by which semiconductor layers the high field region 25 is formed in the depth direction of the substrate can be formed by using one of the foregoing first to seventh manufacturing methods.

The photodiode arrays 1 having APDs arranged therein in the form of a matrix, in which APDs the high field region 25 can be formed in the substrate depth direction (vertical direction), can be used in a photon counter and a light receiving element of a TOF (Time of Flight) sensor, for example.

Embodiments of the present technology are not limited to the embodiments described above, but are susceptible of various changes without departing from the spirit of the present technology.

For example, it is possible to adopt modes in which all or a part of the plurality of embodiments described above are combined with each other.

It is to be noted that effects described in the present specification are illustrative only and are not limited, and there may be effects other than those described in the present specification.

Incidentally, the present technology can also adopt the following configurations.

(1) A light detecting element including:
a plurality of pixels arranged in a form of a matrix;
the pixels each including
first semiconductor layer of a first conductivity type, the first semiconductor layer being formed in an outer peripheral portion in a vicinity of a pixel boundary, and
a second semiconductor layer of a second conductivity type opposite from the first conductivity type, the second semiconductor layer being formed on an inside of the first semiconductor layer as viewed in plan,
a high field region formed by the first semiconductor layer and the second semiconductor layer when a reverse bias voltage is applied being configured to be formed in a depth direction of a substrate.

(2) The light detecting element according to the above (1), further including:
a separating portion that insulates and separates adjacent pixels from each other at a pixel boundary, in which
the high field region is configured to be formed adjacent to the separating portion.

(3) The light detecting element according to the above (1) or (2), further including:
a third semiconductor layer of the second conductivity type on an inside of the second semiconductor layer as viewed in plan, the third semiconductor layer having a lower impurity concentration than the second semiconductor layer.

(4) The light detecting element according to any one of the above (1) to (3), in which
the second semiconductor layer has a potential gradient such that impurity concentration is increased toward a front surface of the substrate.

(5) The light detecting element according to any one of the above (1) to (4), further including:
a fourth semiconductor layer of low impurity concentration and of the first conductivity type or the second conductivity type, the fourth semiconductor layer being adjacent to the second semiconductor layer in the depth direction of the substrate.

(6) The light detecting element according to the above (5), in which
the fourth semiconductor layer is adjacent to the second semiconductor layer on a front surface side of the substrate, and is of the second conductivity type.

(7) The light detecting element according to the above (5) or (6), in which the fourth semiconductor layer is adjacent to the second semiconductor layer on a back surface side of the substrate, and is of the second conductivity type.

(8) The light detecting element according to the above (5), in which the fourth semiconductor layer is adjacent to the second semiconductor layer on a front surface side of the substrate, and is of the first conductivity type.

(9) The light detecting element according to the above (5) or (8), in which the fourth semiconductor layer is adjacent to the second semiconductor layer on a back surface side of the substrate, and is of the first conductivity type.

(10) The light detecting element according to any one of the above (1) to (9), further including:

a readout circuit within a well of the first conductivity type, the well being formed in a front surface of the substrate.

(11) The light detecting element according to the above (10), in which the readout circuit is shared by a plurality of pixels.

(12) The light detecting element according to the above (10) or (11), further including:

a fifth semiconductor layer of the first conductivity type, the fifth semiconductor layer being adjacent to the second semiconductor layer and being in the front surface of the substrate.

(13) The light detecting element according to any one of the above (10) to (12), in which the readout circuit switches between signal accumulation and readout by controlling a gate electrode.

(14) A method of manufacturing a light detecting element, the method including:

forming a first semiconductor layer of a first conductivity type in an outer peripheral portion in a vicinity of a boundary of pixels arranged in a form of a matrix; and forming a second semiconductor layer of a second conductivity type opposite from the first conductivity type on an inside of the first semiconductor layer as viewed in plan;

a high field region formed by the first semiconductor layer and the second semiconductor layer when a reverse bias voltage is applied being configured to be formed in a depth direction of a substrate.

(15) The method of manufacturing the light detecting element according to the above (14), in which the first semiconductor layer in the outer peripheral portion and the second semiconductor layer on the inside of the first semiconductor layer are formed by performing ion implantation of the first conductivity type in the outer peripheral portion in the vicinity of the boundary of the pixels within a well of the second conductivity type.

(16) The method of manufacturing the light detecting element according to the above (15), in which the well of the second conductivity type is formed by performing ion implantation into the substrate.

(17) The method of manufacturing the light detecting element according to the above (15), in which the substrate of the second conductivity type is used as the well of the second conductivity type.

(18) The method of manufacturing the light detecting element according to the above (15), in which the first semiconductor layer in the outer peripheral portion and the second semiconductor layer on the inside of the first semiconductor layer are formed by burying a first oxide film including ions of the second conductivity type, removing the first oxide film after forming the second semiconductor layer by thermal diffusion, burying a second oxide film including ions of the first conductivity type in a part from which the first oxide film is removed, and forming the first semiconductor layer by thermal diffusion.

(19) The method of manufacturing the light detecting element according to the above (15), in which the first semiconductor layer in the outer peripheral portion and the second semiconductor layer on the inside of the first semiconductor layer are formed by burying a first oxide film including ions of the first conductivity type, burying a second oxide film including ions of the second conductivity type in a region different from the first oxide film, and forming the first semiconductor layer and the second semiconductor layer by thermal diffusion. (20)

(20) The method of manufacturing the light detecting element according to the above (15), in which the first semiconductor layer in the outer peripheral portion and the second semiconductor layer on the inside of the first semiconductor layer are formed by forming a trench dug to a predetermined depth of the substrate at the boundary of the pixels of the substrate, and performing ion implantation of the first conductivity type and ion implantation of the second conductivity type from a side surface of the trench.

REFERENCE SIGNS LIST

1 Photodiode array,
10 Pixel,
21 First semiconductor layer (P+ type first semiconductor layer),
22 Second semiconductor layer (N+ type second semiconductor layer),
23 Contact (cathode contact),
24 Contact (anode contact),
25 High field region,
28,
29 Fixed charge film,
41 Oxide film,
42 Metallic film,
43 Separating portion,
61 Third semiconductor layer (N− type third semiconductor layer),
71 Fourth semiconductor layer (N− type fourth semiconductor layer),
72 Fifth semiconductor layer (N− type fifth semiconductor layer),
81 Sixth semiconductor layer (P− type sixth semiconductor layer),
82 Seventh semiconductor layer (P− type seventh semiconductor layer),
83 Eighth semiconductor layer (N− type ninth semiconductor layer),
91 Tenth semiconductor layer (N− type tenth semiconductor layer),
151 Well (P− type well),
153 Gate electrode,
171 Pinning layer,
172 contact,
211 Well (N+ type well),
221 Well (N+ type well),
222 Oxide film,
231,
261 Semiconductor substrate,
262 First oxide film,
263 Semiconductor layer,
264 Second oxide film,
281 Semiconductor substrate, 282,
311 Trench

What is claimed is:

1. A light detecting element comprising:
    a substrate; and
    a plurality of pixels arranged in a form of a matrix, the plurality of pixels each including:
        a first semiconductor layer of a first conductivity type, the first semiconductor layer being formed in an outer peripheral portion in a vicinity of a pixel boundary;
        a second semiconductor layer of a second conductivity type opposite from the first conductivity type, the second semiconductor layer being formed on an inside of the first semiconductor layer;
        a third semiconductor layer of the second conductivity type on an inside of the second semiconductor layer in a plan view, the third semiconductor layer having a lower impurity concentration than the second semiconductor layer;
        a fourth semiconductor layer of low impurity concentration and of the first conductivity type or the second conductivity type, the fourth semiconductor layer being adjacent to the second semiconductor layer in a depth direction of the substrate;
        a fifth semiconductor layer of the first conductivity type, the fifth semiconductor layer being adjacent to the second semiconductor layer and being in a front surface of the substrate; and
        an on-chip lens (OCL) on a light incident surface.

2. The light detecting element according to claim 1, wherein the light detecting element comprises a front surface irradiation type.

3. The light detecting element according to claim 2, wherein the OCL is formed on an upper surface of a fixed charge film.

4. The light detecting element according to claim 2, wherein an inter-pixel light shielding film is disposed at pixel boundaries on a back surface of the substrate.

5. The light detecting element according to claim 4, wherein the inter-pixel light shielding film may include a metallic material such as tungsten (W), aluminum (Al), or copper (Cu).

6. The light detecting element according to claim 1, wherein the light detecting element comprises a back surface irradiation type.

7. The light detecting element according to claim 1, wherein the OCL comprises four OCLs formed 2×2 over each pixel.

8. The light detecting element according to claim 1, wherein the fourth semiconductor layer is adjacent to the second semiconductor layer on a front surface side of the substrate, and is of the second conductivity type.

9. The light detecting element according to claim 1, wherein the fourth semiconductor layer is adjacent to the second semiconductor layer on a back surface side of the substrate, and is of the second conductivity type.

10. The light detecting element according to claim 1, wherein the fourth semiconductor layer is adjacent to the second semiconductor layer on a front surface side of the substrate, and is of the first conductivity type.

11. The light detecting element according to claim 1, wherein the fourth semiconductor layer is adjacent to the second semiconductor layer on a back surface side of the substrate, and is of the first conductivity type.

12. The light detecting element according to claim 1, wherein one OCL is formed for four 2×2 pixels.

13. The light detecting element according to claim 12, further comprising:
    a metallic film buried in a separating portion.

14. The light detecting element according to claim 9, further comprising:
    a metallic film buried in a separating portion, wherein the metallic film is omitted in a portion of the separating portion under a center of the OCL.

15. The light detecting element according to claim 1, further comprising:
    a readout circuit within a well of the first conductivity type, the well being formed in a front surface of the substrate.

16. The light detecting element according to claim 15, wherein the readout circuit is shared by a plurality of pixels.

17. The light detecting element according to claim 15, wherein the readout circuit switches between signal accumulation and readout by controlling a gate electrode.

* * * * *